United States Patent
Toda

(10) Patent No.: US 8,101,901 B2
(45) Date of Patent: Jan. 24, 2012

(54) METHOD AND APPARATUS FOR ACQUIRING PHYSICAL INFORMATION, METHOD FOR MANUFACTURING SEMICONDUCTOR DEVICE INCLUDING ARRAY OF A PLURALITY OF UNIT COMPONENTS FOR DETECTING PHYSICAL QUANTITY DISTRIBUTION, LIGHT-RECEIVING DEVICE AND MANUFACTURING METHOD THEREFOR, AND SOLID-STATE IMAGING DEVICE AND MANUFACTURING METHOD THEREFOR

(75) Inventor: Atsushi Toda, Kanagawa (JP)

(73) Assignee: Sony Corporation, Tokyo (JP)

( * ) Notice: Subject to any disclaimer, the term of this patent is extended or adjusted under 35 U.S.C. 154(b) by 82 days.

(21) Appl. No.: 12/200,445

(22) Filed: Aug. 28, 2008

(65) Prior Publication Data
US 2009/0039340 A1 Feb. 12, 2009

Related U.S. Application Data

(62) Division of application No. 11/295,962, filed on Dec. 7, 2005, now Pat. No. 7,456,384.

(30) Foreign Application Priority Data

Dec. 10, 2004 (JP) ................................. 2004-358139
Dec. 22, 2004 (JP) ................................. 2004-371602
Jul. 20, 2005 (JP) ................................. 2005-209409

(51) Int. Cl.
*H01L 31/0312* (2006.01)
*H01L 31/0232* (2006.01)
*H01L 31/18* (2006.01)

(52) U.S. Cl. .............. 250/214.1; 257/431; 257/436; 257/E31.023; 257/E31.046; 257/E27.133; 438/66

(58) Field of Classification Search ............... 250/214.1; 257/431, 436, 434, E27.133, E31.051, E31.046, 257/E31.023; 438/57, 66
See application file for complete search history.

(56) References Cited

U.S. PATENT DOCUMENTS
5,671,914 A * 9/1997 Kalkhoran et al. ............. 257/77
(Continued)

FOREIGN PATENT DOCUMENTS
EP 1073125 1/2001
(Continued)

OTHER PUBLICATIONS
Japanese Office Action (JP 2004-371602) issued on Jan. 27, 2009.
(Continued)

*Primary Examiner* — John Lee
(74) *Attorney, Agent, or Firm* — K&L Gates LLP

(57) ABSTRACT

Method and apparatus for acquiring physical information, method for manufacturing semiconductor device including array of a plurality of unit components for detecting physical quantity distribution, light-receiving device and manufacturing method therefor, and solid-state imaging device and manufacturing method therefore are provided. The method for acquiring physical information uses a device for detecting a physical distribution, the device including a detecting part for detecting an electromagnetic wave and a unit signal generating part for generating a corresponding unit signal on the basis of the quantity of the detected electromagnetic wave. The detecting part includes a stacked member having a structure in which a plurality of layers having different refractive indexes between the adjacent ones and each having a predetermined thickness is stacked, the stacked member being provided on the incident surface side to which the electromagnetic wave is incident and having the characteristic that a predetermined wavelength region component of the electromagnetic wave is reflected, and the remainder is transmitted.

11 Claims, 54 Drawing Sheets

U.S. PATENT DOCUMENTS

| | | | |
|---|---|---|---|
| 5,726,440 A * | 3/1998 | Kalkhoran et al. | 250/214.1 |
| 5,808,329 A * | 9/1998 | Jack et al. | 257/188 |
| 6,127,692 A * | 10/2000 | Sugawa et al. | 257/30 |
| 6,891,869 B2 * | 5/2005 | Augusto | 372/43.01 |
| 6,927,417 B2 * | 8/2005 | Nagashima et al. | 257/55 |
| 6,930,330 B2 * | 8/2005 | Choi et al. | 257/87 |
| 6,943,051 B2 * | 9/2005 | Augusto et al. | 438/58 |
| 6,951,771 B2 * | 10/2005 | Kondo et al. | 438/69 |
| 7,368,797 B2 * | 5/2008 | Nagashima et al. | 257/461 |
| 7,385,238 B2 | 6/2008 | Mouli | |
| 7,391,062 B2 * | 6/2008 | Takayama et al. | 257/187 |
| 7,456,384 B2 * | 11/2008 | Toda | 250/226 |
| 2004/0097021 A1 * | 5/2004 | Augusto et al. | 438/149 |
| 2005/0255649 A1 | 11/2005 | Augusto et al. | |
| 2006/0124833 A1 * | 6/2006 | Toda | 250/214 R |
| 2009/0039340 A1 * | 2/2009 | Toda | 257/21 |

FOREIGN PATENT DOCUMENTS

| | | |
|---|---|---|
| EP | 1414068 | 4/2004 |
| JP | 02-196474 | 8/1990 |
| JP | 06-216404 | 8/1994 |
| JP | 06-217079 HEI | 8/1994 |
| JP | 06-243795 | 9/1994 |
| JP | 09-213988 | 8/1997 |
| JP | 2004-512686 | 4/2004 |
| JP | 2008-510316 | 4/2008 |

OTHER PUBLICATIONS

Japanese Office Action (2004371602) issued on Jan. 26, 2010.
Japanese Office Action issued on Apr. 20, 2010, for corresponding Japanese Patent Application No. 2005-209409.

* cited by examiner

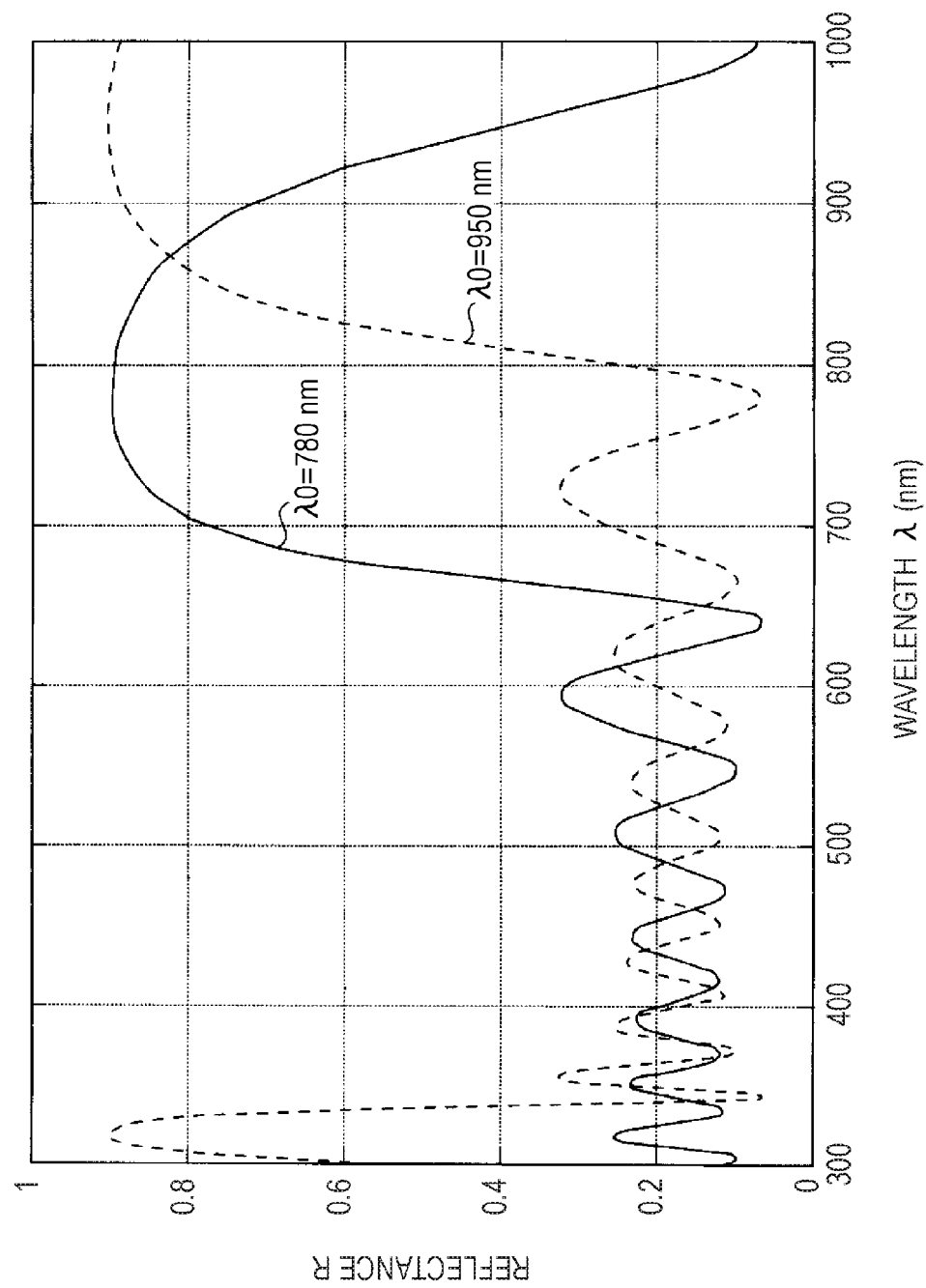

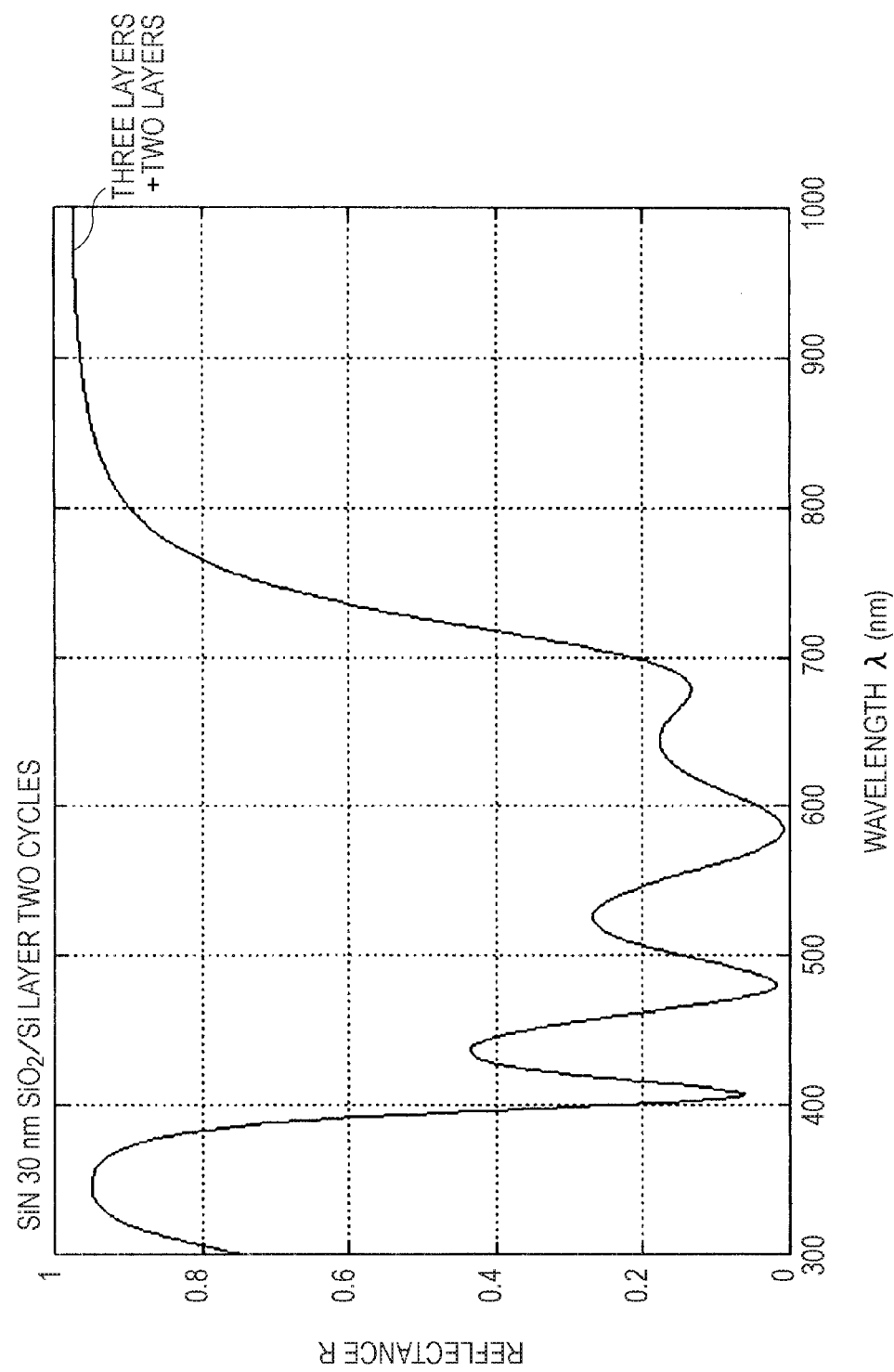

FIG. 41A
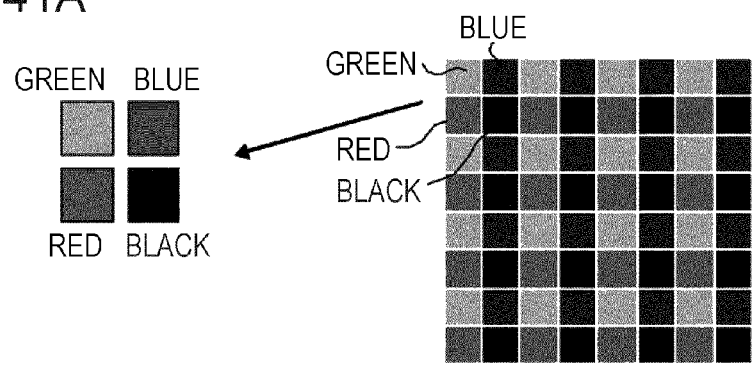
FIG. 41B
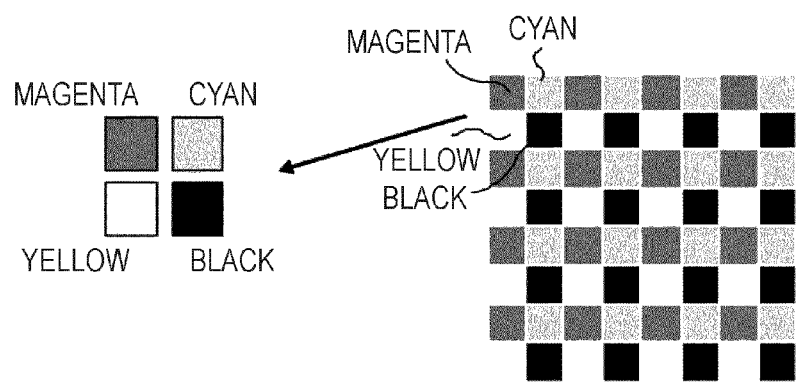
FIG. 41C
| Cy | BK | Cy | BK | Cy | BK | Cy | BK |
|----|----|----|----|----|----|----|----|
| Ye | G  | Ye | G  | Ye | G  | Ye | G  |
| Cy | BK | Cy | BK | Cy | BK | Cy | BK |
| G  | Ye | G  | Ye | G  | Ye | G  | Ye |
| Cy | BK | Cy | BK | Cy | BK | Cy | BK |
| Ye | G  | Ye | G  | Ye | G  | Ye | G  |
| Cy | BK | Cy | BK | Cy | BK | Cy | BK |
| G  | Ye | G  | Ye | G  | Ye | G  | Ye |

FIG. 44A
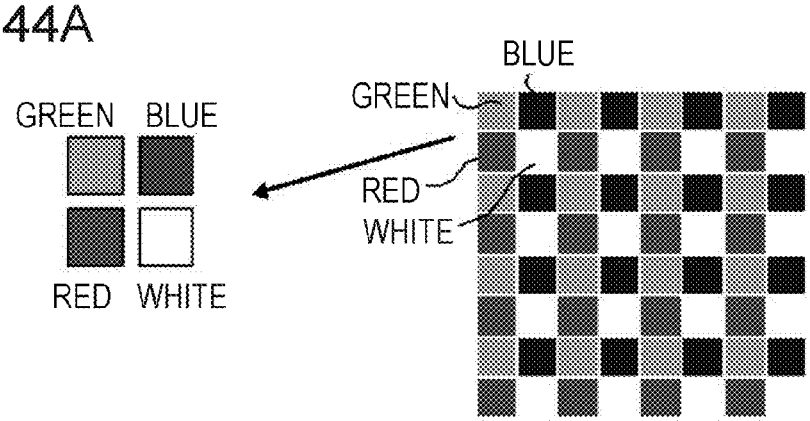
FIG. 44B
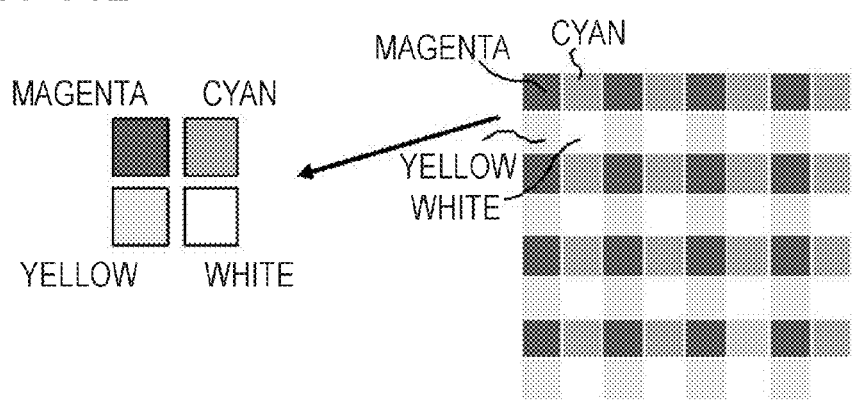
FIG. 44C

LIGHT ABSORPTION SPECTRUM OF SEMICONDUCTOR

LIGHT ABSORPTION OF SEMICONDUCTOR
(DEPTH DIRECTION)

METHOD AND APPARATUS FOR ACQUIRING PHYSICAL INFORMATION, METHOD FOR MANUFACTURING SEMICONDUCTOR DEVICE INCLUDING ARRAY OF A PLURALITY OF UNIT COMPONENTS FOR DETECTING PHYSICAL QUANTITY DISTRIBUTION, LIGHT-RECEIVING DEVICE AND MANUFACTURING METHOD THEREFOR, AND SOLID-STATE IMAGING DEVICE AND MANUFACTURING METHOD THEREFOR

CROSS REFERENCES TO RELATED APPLICATIONS

The present application is a divisional of U.S. patent application Ser. No. 11/295,962, filed on Dec. 7, 2005 and claims priority to Japanese Patent Application JP 2004-358139 filed in the Japanese Patent Office on Dec. 10, 2004, Japanese Patent Application JP 2005-209409 filed in the Japanese Patent Office on Jul. 20, 2005, and Japanese Patent Application JP 2004-371602 filed in the Japanese Patent Office on Dec. 22, 2004, the entire contents of which are incorporated herein by reference.

BACKGROUND

The present invention relates to a method and apparatus for acquiring physical information, and a method for manufacturing a semiconductor device including an array of a plurality of unit components, for detecting a physical quantity distribution. More specifically, the invention relates to a signal acquisition technique suitably applied to a solid-state imaging device using a semiconductor device for detecting a physical quantity distribution, the semiconductor device including an array of a plurality of unit components sensitive to electromagnetic waves input from the outside, e.g., light and radiations, so that a physical quantity distribution converted into electric signals by the unit components may be read out as the electric signals. In particular, the invention relates to an imaging device which permits imaging with a wavelength component (for example, infrared light) other than visible light.

The invention also relates to a light-receiving device and a solid-state imaging device each including photoelectric transducers formed in a semiconductor layer of silicone, a compound semiconductor, or the like, and methods for manufacturing the respective devices.

Semiconductor devices for detecting a physical quantity distribution are used in various fields, the semiconductor devices each including a line or matrix array of a plurality of unit components (for example, pixels) sensitive to changes in physical quantities such as electromagnetic waves input from the outside, such as light and radiations.

For example, in the field of video apparatuses, CCD (Charge Coupled Device), MOS (Metal Oxide Semiconductor), or CMOS (Complementary Metal Oxide Semiconductor) solid-state imaging devices for detecting changes of light (an example of electromagnetic waves) as an example of physical quantities are used. In these devices, a physical quantity distribution converted into electric signals by unit components (e.g., pixels in a solid-state imaging device) is read out as the electric signals.

For example, a solid-state imaging device detects an electromagnetic wave input from the outside, such as light or a radiation, using photodiodes serving as photoelectric transducers (light-receiving device; photosensors) provided in an imaging portion (pixel portion) of the device, thereby generating and accumulating signal charges. The accumulated signal charges (photoelectrons) are read out as image information.

In recent years, structures for visible light imaging and infrared light imaging have been proposed (refer to, for example, Japanese Unexamined Patent Application Publication Nos. 2004-103964, 10-210486, 2002-369049, 6-121325, 9-166493, 9-130678, and 2002-142228). For example, an infrared luminous point is previously prepared so that the position of the infrared luminous point in a visible light image may be detected by tracking the infrared luminous point. In addition, for example, even in the night without visible light, a clear image may be obtained by imaging with infrared irradiation. Furthermore, the sensitivity may be improved by taking in infrared light in addition to visible light.

The structure disclosed in Japanese Unexamined Patent Application Publication No. 2004-103964 is a single plate type using changes in absorption coefficient with wavelength in the depth direction of a semiconductor.

The structures disclosed in Japanese Unexamined Patent Application Publication Nos. 10-210486, 2002-369049, and 6-121325 are each a multi-plate type using a wavelength resolving optical system including a wavelength separation mirror and prism as an input optical system so that visible light and infrared light are received by respective imaging devices.

The structure disclosed in Japanese Unexamined Patent Application Publication No. 9-166493 is a single-plate type using a rotating wavelength resolving optical system as an input optical system so that visible light and infrared light are received by the same imaging device. For example, when an infrared cut filter is inserted/extracted by a rotating mechanism, with the infrared cut filter inserted, a visible color image is output without being influenced by near-infrared light and infrared light, while with the infrared cut filter extracted, an image with light intensity including visible light intensity and near-infrared light intensity is output.

The structure disclosed in Japanese Unexamined Patent Application Publication No. 9-130678 uses a diaphragm optical system having a wavelength resolving function as an input optical system so that visible light and infrared light are received by the same imaging device.

The structure disclosed in Japanese Unexamined Patent Application Publication No. 2002-142228 includes an imaging device sensitive to visible light and near-infrared light, in which four types of color filters having respective filter characteristics are regularly disposed on pixels, and a visible color image and a near-infrared light image are independently determined by matrix-calculation of the outputs of the respective pixels on which the four types of color filters are disposed.

A solid-state imaging device includes photoelectric transducers formed in a semiconductor layer.

Therefore, the solid-state imaging device has the problem of generating a so-called dark current due to the surface level of the semiconductor layer in which the photoelectric transducers are formed.

As shown in a potential diagram of FIG. 60A, the dark current is mainly generated by the phenomenon that electrons trapped at the surface level are thermally exited to a conduction band and thus moved to the n-type semiconductor region of a photodiode constituting each photoelectric transducer by the electric field of a surface depletion layer.

For example, in a semiconductor layer composed of silicon, the band gap is 1.1 eV, and the surface level (and the Fermi level) is present at a position where the band gap is divided at 2:1 by the Bardeen limit.

Therefore, the potential barrier against the electrons trapped at the surface level is 0.7 eV.

Therefore, in order to decrease the dark current due to the surface level, a method of forming a p+ layer on a surface of a photodiode is used (refer to, for example, Japanese Unexamined Patent Application Publication No. 2002-252342, FIG. 5).

This method suppresses the dark current to some extent.

Namely, as shown in a potential diagram of FIG. 60B, the potential barrier against the electrons trapped at the surface level becomes 1.0 eV due to the presence of the p+ layer. In other words, the potential barrier is increased by about 0.3 eV as compared with a case in which the p+ layer is absent, and thus the number of electrons thermally exited may be decreased to decrease the dark current.

When a p+ layer is provided on a surface of a silicon substrate, the quantity of the dark current at room temperature (T=300K) estimated from a Fermi-Dirac distribution function is decreased by four digits, as compared with a case in which the p+ layer is absent.

A Fermi-Dirac distribution function is represented by the following equation 10:

$$f(E, T) = \frac{1}{1 + e^{\frac{E - E_F}{kT}}} \quad \text{Equation 10}$$

wherein E is energy, EF is Fermi energy, T is an absolute temperature, k is the Boltzmann constant, e is a natural logarithm, and E-EF corresponds to the magnitude of a potential barrier.

FIGS. 53A and 53B are drawings illustrating the structure of a sensor disclosed in Japanese Unexamined Patent Application Publication No. 2004-103964, in which FIG. 53A is a drawing showing the light absorption spectral characteristics of semiconductor layers, and FIG. 53B is a schematic drawing showing a sectional structure of a device.

In this structure, the light absorption coefficient of a Si (silicon) semiconductor decreases in the order of blue, green, red, and infrared light, as shown in FIG. 53A. Namely, with respect to blue light, green light, red light, and infrared light contained in incident light L1, by using the position dependency of wavelength in the depth direction of a semiconductor, layers for detecting visible light (blue, green, and red) and infrared light, respectively, are provided in order in the depth direction from a surface of the Si semiconductor as shown in FIG. 53B.

However, in the structure disclosed in Japanese Unexamined Patent Application Publication No. 2004-103964 which utilizes variations in absorption coefficient with wavelengths, red light and green light are absorbed by a layer for detecting blue light to some extent when being passed through this layer and are thus detected as blue light although the quantity of theoretically detectable light is not decreased. Therefore, even when there is no original signal of blue light, signals of green light and red light are entered to enter a signal of blue light, thereby producing an alias and thus failing to achieve sufficient color reproducibility.

In order to avoid this problem, correction is preferably performed by signal calculation processing for the entire of the three primary colors, and thus a circuit for calculation is separately provided. Accordingly, a circuit configuration is complicated and increased in scale, and the cost is also increased. Furthermore, for example, when one of the three primary colors is saturated, the original value of the saturated light is not determined to cause error in the calculation. As a result, signals are processed so as to produce a color different from the original color.

As shown in FIG. 53A, most semiconductors have absorption sensitivity to infrared light. Therefore, for example, in a solid-state imaging device (image sensor) using a Si semiconductor, an infrared cut filter made of glass is preferably inserted as an example of subtractive color filters in front of the sensor.

Therefore, in order to take an image by receiving only infrared light or visible light and infrared light as signals, preferably, the infrared cut filter is removed or the cut ratio of infrared light is decreased.

However, in such a case, infrared light is mixed with visible light and incident on a photoelectric transducer, thereby producing a visible light image with a color tone different from the original tone. It may be thus difficult to separately produce a proper visible light image and a proper image of infrared light alone (or mixture of infrared light and visible light) at the same time.

Apart from the above-described problem, in ordinary solid-state imaging devices, visible light is also cut to some extent by using the infrared cut filter, thereby decreasing sensitivity. The cost is also increased by using the infrared cut filter.

In the structures disclosed in Japanese Unexamined Patent Application Publication Nos. 10-210486, 2002-369049, and 6-121325, the input optical system is increased in scale by the wavelength resolution optical system including a mirror and a prism for wavelength separation.

In the structure of Japanese Unexamined Patent Application Publication No. 9-166493, a device is increased in scale by the infrared cut filter insertion/extraction mechanism, and the infrared cut filter is not automatically operated.

In the structure of Japanese Unexamined Patent Application Publication No. 9-130678, a device is increased in scale by the diaphragm optical system having a wavelength resolving function. In addition, although both an infrared light image and a visible light image may be simultaneously obtained, only electric composite signals of the visible light image and the infrared light image are output from the image sensor, thereby failing to output only the visible light image or only the infrared light image.

On the other hand, in the structure of Japanese Unexamined Patent Application Publication No. 2002-142228, wavelength separation is performed using the four types of color filters. Therefore, this structure has a problem with arithmetic processing but not have the problem of Japanese Unexamined Patent Application Publication Nos. 10-210486, 2002-369049, 6-121325, 9-166493, and 9-130678 in which the input optical system is increased in scale. Namely, in the structure of Unexamined Patent Application Publication No. 2002-142228, a visible color image and a near-infrared light image are independently determined by matrix operation of the outputs of the pixels on which the four types of color filters having respective filter characteristics are respectively disposed, and thus a visible light image and an infrared light image may be separately and simultaneously output. However, even when a visible light image is obtained, arithmetic processing is performed between visible light and infrared light components, thereby significantly increasing arithmetic processing as a whole.

SUMMARY

It is desirable to provide a new mechanism which may resolve at least one of the above-mentioned problems, and a method for manufacturing a device used in the mechanism.

According to an embodiment of the invention, there is provided an imaging device having a new mechanism in which a visible color image and a near-infrared light image are independently obtained using the same image sensor.

According to another embodiment of the invention, there is provided a mechanism in which when a visible light image and an infrared light image are simultaneously taken using the same image sensor, the problem that a color tone different from an original tone is produced by removing an infrared cut filter is resolved to permit visible light imaging and infrared and ultraviolet light imaging with a correct color tone at the same time.

According to a still another embodiment of the invention, there is provided a mechanism for resolving the problem that the cost is increased by using a thick infrared cut filter made of glass as in an ordinary image sensor.

On the other hand, the quantity of light received by a photodiode of each pixel is decreased as pixels are increasingly made fine, and thus an amount of signals is also decreased to relatively decrease the S/N ratio.

Therefore, even when the p+ layer is provided on a surface of a silicon substrate, for decreasing the dark current by four digits, a satisfactory S/N ratio may not be obtained. For example, even in imaging the night sky, dot-like noise occurs in the obtained image.

In this case, when the quantity of incident light is small, in order to compensate low sensitivity, the gain of an image signal is generally increased by an amplifier or the like to increase the signal intensity. However, the intensity of noise is also increased at the same time as the signal intensity, resulting in the occurrence of significant noise in the image.

Since the signal intensity will decrease with refining in the future, noise due to the dark current is not sufficiently decreased only by providing a p+ layer on a surface of a silicon substrate.

Therefore, it is desirable to provide a novel mechanism for securing a sufficient S/N ratio.

In a light-receiving device including photodiodes including photoelectric transducers formed in a semiconductor layer, as well as in a solid-state imaging device, the S/N ratio decreases as refining of the light-receiving device is advanced, and thus signals obtained by photoelectric transfer may not be satisfactorily detected.

According to a further embodiment of the invention, there are provided a light-receiving device capable of securing a satisfactory S/N ratio by decreasing noise due to a dark current, a process for manufacturing the light-receiving device, a solid-state imaging device, and a process for manufacturing the same.

A method and apparatus for acquiring physical information according to an embodiment of the invention use a stacked film having a structure in which a plurality of layers having different refractive indexes is stacked, for separating wavelengths into a transmitted wavelength region component and a reflected wavelength region component, so that signals of both components are independently or simultaneously acquired by separate detecting parts.

In other words, the method for acquiring physical information uses a device for detecting a physical quantity distribution for a predetermined purpose on the basis of unit signals, the device including, as unit components, a detecting part for detecting an electromagnetic wave and a unit signal generating part for generating a corresponding unit signal on the basis of the quantity of the detected electromagnetic wave and outputting the unit signal, and the unit components being disposed on the same substrate in a predetermined order. The detecting part includes a stacked member provided on the incident surface side on which the electromagnetic wave is incident, the stacked member having the characteristic that a predetermined wavelength region component of the electromagnetic wave is reflected, and the remainder is transmitted, and also having a structure in which a plurality of layers having different refractive indexes between the adjacent ones and each a predetermined thickness is stacked.

The transmitted wavelength region component transmitted through the stacked member is detected by the detecting part, and physical information for a predetermined purpose is acquired on the basis of the unit signal of the transmitted wavelength region component obtained from the unit signal generating part.

The term "remainder" means components actually not containing at least the reflected wavelength region component, not all wavelength components excluding the reflected wavelength region component. The sentence "actually not containing the reflected wavelength region component" means that there is substantially no influence of the reflected wavelength region component, and the influence of the reflected wavelength region component may be slightly present. This is because with respect to the transmitted wavelength side, it is sufficient to acquire a signal in which the influence of the reflected wavelength region is negligible. Also, with respect to the reflected wavelength region, it is sufficient to acquire a signal in which the influence of the transmitted wavelength region is negligible.

The apparatus for acquiring physical information is suitable for carrying out the method for acquiring physical information. The apparatus includes a stacked member disposed on the incident surface side of a detecting part on which an electromagnetic wave is incident, and a signal processing unit for acquiring physical information for a predetermined purpose on the basis of a unit signal of a transmitted wavelength region component detected by the sensing part and transmitted through the stacked member, the unit signal being obtained from a unit signal generating part on the basis of the transmitted wavelength region component. The stacked member has a structure in which a plurality of layers having different refractive indexes between the adjacent ones and each a predetermined thickness is stacked, and also has the characteristic that a predetermined wavelength region component of the electromagnetic wave is reflected, and the remainder is transmitted. The stacked member may be separated from the detecting part, but is preferably integrated with the detecting part.

A method for manufacturing a semiconductor device according to an embodiment of the invention is suitably used for manufacturing the above-described device. The method includes the steps of forming a semiconductor element layer having a detecting part and a unit signal generating part on a semiconductor substrate; forming a wiring layer for forming signal lines on the semiconductor element layer, for reading unit signals from the unit signal generating part; and forming a stacked film on the wiring layer, the stacked film having a structure in which a plurality of layers having different refractive indexes between the adjacent ones and each a predetermined thickness is stacked, and having the characteristic that a predetermined wavelength region component of an electromagnetic wave is reflected, and the remainder is transmitted.

In order to permit detection of the reflected wavelength region component, the method may further include a step of regularly removing a portion of the stacked film in position alignment with a plurality of detecting parts corresponding to respective wavelengths. In this case, the transmitted wavelength region component transmitted through the stacked film is detected by one of the plurality of detecting parts, and the reflected wavelength region component not transmitted through the stacked film is detected by the other of the plurality of detecting parts. From the viewpoint that a portion of the stacked film is regularly removed in position alignment with the plurality of detecting parts corresponding to respective wavelengths, the stacked film is preferably integrated with the detecting parts rather than being separated from the detecting parts.

In application to color imaging, the method may further include a step of forming optical members for respective wavelengths on the stacked film in position alignment with pixels corresponding to the respective wavelengths, for transmitting a predetermined wavelength component of the transmitted wavelength region component. From the viewpoint that the optical members for respective wavelengths are formed in position alignment with the detecting parts corresponding to the respective wavelengths, the optical members for respective wavelengths are preferably integrated with the stacked film and the detecting parts rather than being separated from the stacked film and the detecting parts.

The further characteristics of the invention will be described below.

For example, in order to acquire an image about a reflected wavelength region component such as infrared light relative to a transmitted wavelength region component such as visible light, a stacked member is not provided on the incident surface side of a detecting part for the reflected wavelength region component to which an electromagnetic wave is incident so that the reflected wavelength region component is detected by the detecting part, and thus physical information for a second predetermined purpose may be obtained on the basis of a unit signal of the reflected wavelength region component obtained from a unit signal generating part.

Also, one of first physical information based on a unit signal of the transmitted wavelength region component and second physical information based on a unit signal of the reflected wavelength region component may be selected and output, or both may be simultaneously output.

Furthermore, optical members may be provided on the respective incident sides of the plurality of detecting parts for detecting the transmitted wavelength region component, for separating the transmitted wavelength region component into respective wavelength region components, and the respective transmitted wavelength region components may be detected by the plurality of detecting parts, respectively. In this case, other physical information on the transmitted wavelength region component may be acquired by combining the unit signals of the respective transmitted wavelength region components, which are obtained from the unit signal generating part. For example, a color image may be taken using, as the optical members, primary color filters in which transmitted light in the visible region has the wavelength components of the three primary colors, or complementary color filters in which transmitted light in the visible region has complementary colors of the respective three primary colors.

In order to acquire a signal of the reflected wavelength region component, not only the reflected wavelength region component but also the whole or part (e.g., the wavelength component of one of the three primary colors) of the transmitted wavelength region component may be simultaneously loaded by the detecting parts, and a signal of only the reflected wavelength region component in which the influence of the transmitted wavelength region component may be neglected may be acquired by differential arithmetic operation. Alternatively, an optical member for transmitting the reflected wavelength region component and cutting off the transmitted wavelength region component may be provided on the incident surface side of the detecting part for the reflected wavelength region component so as to prevent the incidence of the transmitted wavelength region component.

When a signal of the reflected wavelength region component is also acquired to form an image, a general arrangement for the detecting part for detecting the transmitted wavelength region component is preferably partially replaced by a detecting part for detecting the reflected wavelength region component. In this case, resolution may be affected by the arrangement of each of the detecting parts.

From this viewpoint, for example, when the resolution of an ordinary color image based on the transmitted wavelength region component is given greater importance, detecting elements (typically pixels for color G) for detecting a predetermined wavelength component in a plurality of detecting elements for respective colors which contribute to formation of the ordinary color image may be arranged in a checked pattern. On the other hand, when the resolution of an image (typically an infrared image) based on the reflected wavelength region component is given greater importance, the detecting part contributing formation of this image may be formed in a checked pattern.

When the pixels are arranged in a two-dimensional lattice form, an oblique lattice form rotated at a predetermined angle (typically about 45 degrees) is more preferred than a square lattice form in which the pixels are arranged in directions parallel and perpendicular to the vertical and horizontal reading directions, respectively. This is because the pixel densities in the vertical and horizontal directions are increased to further increase the resolutions in these directions.

A light receiving device according to an embodiment of the invention includes a photoelectric transducer formed in a semiconductor layer, and a single crystal layer formed on a portion of the semiconductor layer in which at least the photoelectric transducer is formed, the single crystal layer being composed of a material having a wider band gap than that of the semiconductor layer.

In the above-described light-receiving device, the single crystal layer is formed on a portion of the semiconductor layer in which at least the photoelectric transducer is formed, the single crystal layer being composed of a material having a wider band gap than that of the semiconductor layer. Therefore, the single crystal layer has a wider band gap, and thus the barrier against electrons at the surface level is increased, thereby decreasing the dark current due to the electrons.

A method for manufacturing a light-receiving device, which includes a photoelectric transducer formed in a semiconductor layer, includes a step of forming a single crystal layer on a portion of the semiconductor layer in which at least the photoelectric transducer is formed, the single crystal layer being composed of a material having a wider band gap than that of the semiconductor layer.

In the method for manufacturing the light-receiving device, the method including the step of forming the single crystal layer on a portion of the semiconductor layer in which at least the photoelectric transducer is formed, the single crystal layer being composed of a material having a wider band gap than that of the semiconductor layer, the barrier against electrons at the surface level is increased by the single crystal layer, thereby decreasing the dark current due to the electrons.

A solid-state imaging device according to an embodiment of the invention includes a photoelectric transducer formed in a semiconductor layer, and a single crystal layer formed on a portion of the semiconductor layer in which at least the photoelectric transducer is formed, the single crystal layer being composed of a material having a wider band gap than that of the semiconductor layer.

In the above-described solid-state imaging device, the single crystal layer is formed on a portion of the semiconductor layer in which at least the photoelectric transducer is formed, the single crystal layer being composed of a material having a wider band gap than that of the semiconductor layer. Therefore, the single crystal layer has a wider band gap, and thus the barrier against electrons at the surface level is increased, thereby decreasing the dark current due to the electrons.

A method for manufacturing a solid-state imaging device, which includes a photoelectric transducer formed in a semiconductor layer, includes a step of forming a single crystal layer on a portion of the semiconductor layer in which at least the photoelectric transducer is formed, the single crystal layer being composed of a material having a wider band gap than that of the semiconductor layer.

In the method for manufacturing the solid-state imaging device, the method including the step of forming the single crystal layer on a portion of the semiconductor layer in which at least the photoelectric transducer is formed, the single crystal layer being composed of a material having a wider band gap than that of the semiconductor layer, the barrier against electrons at the surface level is increased by the single crystal layer, thereby decreasing the dark current due to the electrons.

According to an embodiment of the invention, a transmitted wavelength region component and a reflected wavelength region component are separated into the respective wavelengths using a stacked film having a structure in which a plurality of layers having different refractive indexes is stacked, and signals of both components are detected by respective detecting parts.

Therefore, in a single semiconductor device (e.g., an image sensor), physical information on the transmitted wavelength region component may be acquired, in which the influence of the reflected wavelength region component may be neglected. In this case, for example, an expensive optical member made of glass for cutting off infrared light may not be provided for cutting off infrared light which is the reflected wavelength region component relative to visible light which is an example of the transmitted wavelength region component. Therefore, variations in absorption coefficient with wavelength in the depth direction of a semiconductor are not used, and thus a problem with color reproducibility due to the variations does not occur.

When the transmitted wavelength region component and the reflected wavelength region component are separately detected to simultaneously obtain signal outputs of both components, with respect to the transmitted wavelength region component, the reflected wavelength region component is previously cut off by the stacked film. Therefore, unlike in the structure disclosed in Japanese Unexamined Patent Application Publication No. 2002-142228, arithmetic operation between the transmitted wavelength region component and the reflected wavelength region component may not be performed for obtaining a signal of the transmitted wavelength region component which is not influenced by the reflected wavelength region component at all.

Of course, signals of the transmitted wavelength region component and the reflected wavelength region component may be separated and simultaneously detected, and thus visible imaging and infrared and ultraviolet imaging may be simultaneously performed, for example, using a structure for separately detecting infrared-ultraviolet light and visible light. In this case, when visible light is further divided into signal components of the primary colors and then detected, a visible light image with a correct color tone and an infrared-ultraviolet image may be simultaneously taken.

Furthermore, the barrier against electrons at the surface level is increased by the single crystal layer, thereby decreasing the dark current due to the electrons. For example, the dark current may be significantly decreased by 12 digits to significantly improve the signal S/N ratio with incident light.

Consequently, under imaging conditions, such as a small quantity of incident light in a dark room or the like, even when the signal gain is set to a higher value for increasing sensitivity, an image without significant noise may be obtained.

Furthermore, even in an imaging device with low sensitivity, a high quality image may be obtained only by amplification with an amplifier regardless of the quantity of incident light.

Furthermore, even when the quantity of incident light is increased by refining of elements, a sufficient S/N ratio may be attained, and thus a satisfactory image without significant noise may be obtained only by amplification with an amplifier for compensating for the low sensitivity.

Therefore, the number of pixels in a solid-state imaging device may be increased by refining of elements, and an optical device and a solid-state imaging device each including a light-receiving device may be decreased in size.

Additional features and advantages are described herein, and will be apparent from, the following Detailed Description and the figures.

BRIEF DESCRIPTION OF THE FIGURES

FIG. 8 is a reflection spectrum atlas illustrating conditions of reflection center wavelength $\lambda$.

FIG. 28 is a reflection spectrum atlas illustrating a spectral image sensor corresponding to single-wavelength spectral separation using a stacked film according to the fifth embodiment of the invention.

FIGS. 41A, 41B, and 41C are drawings showing examples of an arrangement of color separation filters.

FIGS. 44A, 44B, and 44C are drawings showing other examples of an arrangement of color separation filters.

FIGS. 50A and 50B are drawings illustrating a fourth example of pixel arrangements conscious of a decrease in resolution.

FIGS. 51A and 51B are drawings illustrating a fifth example of pixel arrangements conscious of a decrease in resolution.

DETAILED DESCRIPTION

Embodiments of the present invention will be described in detail below with reference to the drawings.

<<Concept of Dielectric Stacked Film Image Sensor>>

Figure 1:
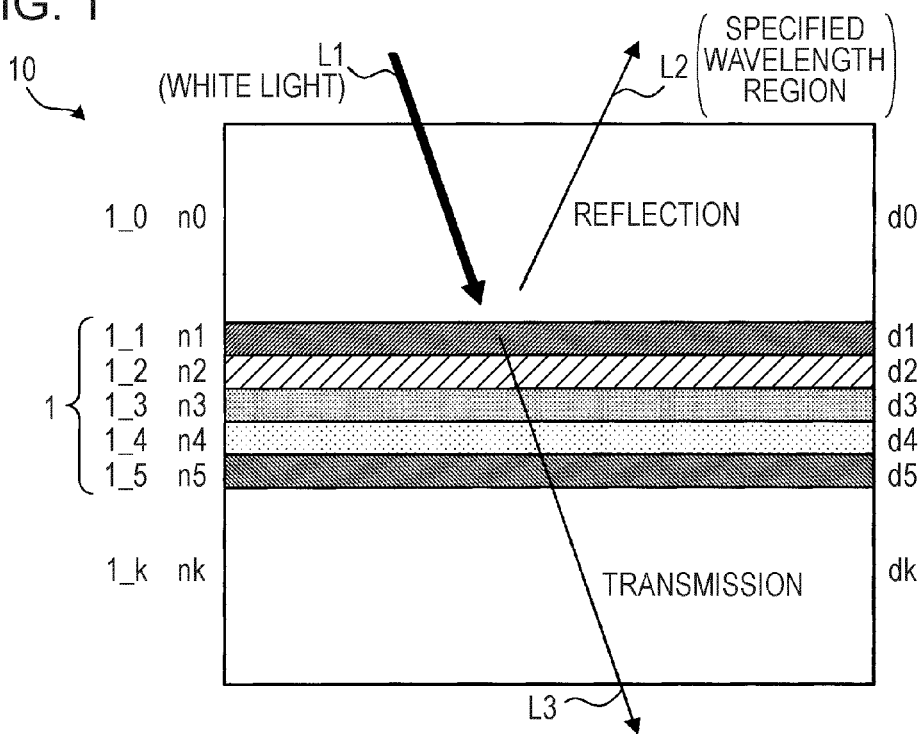
FIG. 1 is a drawing illustrating the concept of a spectral image sensor for dispersing an electromagnetic wave into predetermined wavelengths using a dielectric stacked film.

FIG. 1 is a drawing illustrating the concept of a spectral image sensor in which an electromagnetic wave is dispersed into predetermined wavelengths using a dielectric stacked film. Herein, description is made of a spectral image sensor in which light as an example of electromagnetic waves is dispersed into predetermined wavelengths.

In FIG. 1, reference numeral 1 denotes a dielectric stacked film, and reference numeral 10 denotes a spectral filter.

As shown in FIG. 1, the dielectric stacked film 1 is a stacked member having a structure in which a plurality of layers having different (refractive index difference Δn) refractive indexes nj (wherein j is a positive integer of 2 or more) between the adjacent ones and each having a predetermined thickness dj is stacked. As a result, the dielectric stacked film 1 has the characteristic that a predetermined wavelength region component of an electromagnetic wave is reflected, and the remainder is transmitted, as described below.

The dielectric layers 1_j constituting the dielectric stacked film 1 are counted, for example, from the first layer to the kth layer side excluding the thick layers (layers 1_0 and 1_k) on both sides. The dielectric stacked film 1 substantially includes the layers excluding the thick layers (layers 1_0 and 1_k) on both sides.

When light is incident on the dielectric stacked film 1 having the above-descried structure, the reflectance (or transmittance) assumes some dependency on wavelength λ due to interference in the dielectric stacked film 1. This effect becomes significant as the refractive index difference Δn of light increases.

In particular, when the dielectric stacked film 1 has a periodic structure or a certain condition (for example, the condition d~λ/4n of the thickness d of each layer), of incident light L1 such as white light or the like, the reflectance of light in a specified wavelength region (specified wavelength region light) is effectively increased to mainly produce a reflected light component L2. Namely, the transmittance is decreased. The reflectance of light in the other wavelength regions is decreased to mainly produce a transmitted light component L3. In other words, the transmittance may be increased.

The wavelength λ is a center wavelength of a certain wavelength region, and n is the refractive index of a layer. In an embodiment of the invention, the spectral filter 10 is realized by utilizing the wavelength dependency of reflectance (or transmittance) in the dielectric stacked film 1.

<Basic Structure of Spectral Image Sensor Using Dielectric Stacked Film>

Figure 2:
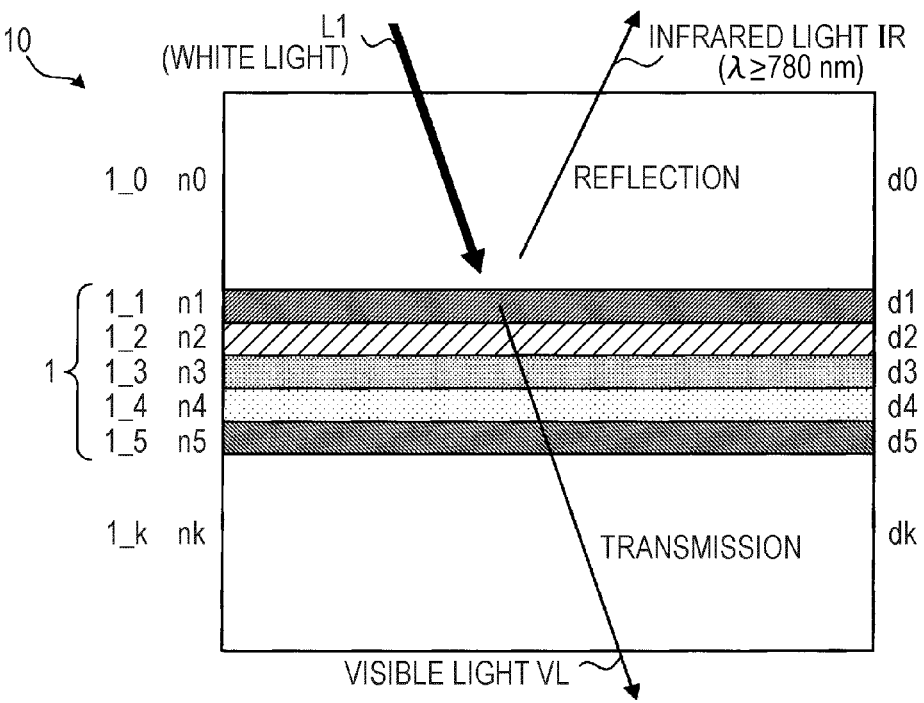
FIG. 2 is a conceptual drawing illustrating the basic configuration of a spectral image sensor using a dielectric stacked film.

FIG. 2 is a conceptual drawing illustrating the basic structure of a spectral image sensor using a dielectric stacked film. FIG. 2 shows an example in which incident light is dispersed into infrared light IR (Infrared) and visible light VL (Visible Light). The dielectric stacked film 1 is formed so as to have high reflectance for infrared light IR at wavelength λ (mainly a wavelength side longer than 780 nm) in the infrared region longer than that of visible light VL. In this case, infrared light IR is cut off. When such a dielectric stacked film 1 is not formed, infrared light IR may be transmitted.

Since the dielectric stacked film 1 includes a plurality of layers, at least two types of members (layer materials) are used for the respective dielectric layers 1_j. When three or more layers are used, different layer materials may be used for the respective dielectric layers 1_j or two (or more) layers may be stacked alternately or in any desired order. Alternatively, the dielectric stacked film 1 may include first and second basic layer materials and may be partially replaced by a third (or more) layer material. This will be described in detail below.

<Structure of Multi-Wavelength Spectral Image Sensor Using Dielectric Stacked Film>

Figure 3:
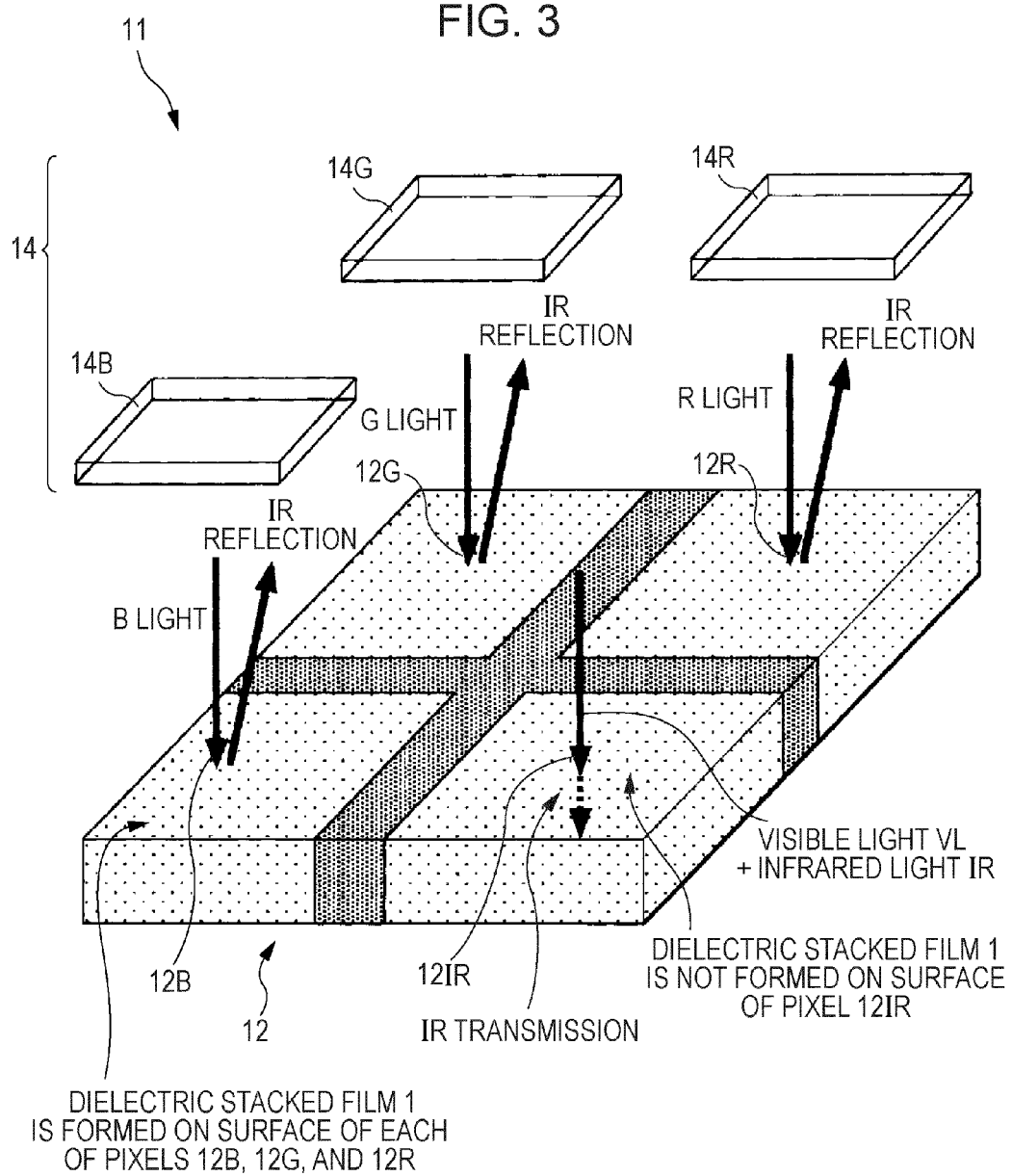
FIG. 3 is a drawing showing an example of a configuration in which the basic configuration of the spectral image sensor shown in FIG. 2 is applied to multi-wavelength spectral separation.

FIG. 3 is a drawing illustrating an example of a structure in which the basic structure of a spectral image sensor 11 including the spectral image sensor 10 shown in FIG. 2 is applied to multi-wavelength separation.

In FIG. 3, reference numeral 1 denotes a dielectric stacked film; reference numeral 11, a spectral image sensor; and reference numeral 12, a unit pixel matrix.

As described with reference to FIG. 2, infrared light IR is cut off by forming the dielectric stacked film 1, and infrared light IR is transmitted without forming the dielectric stacked film 1. By using this fact, a portion of the dielectric stacked film 1 is regularly removed in position alignment with a plurality of detecting parts (e.g., photodiodes) corresponding to respective wavelengths, the detecting parts constituting the unit pixel matrix 12. Namely, in each pixel (cell), infrared light is cut off or not cut off to permit imaging with only visible light VL and imaging with only infrared light IR at the same time or imaging with only visible light VL and imaging with a mixture of infrared light IR and visible light VL at the same time.

A monochrome image or color image may be taken without being influenced by infrared light IR in the daytime or imaging with infrared light IR may be performed in the night. According demand, both images may be output at the same time. In this case, an image with only infrared light IR may be obtained without being influenced by visible light VL in the daytime.

In other words, in the spectral image sensor 11 corresponding to multi-wavelength spectral separation, the dielectric stacked film 1 for reflecting infrared light IR is formed on the photodiode constituting a main part of each pixel of the unit pixel matrix 12 in which the pixels are regularly arranged so that infrared light is reflected, and a monochrome image of visible light VL alone is obtained without being influenced by infrared light IR on the basis of the pixel signals obtained from the pixels. Unlike in the structure disclosed in Japanese Unexamined Patent Application Publication No. 2002-142228, arithmetic operation may not be performed between visible light VL and infrared light IR components for obtaining a monochrome image of visible light VL with substantially no influence of infrared light IR.

Furthermore, as an example of optical members for separating a wavelength region component into predetermined wavelength region components, a color filter 14 having a predetermined wavelength transmission characteristic in the visible light VL region may be provided on each photodiode on which the dielectric stacked film 1 is formed. In this case, an image of only a specified wavelength region in the visible light VL region is obtained with substantially no influence of infrared light IR.

When color filters 14x having different wavelength transmission characteristics in the visible light VL region are regularly integrally arranged on a plurality of the photodiodes corresponding respective wavelengths (respective colors) in position alignment with the respective photodiodes, the photodiodes constituting the unit pixel matrix 12, the visible light VL region may be separated into respective wavelengths (respective colors). Consequently, a color image (visible color image) of only visible light VL with substantially no influence of infrared light IR may be obtained by composite processing based on pixel signals from the pixels of respective colors. Unlike in the structure disclosed in Japanese Unexamined Patent Application Publication No. 2002-142228, arithmetic operation may not be performed between visible light VL and infrared light IR components for obtaining a color image of visible light VL with substantially no influence of infrared light IR.

In the same imaging device (spectral image sensor 11), for example, when the unit pixel matrix 12 includes a pixel in which the dielectric stacked film 1 is not formed, a monochrome or color image of visible light VL and an image of infrared light IR may be always independently obtained by matrix operation of the outputs of the pixels. In addition, since the dielectric stacked film 1 integrally formed on each of the photodiodes is partially removed, unlike in a case in which separate optical members including the respective dielectric stacked films 1 but not including the dielectric stacked film 1 are disposed on an imaging device, a problem with alignment does not occur.

For example, an image (monochrome image or color image) of only visible light VL with substantially no influence of infrared light IR and an image of a mixture of infrared light IR and visible light VL may be taken at the same time. In addition, an image of only infrared light IR with substantially no influence of visible light VL may be taken by composite processing (in detail, differential processing) of a component (monochrome image component or color image component) of only visible light VL and a mixed component of infrared light IR and visible light VL.

Considering that the phrase "with substantially no influence" is finally based on a human vision, light influence may be present to an extent that a significant difference is generally not observed with the human eyes. In other words, with respect to the infrared light IR side, it may be possible to obtain an infrared image (an example of physical information) in which the transmitted wavelength region (visible light VL) may be neglected. With respect to the visible light VL side, it may be possible to obtain an ordinary image (an example of physical information) in which the reflected wavelength region component (infrared light IR) may be neglected.

The color filter 14 may be an primary color filter for a blue component B (for example, transmittance of about 1 at wavelength $\lambda$=400 to 500 nm, and transmittance of substantially zero at other wavelengths), a green component G (for example, transmittance of about 1 at wavelength $\lambda$=500 to 600 nm, and transmittance of substantially zero at other wavelengths), or a red component R (for example, transmittance of about 1 at wavelength $\lambda$=600 to 700 nm, and transmittance of substantially zero at other wavelengths), the components B, G, and R being the three primary color components of visible light VL (wavelength $\lambda$=380 to 780 nm).

Alternatively, the color filter 14 may be a complementary color filter for a yellow component Ye (for example, transmittance of substantially zero at wavelength $\lambda$=400 to 500 nm, and transmittance of about 1 at other wavelengths), a magenta component Mg (for example, transmittance of substantially zero at wavelength $\lambda$=500 to 600 nm, and transmittance of about 1 at other wavelengths), or a cyan component Cy (for example, transmittance of substantially zero at wavelength $\lambda$=600 to 700 nm, and transmittance of about 1 at other wavelengths). The complementary color filter has transmittance of substantially zero for the three primary color components of visible light.

The complementary color filter has higher sensitivity than that of the primary color filter, and thus the sensitivity of an imaging device may be increased using the complementary color filter in which transmitted light in the visible region has the corresponding complementary color of one of the primary colors. Conversely, use of the primary color filter has the advantage that signals of the primary colors may be obtained even without differential processing, thereby simplifying signal processing.

The term "transmittance of about 1" indicates an ideal state in which the transmittance in a certain wavelength region is greatly higher than those in other wavelength regions. The transmittance is not necessarily "1". Similarly, the term "transmittance of substantially zero" indicates an ideal state in which the transmittance in a certain wavelength region is greatly lower than those in other wavelength regions. The transmittance is not necessarily "substantially zero".

In either of the primary color system and the complementary color system, the wavelength region component of a predetermined color (primary color or complementary color) within the region of visible light VL, which is the transmitted wavelength region component, may be transmitted regardless of whether of not the region of infrared light IR, which is the reflected wavelength region component, is passed, i.e., regardless of the transmittance for infrared light IR. This is because the infrared light IR component is cut off with the dielectric stacked film 1.

For example, as shown in FIG. 3, the dielectric stacked film 1 is not formed only on the pixel 12IR in the unit pixel matrix 12 including the four pixels (cells), and the dielectric stacked films 1 are formed on the pixels 12R, 12G, and 12B of the other colors of red (R), green (G), and blue (B), respectively. Also, three primary color filters 14R, 14G, and 14B of red (R), green (G), and blue (B), respectively, are also provided on the respective dielectric stacked films 1.

As shown in FIG. 3, in order to increase sensitivity, a color filter 14C is not disposed in the pixel 12IR without the dielectric stacked film 1 so that not only infrared light IR but also visible light VL simultaneously contribute to signals. In this case, the pixel 12IR for infrared light may be allowed to substantially function as a pixel for infrared light IR and visible light VL, not only for infrared light IR.

In particular, the unit pixel matrix 12 including the four pixels is divided into the pixels 12R, 12G, 12B, and 12IR so that the entire structure of the imaging device (spectral image sensor 11) may be formed without any space, thereby facilitating design.

In such a case, an image is synthesized on the basis of the red (R), green (G), and blue (B) color components obtained from the three pixels 12R, 12G, and 12B, respectively, and thus a visible VL color image (i.e., an ordinary color image) may be obtained with substantially no influence of infrared light IR. At the same time, an image of infrared light IR may be taken on the basis of mixed components of infrared light IR and visible light VL which are obtained from the pixel 12IR.

The term "image of infrared light IR" means an image of only infrared light IR which is substantially not influenced by visible light VL or an image of a mixture of infrared light IR and visible light VL. In the structure shown in FIG. 3, in order to obtain an image of only infrared light IR which is substantially not influenced by visible light VL, it is desirable to take a difference between a component mixture of infrared light IR and visible light VL and each of the color components of red (R), green (G), and blue (B) which are obtained from the three pixels 12R, 12G, and 12B, respectively. This is because the intensity of infrared light is determined by subtracting the intensities of blue, red, and green, which are obtained from the three pixels 12R, 12G, and 12B, respectively, from the output of the pixel 12IR which receives visible light VL and infrared light IR, even when a green filter 14G or a black filter 14BK is not provided, as described below.

Considering an application in which an image of only infrared light IR with substantially no influence of visible light VL is taken at the same time, such as an application to optical communication or an application in which a position is detected by tracking an infrared luminous point, a color filter 14C may be disposed on the pixel 12IR, the color filter transmitting at least infrared light IR which is the reflected wavelength region component and transmitting a predetermined wavelength component of visible light VL which is the transmitted wavelength region component.

For example, when a green filter 14G transmitting infrared light IR and green light G is provided as the color filter C, a mixture of the components of infrared light IR and green visible light LG is obtained from the pixel 12IR. However, by taking a difference from the green component of only visible light obtained from the pixel 12G, it may be possible to obtain an image of only infrared light with substantially no influence of visible light (in this case, green light G). Although the green filter 14G is preferably provided, processing is simplified as compared with a case in which the intensities of blue, red, and green obtained from the three pixels 12R, 12G, and 12B, respectively, are subtracted without proving the green filter 14G.

Alternatively, the black filter 14BK which transmits infrared light and absorbs only visible light VL may be provided as the color filter 14C. In this case, visible light VL is absorbed by the black filter 14BK to obtain a component of only infrared light IR from the pixel 12IR, thereby obtaining an image of only infrared light IR with substantially no influence of visible light VL even when differential processing is not performed.

Each of R, G, and B color filters generally used at present has high transmittance for R, G, or B, in the visible light band and low transmittance for the other colors (for example, G and B in the case of a R color filter). However, transmittance for light out of the visible light band is not specific and is generally higher than that for the other colors (for example, G and B in the case of a R color filter). For example, each of the filters has sensitivity in the infrared region and transmits light in the infrared region. However, in this embodiment, even when the transmittance out of the visible light band is high, there is no influence.

<<Method for Designing a Dielectric Stacked Film; an Example of Infrared Cut>>

<Method for Designing Thickness dj>

Figure 4:
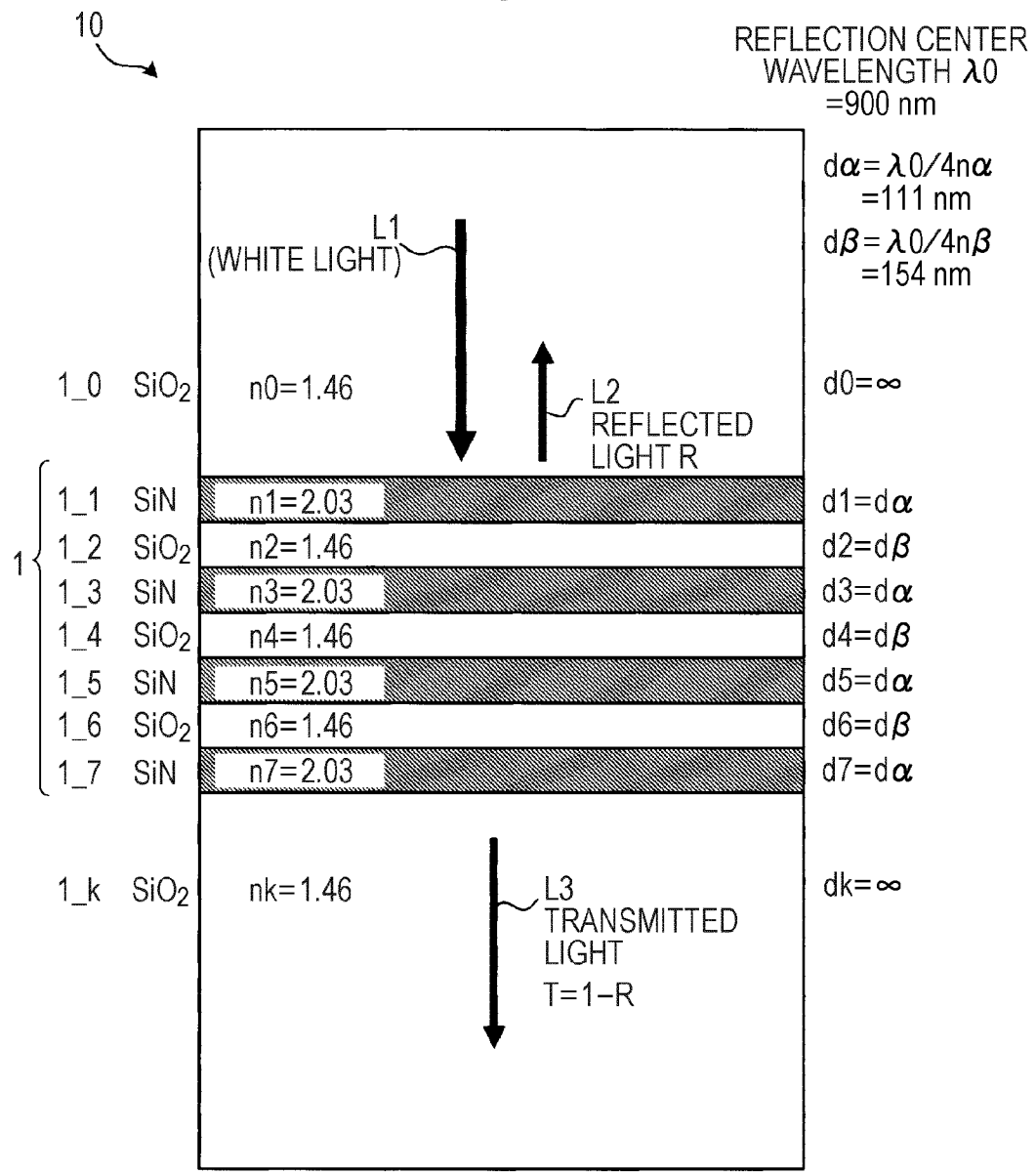
FIG. 4 is a structural drawing illustrating the basic concept of a method for designing a stacked film.
Figure 5:
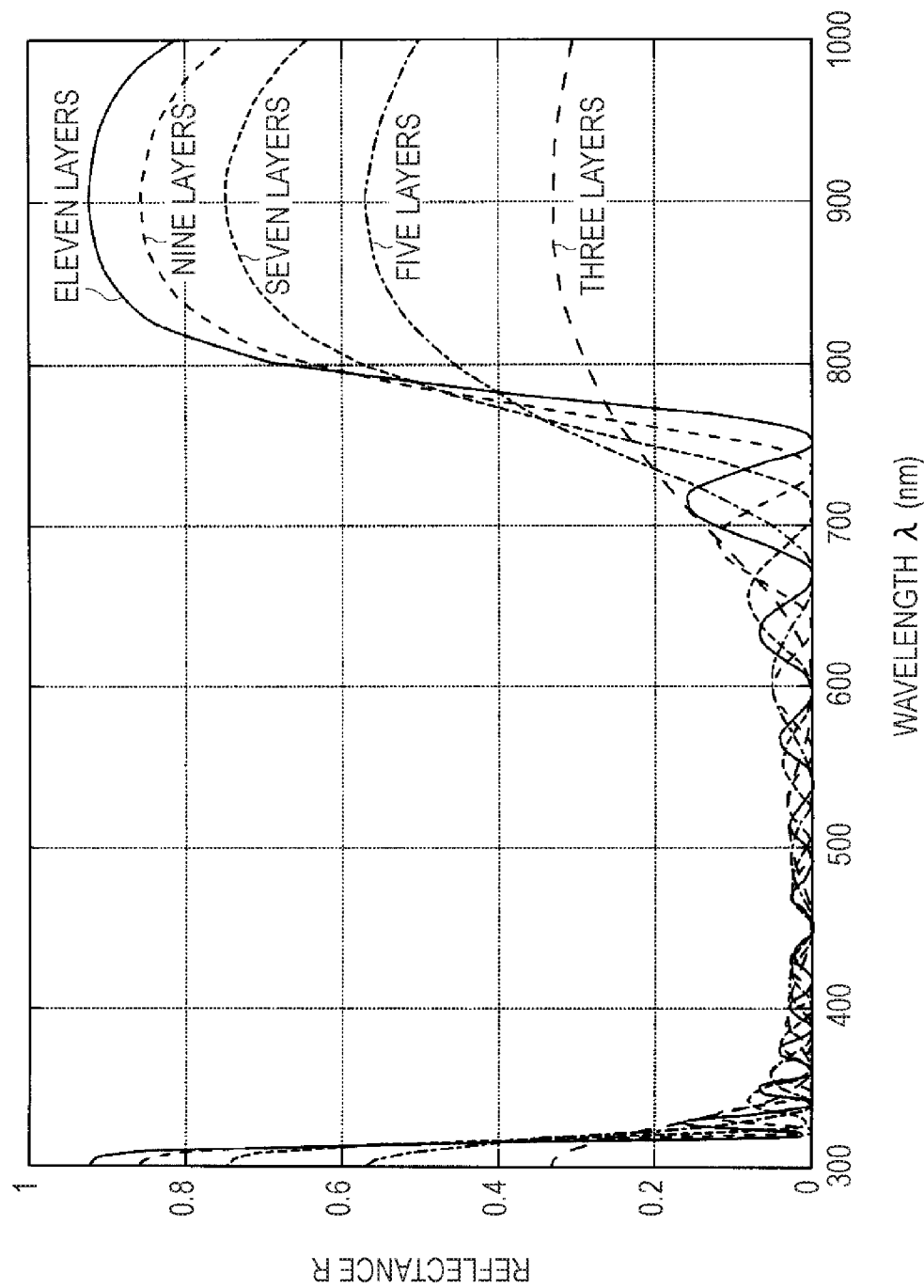
FIG. 5 is a reflection spectrum atlas illustrating the basic concept of a method for designing a stacked film.
Figure 6:
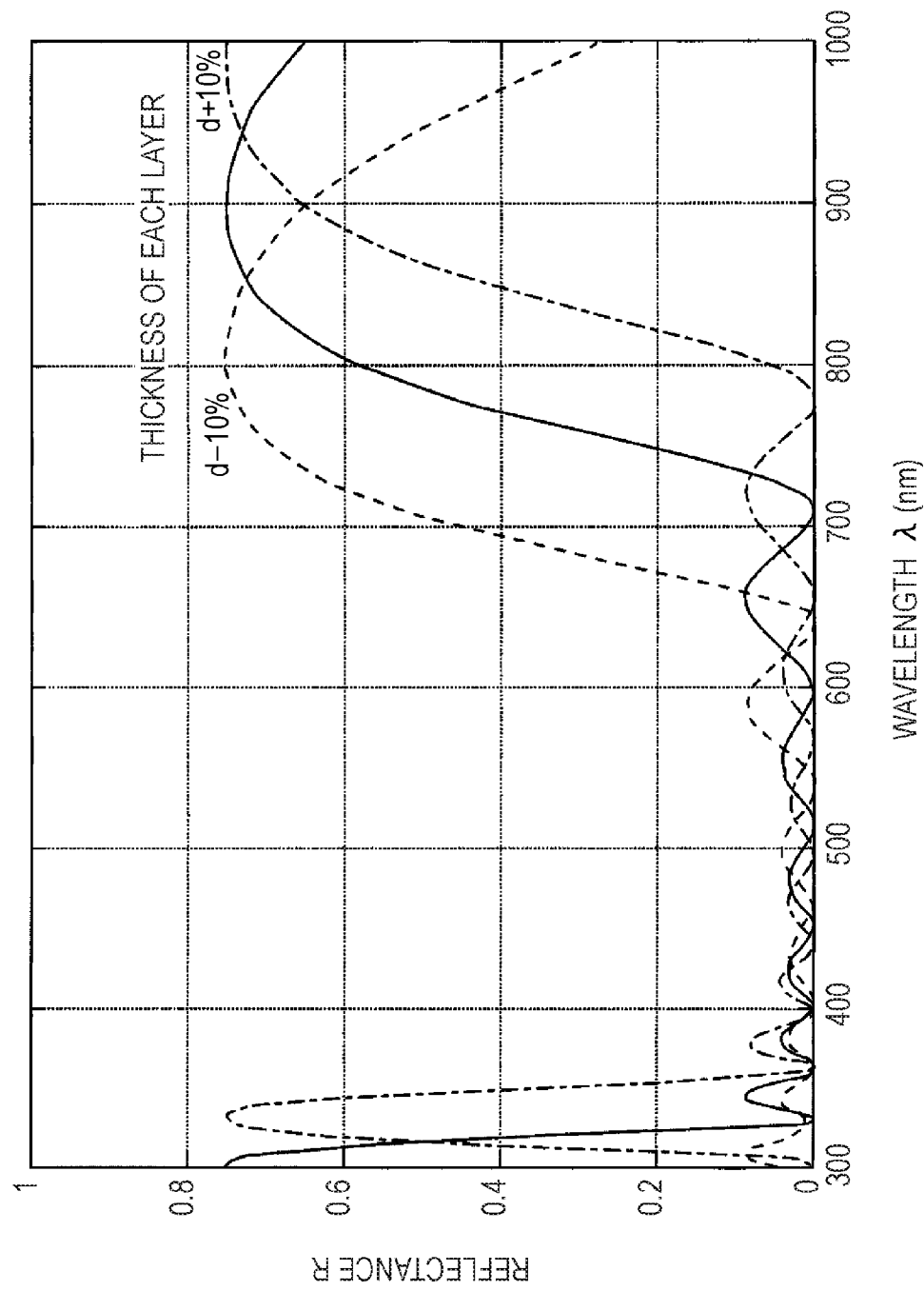
FIG. 6 is a reflection spectrum atlas illustrating the basic concept of a method for designing a stacked film.

FIGS. 4 to 6 are drawings illustrating the basic concept of a method for designing the dielectric stacked film 1. Herein, description is made of an example of design in which the dielectric stacked film 1 includes first and second basic layer materials, and infrared light IR is selectively reflected.

As shown in a structural drawing of FIG. 4, in the dielectric stacked film 1 used in this embodiment, a plurality of dielectric layers 1_$j$ each composed of a first or second layer material is stacked, the dielectric layers 1_$j$ being held between thick silicon oxide $SiO_2$ layers (referred to as "$SiO_2$" hereinafter) on both sides (referred to as a "layer 0" on the incident side and a "layer k" on the opposite side). In the example shown in FIG. 4, general materials are used as the first and second layer materials for the dielectric layers 1_$j$. Specifically, silicon nitride $Si_3N_4$ (referred to as "SiN" hereinafter) and silicon oxide $SiO_2$ are used as the first layer material and the second layer material, respectively, and are stacked alternately. It is also assumed that sufficiently thick layers of silicon oxide $SiO_2$ ($d_0 = d_k = \infty$) are deposited on and below the structure of the dielectric stacked film 1.

When such a dielectric stacked film 1 satisfies the equation (1), the reflectance may be effectively increased.

Equation 1

$$dj = \lambda 0 / 4nj \quad (1)$$

In this equation, dj (is a layer number hereinafter) represents the thickness of each of the dielectric layers 1_$j$ constituting the dielectric stacked film 1, nj represents the refractive index of each of the dielectric layers 1_$j$, and $\lambda 0$ represents the center wavelength (referred to as the "reflection center wavelength" hereinafter) in the reflected wavelength region.

The dielectric layers 1_$j$ constituting the dielectric stacked film 1 are counted from the first layer to the kth layer excluding the thick silicon oxide $SiO_2$ layers on both sides. For example, the dielectric layers 1_$j$ includes three layers including a SiN layer, an $SiO_2$ layer, and an SiN layer or five layers including an SiN layer, an $SiO_2$ layer, an SiN layer, an $SiO_2$ layer, and an SiN layer in the order from the first to the kth layer. FIG. 4 shows a seven-layer structure.

In addition, the reflection center wavelength $\lambda 0$ of infrared light IR, which is a reflected wavelength region, is 900 nm, the refractive index n$\alpha$ of silicon nitride of odd-numbered layers is 2.03, the refractive index n$\beta$ of silicon oxide $SiO_2$ of the 0th, even-numbered, and kth layers is 1.46, and the refractive index difference $\Delta n$ is 0.57.

According to equation (1), the thickness dα (=d1, d3, ... j=odd number) of silicon nitride SiN is 111 nm, and the thickness dα (=d2, d4, ... j=even number) of silicon oxide $SiO_2$ is 154 nm.

FIG. 5 shows the results (reflection spectrum atlas) of reflectance R calculated by the effective Fresnel coefficient method for the structure shown in FIG. 4 using general materials. This figure indicates the dependency of a reflection spectrum on the number of layers.

The results shown in FIG. 5 indicate that as the number of layers increases, the reflectance R increases with a center at the reflection center wavelength λ0 900 nm of infrared light IR. Furthermore, it is found that by selecting a wavelength of 900 nm as the reflection center wavelength λ0, infrared light IR and visible light VL are substantially separated. It is further found that with five or more layers, the reflectance R is 0.5 or more, and in particular, with seven or more layers, the reflectance R desirably exceeds 0.7.

FIG. 6 is a diagram illustrating the dependency (relation to variations) on variations in the thickness of the dielectric layers 1_j. FIG. 6 shows the results (reflection spectrum atlas) calculated with changes of ±10% of the thickness dj of each dielectric layer 1_j in an example including seven layers.

According to conditional equation (1), an ideal calculated value is obtained by the Fresnel coefficient method. However, in fact, the condition of equation (1) is easy and varies. For example, it is found from calculation by the Fresnel coefficient method that even when the thickness dj has an error of ±10%, the reflectance is effectively increased.

For example, FIG. 6 indicates that even when the thickness dj has variations, the reflectance R is effectively increased. Specifically, the sufficient reflectance R of 0.5 or more is obtained at the reflection center wavelength λ0 of 900 nm of infrared light IR, and the reflectance is high over the entire infrared region IR (mainly on the wavelength side of 780 nm or longer). Therefore, when variations are actually taken into consideration, with the dielectric layers 1_j each having a thickness of dj within the range of equation (2) below, a sufficient effect is obtained for effectively increasing the reflectance.

Equation 2

$$0.9 \times \lambda 0/4n \leq dj \leq 1.1 \times \lambda 0/4n \quad (2)$$

<Method of Designing Reflection Center Wavelength λ0>

Figure 7A:
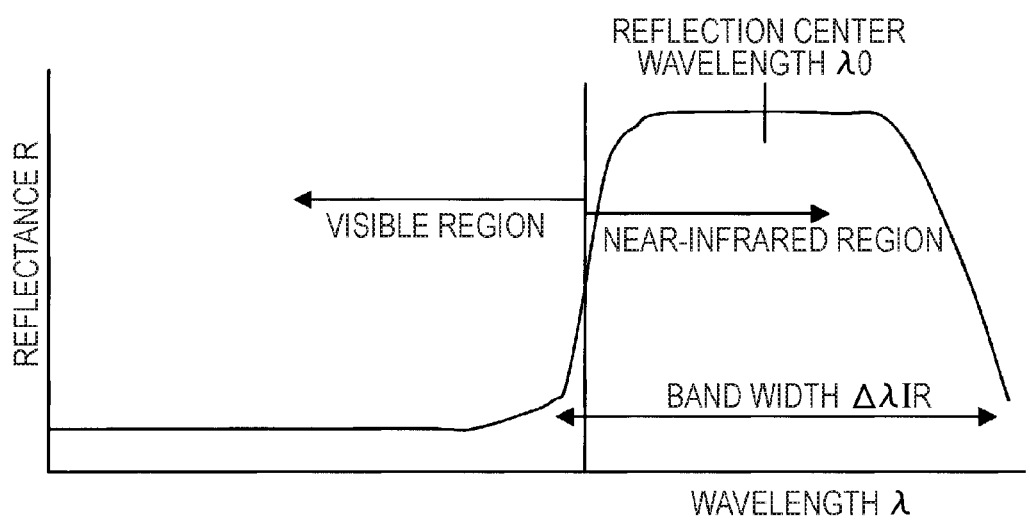
FIGS. 7A and 7B are drawings (conceptual drawings of reflection spectrum) illustrating conditions of reflection center wavelength $\lambda$.
Figure 7B:
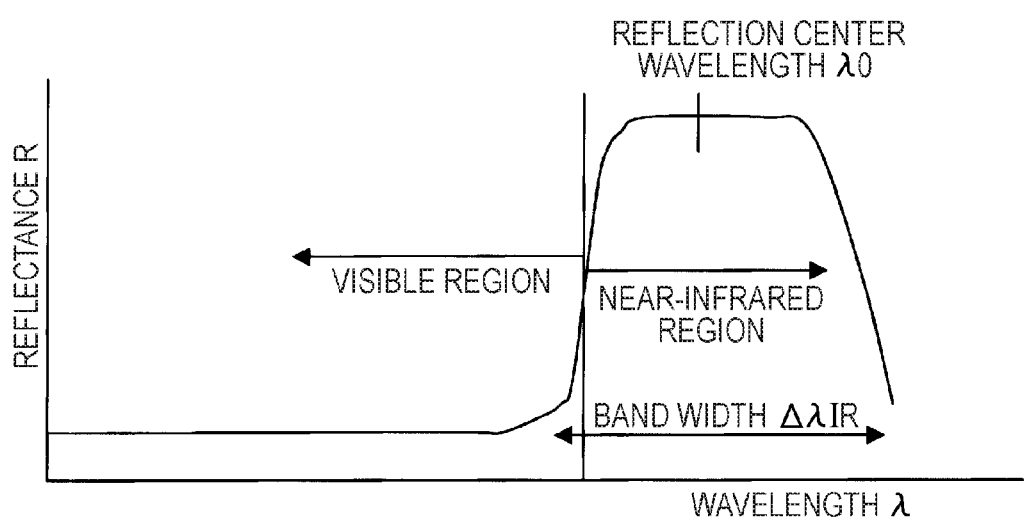
Figure 9:
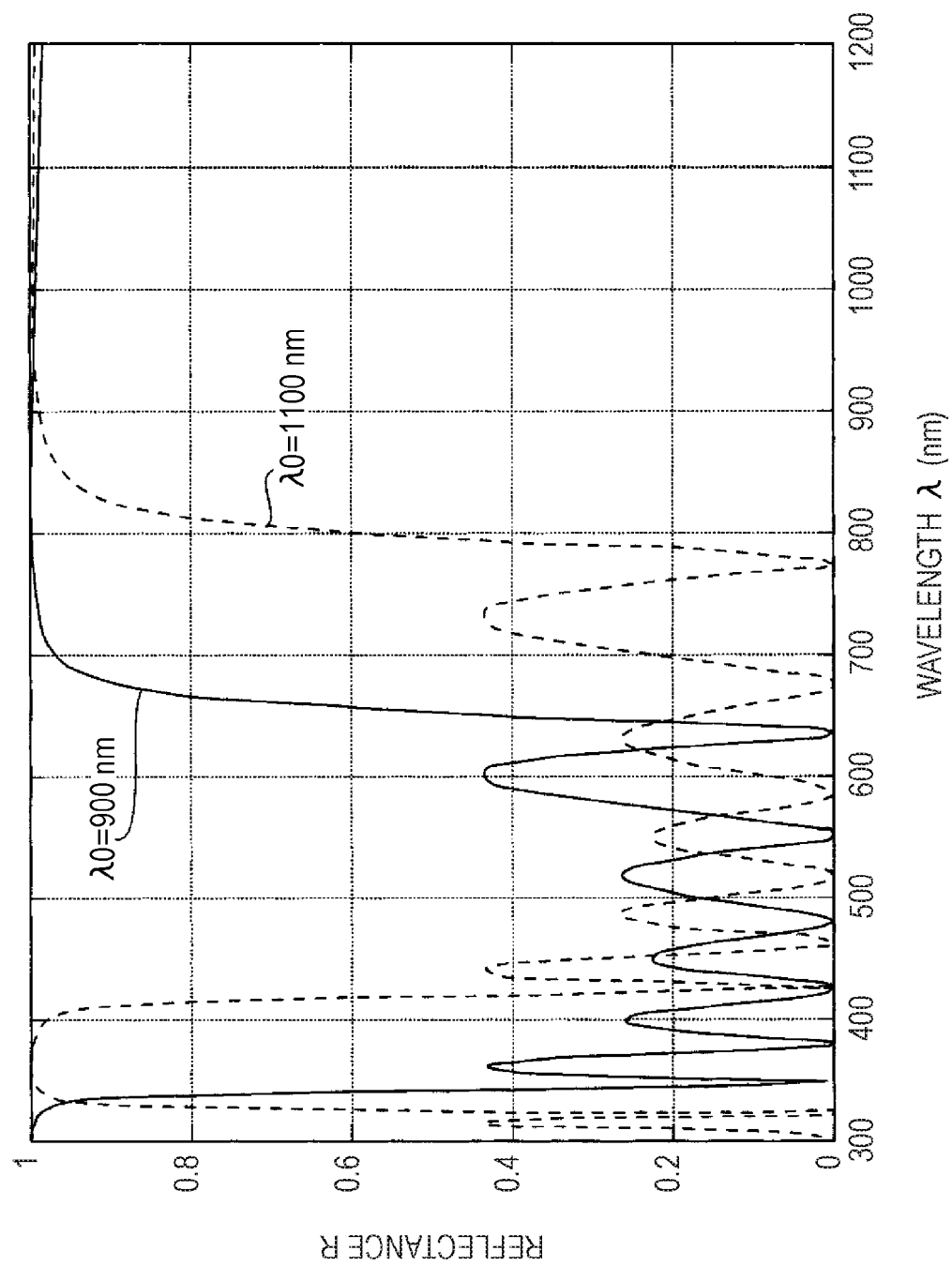
FIG. 9 is a reflection spectrum atlas illustrating conditions of reflection center wavelength $\lambda$.

FIGS. 7 to 9 are drawings illustrating conditions of the reflection center wavelength λ0. The numerical condition of the thickness dj depends on the band width ΔλIR in the infrared reflection region of a spectrum. As shown in FIG. 7(A) showing the concept of a reflection spectrum, when the band width αλIR in the infrared reflection region is wide, reflection of visible light VL becomes significant unless the center wavelength λ0 is shifted to the longer wavelength side. As shown in FIG. 7(B) showing the concept of a reflection spectrum, when the band width ΔλIR in the infrared reflection region is narrow, reflection of visible light VL does not occur in the infrared region near visible light VL unless the center wavelength λ0 is shifted to the shorter wavelength side.

A graph of an absorption spectrum of silicon Si indicates that when infrared light IR in a range of 0.78 μm≦λ≦0.95 μm within the infrared region is reflected, the infrared cut effect becomes satisfactory. This is because light at wavelengths longer than 0.95 μm is rarely absorbed in silicon Si and is not subjected to photoelectric conversion. Therefore, it is preferred to select the reflection center wavelength so that infrared light IR at wavelengths in a range of 0.78 μm≦λ≦0.95 μm is reflected.

Since visible light VL in a range of 649 nm to 780 nm within the red (R) region has low visibility, an imaging device may not be influenced by reflection of the light. Therefore, even when reflection occurs in the wavelength region of 640 nm to 780 nm, no trouble occurs.

Furthermore, with the large refractive index difference Δn of the dielectric stacked film 1, the band width ΔλIR of the infrared reflection region widens, and conversely with the small refractive index difference Δn of the dielectric stacked film 1, the band width ΔλIR of the infrared reflection region narrows. Therefore, in the case of a $SiN/SiO_2$ multilayer film, the band width ΔλIR of the infrared reflection region becomes narrow, while in the case of a $Si/SiO_2$ multilayer film, the band width ΔλIR of the infrared reflection region becomes wide.

As a result, in the case of a $SiN/SiO_2$ multilayer film (refractive index difference Δn=0.57), calculation with the reflection center wavelengths λ0 of 780 nm and 950 nm shown in a reflection spectrum atlas of FIG. 8 shows that the above-described conditions are substantially satisfied within the range of 780 nm≦λ0≦950 nm. FIG. 8 shows the results of calculation of reflectance R so as to obtain the reflection center wavelengths λ0 of 780 nm and 950 nm only by changing the thickness dj of each dielectric layer 1_j in the stacked structure shown in FIG. 13, which will be described below.

Similarly, in the case of a $Si/SiO_2$ multilayer film (refractive index difference Δn=2.64), a reflection spectrum atlas of FIG. 9 shows that the above-described conditions are substantially satisfied within the range of 900 nm≦λ0≦1100 nm.

Consequently, in a combination of silicon nitride SiN, silicon Si, and silicon oxide $SiO_2$, the reflection center wavelength λ0 preferably satisfies equation (3-1) below, and more preferably equation (3-2). This means that the reflection center wavelength λ0 ideally near 900 nm.

Equation 3

$$780 \text{ nm} \leq \lambda 0 \leq 1100 \text{ nm} \quad (3\text{-}1)$$

$$850 \text{ nm} \leq \lambda 0 \leq 1000 \text{ nm} \quad (3\text{-}2)$$

Of course, the above-described materials are only examples, and the above-described effects may be achieved by a material combination other than the combination of silicon oxide $SiO_2$ and silicon nitride SiN layers. It is estimated from calculation that the same effects are obtained by selecting materials so that the refractive index difference is 0.3 or more and more preferably 0.5 or more.

For example, the composition of an SiN film may slightly vary depending on formation conditions. Examples of materials other than silicon oxide $SiO_2$ and silicon nitride SiN usable for the dielectric layers 1_j constituting the dielectric stacked film 1 include oxides, such as alumina $Al_2O_3$, zirconia $ZrO_2$ (refractive index 2.05), titanium oxide $TiO_2$ (refractive index 2.3 to 2.55), magnesium oxide MgO, and zinc oxide ZnO (refractive index 2.1); polymer materials, such as polycarbonate PC (refractive index 1.58) and acrylic resin PMMA (refractive index 1.49); and semiconductor materials, such as silicon carbide SiC (refractive index 2.65) and germanium Ge (refractive index 4 to 5.5).

By using a polymer material, an optical filter having characteristics, which are absent from ordinary glass optical filters, may be formed. Namely, a plastic optical filter has a light weight and excellent durability (high temperature, high humidity, and impact).

Alternatively, in order to effectively decrease the dark current, a single crystal layer made of a material having a wide band gap may be bonded to a surface of a semiconductor layer (semiconductor substrate, a semiconductor epitaxial layer, a semiconductor substrate and a semiconductor epitaxial layer formed thereon, or the like) in which a photoelectric transducer is formed, thereby forming a high potential barrier.

Figure 56:
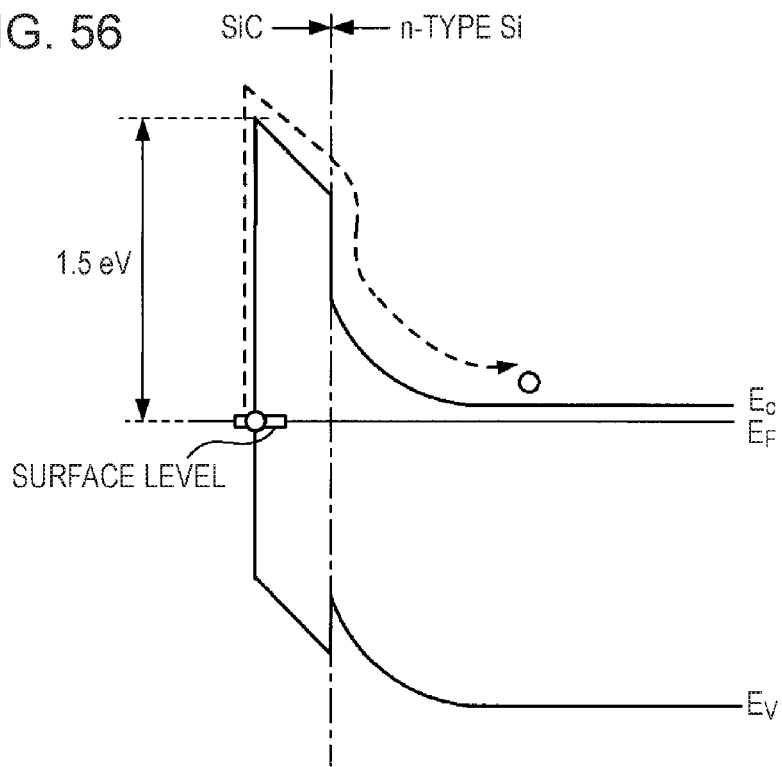
FIG. 56 is a diagram showing a potential distribution.
Figure 60A:
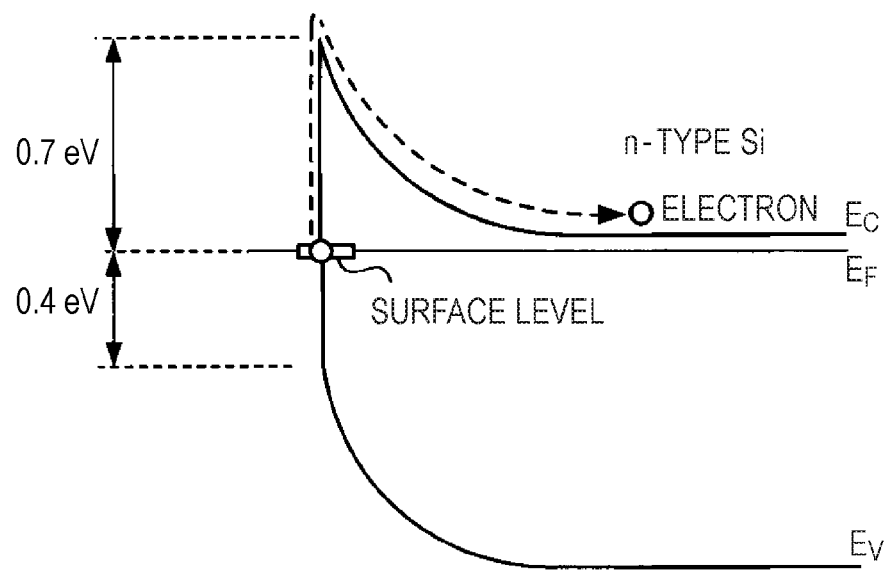
FIG. 60A is a diagram showing a potential distribution of a general solid-state imaging device.
Figure 60B:
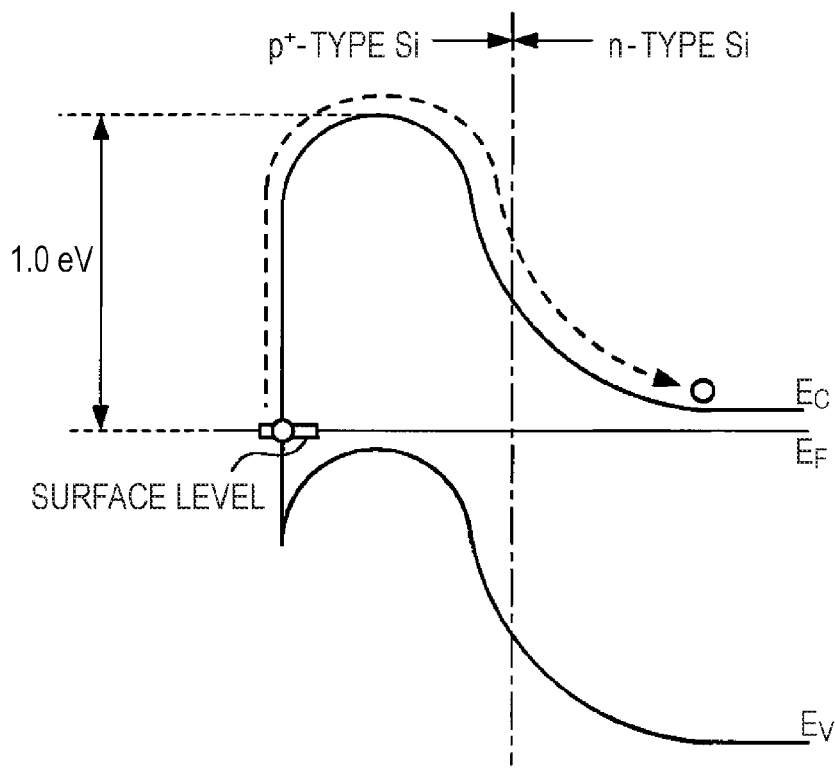
FIG. 60B is a diagram showing a potential distribution of a structure including a p+ layer formed on a surface.

For example, when a cubic SiC layer is bonded to a surface of an n-type Si layer in which a photodiode is formed, with a SiC band gap of 2.2 eV, the potential barrier becomes 1.5 eV as shown by a depth-direction potential distribution in FIG. 56. In this case, the potential barrier is higher than those in the cases shown in FIGS. 60A and 60B, thereby decreasing the dark current.

According to the above-described Fermi-Dirac distribution function, the dark current is decreased by about 12 digits at room temperature.

When the dark current is decreased, noise is also decreased to increase the S/N ratio. As a result, with a small quantity of incident light, even when a signal is amplified with an amplifier, noise becomes unnoticeable.

Conceivable examples of the wide-band gap material include various materials.

For example, the band gap may be changed by changing the composition ratio of a mixed crystal system, such as a compound semiconductor. Examples of the mixed crystal system include an AlGaInP mixed crystal, a SiC mixed crystal, a ZnCdSc mixed crystal, and an AlGaInN mixed crystal.

When a silicon layer is used as a semiconductor layer in which photoelectric transducers are formed, a SiC system using an element the same group VI is preferred in view of ease of production and the like.

However, silicon and SiC have a high absolute value of lattice mismatch therebetween, and thus misfit dislocation easily takes place at a junction interface. The lattice mismatch is defined by the following equation (equation 11):

$$\Delta a = \frac{a_{SiC} - a_{Si}}{a_{Si}} \qquad \text{Equation 11}$$

wherein $a_{SiC}$ and $a_{Si}$ are lattice constants of SiC and Si, respectively.

In order to prevent the occurrence of misfit dislocation, for example, the thickness of a SiC film may be deceased to about a critical thickness or less. For example, it has been found from experiments the thickness of a SiC film is preferably decreased to 30 nm or less.

It has been also found that when the composition ratio of C in SiC is high, for example, Si:C is 1:1, the thickness is preferably further decreased to 15 nm or less.

Furthermore, Ge may be added to SiC to form a SiGeC mixed crystal, for decreasing the absolute value of lattice mismatch $\Delta a$.

Table 1 shows the lattice constants of Si, Ge, and C crystal structures.

TABLE 1

| | Crystal structure | Lattice constant (Å) |
|---|---|---|
| Si | Diamond | 5.43095 |
| Ge | Diamond | 5.64613 |
| C | Diamond | 3.56683 |

Table 1 indicates that in a SiC system, the absolute value of lattice mismatch $\Delta a$ is increased because the lattice constant of C is smaller than that of Si.

Therefore, by mixing Ge having a larger lattice constant than that of Si with SiC, the absolute value of lattice mismatch $\Delta a$ is decreased to some extent.

Even when a single crystal layer is formed using SiGeC, the thickness of the single crystal layer is preferably 30 nm or less and more preferably 15 nm or less.

Since SiGe not containing C has a narrower band gap than that of Si, C is preferably added when the SiGe system is used for a single crystal layer.

As described above, the crystallinity is increased by adding Ge to form an SiGeC mixed crystal. However, the crystallinity may be increased by another method.

Namely, at least one strained super lattice layer having a thickness of 15 nm or less may be inserted at the interface between a semiconductor layer such as a Si layer or the like and a single crystal layer such as a SiGeC layer or the like. The strained super lattice layer relieves strain and removes dislocation in the planar direction, thereby increasing crystallinity. In this case, a thin film of a super lattice may be any one of films having lattice constants different from that of Si. In other words, for example, when a plurality of SiGeC system layers having different composition rations is formed on a Si substrate, the same effect as described above may be obtained.

In order to obtain a thin film including a single crystal layer of one of the above-described compounds, any general crystal growth method such as a CVD (chemical vapor deposition) method, a MOCVD (metal-organic CVD) method, a plasma CVD method, a MBE (molecular beam epitaxy) method, a laser abrasion method, a sputtering method, or the like may be used.

Alternatively, a carbonaceous material such as carbon or the like may be deposited on a silicon surface and then annealed to carbonize the silicon surface, thereby forming a SiC layer on the surface.

As described above, when the single crystal layer having a wide band gap is excessively thick, misfit dislocation occurs between the single crystal layer and a semiconductor layer. Therefore, the thickness is preferably several tens nm or less.

On the other hand, when the layer is excessively thin, a tunnel effect occurs, and thus the layer does not sufficiently function as a barrier. Therefore, the thickness is preferably 2 nm or more and more preferably 5 nm or more.

When the wide-band-gap layer is an amorphous layer or polycrystalline layer, not a single crystal layer, a level is formed at the interface between the layer and a semiconductor layer disposed thereunder, thereby undesirably failing to sufficiently decrease the dark current.

Spectral Image Sensor Using Dielectric Stacked Film

First Embodiment

FIGS. 10 to 14 are drawings illustrating a spectral image sensor 11 corresponding to single wavelength spectral separation using a dielectric stacked film according to a first embodiment. The first embodiment uses a basic method for designing a spectral image sensor using a dielectric stacked film. Herein description will be made of an example of a design of the spectral image sensor 11 in which a dielectric stacked film 1 for selectively reflecting infrared light IR is used for cutting infrared light IR and receiving visible light VL.

When the dielectric stacked film 1 described above with reference to FIGS. 4 to 6 is formed on a semiconductor device layer on which a detecting element such as a silicon (Si) photodetector or the like is formed, the semiconductor device layer having a refractive index higher than that of each of the dielectric layers 1_$j$ of the dielectric stacked layer 1, the distance between the semiconductor device layer and the dielectric stacked film 1, i.e., the thickness dk of the kth dielectric layer 1_$k$ including a silicon oxide $SiO_2$ layer, is important.

Figure 10:
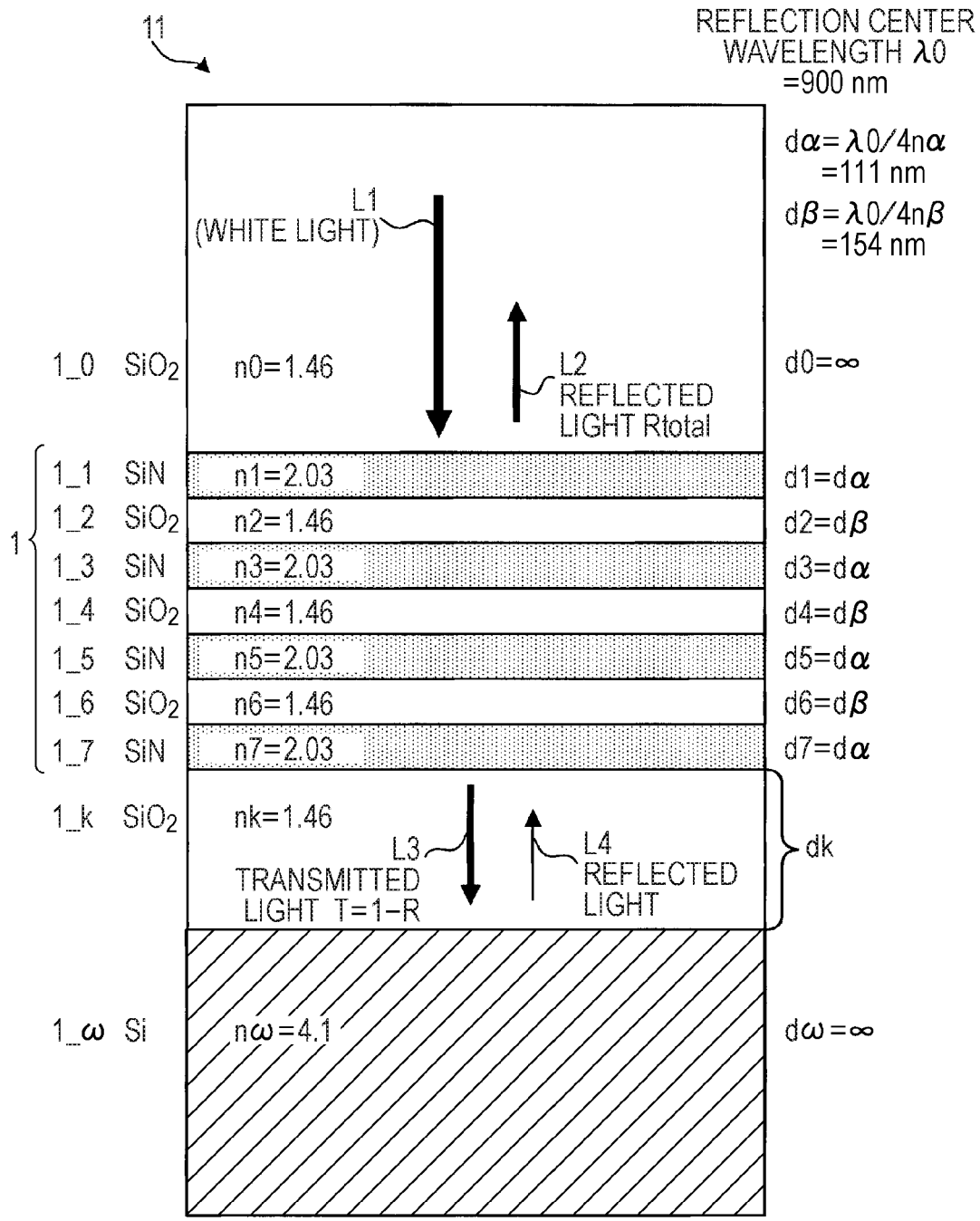
FIG. 10 is a structural drawing illustrating a spectral image sensor corresponding to single-wavelength spectral separation using a stacked film according to a first embodiment of the invention.

This means that as shown in a structural drawing of FIG. 10, the total reflected light $LR_{total}$ changes with the interference effect with reflected light L4 from the surface of a silicon substrate 1_$\omega$ which is the surface of the semiconductor device layer (photodetector or the like) composed of, for example, silicon Si (refractive index 4.1).

Figure 11:
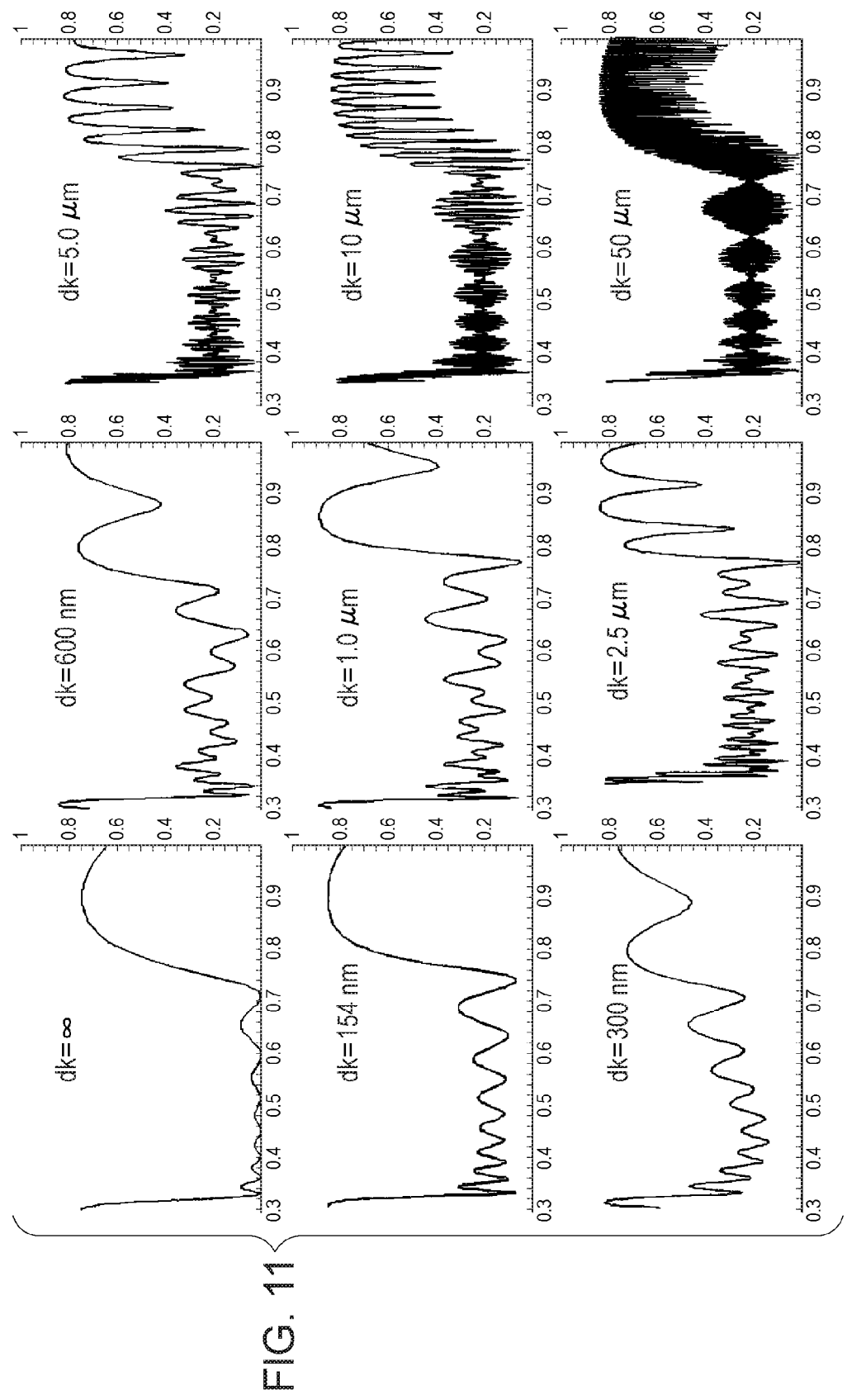
FIG. 11 is a reflection spectrum atlas illustrating a spectral image sensor corresponding to single-wavelength spectral separation using a stacked film according to the first embodiment of the invention.

FIG. 11 is a spectrum atlas illustrating the dependency of the total reflected light $LR_{total}$ on variations of the thickness dk of the dielectric layer 1_$k$ including a silicon oxide $SiO_2$ layer. FIG. 11 shows the results of calculation with changes in the thickness dk of the dielectric layer 1_$k$ in the dielectric stacked film 1 having the seven-layer structure shown in FIG. 4. In each spectrum of FIG. 11, the wavelength (μm) is shown as abscissa, and reflectance R is shown as ordinate.

The spectra of FIG. 11 indicate that when the thickness dk is 0.154 μm, i.e., when the thickness satisfies conditional equation (1) for the reflection center wavelength $\lambda 0$ of infrared light IR, the reflection spectrum is little affected, and infrared light IR (wavelength $\lambda \geq 780$ nm) is strongly reflected. In contrast, when the thickness dk is 0.3 to 50 μm, other vibrations occur in comparison to the refection spectrum with the thickness dk=∞. It is thus found that there is a wavelength region in which reflection of infrared light is decreased in a dip form.

However, when the thickness dk is 2.5 μm or more, the half-width of each dip in infrared reflection is 30 nm or less, and particularly when the thickness dk is 5.0 μm or more, the half-width is 20 nm or less. As a result, a half-width of general broad natural light is sufficiently decreased to produce averaged reflectance. Furthermore, the spectra with the thickness dk of 0.3 to 1.0 μm show that reflectance of visible light VL is high. It is said from these results that the optimum thickness dk is preferably near 0.154 μm, i.e., a value satisfying conditional equation (1).

Figure 12:
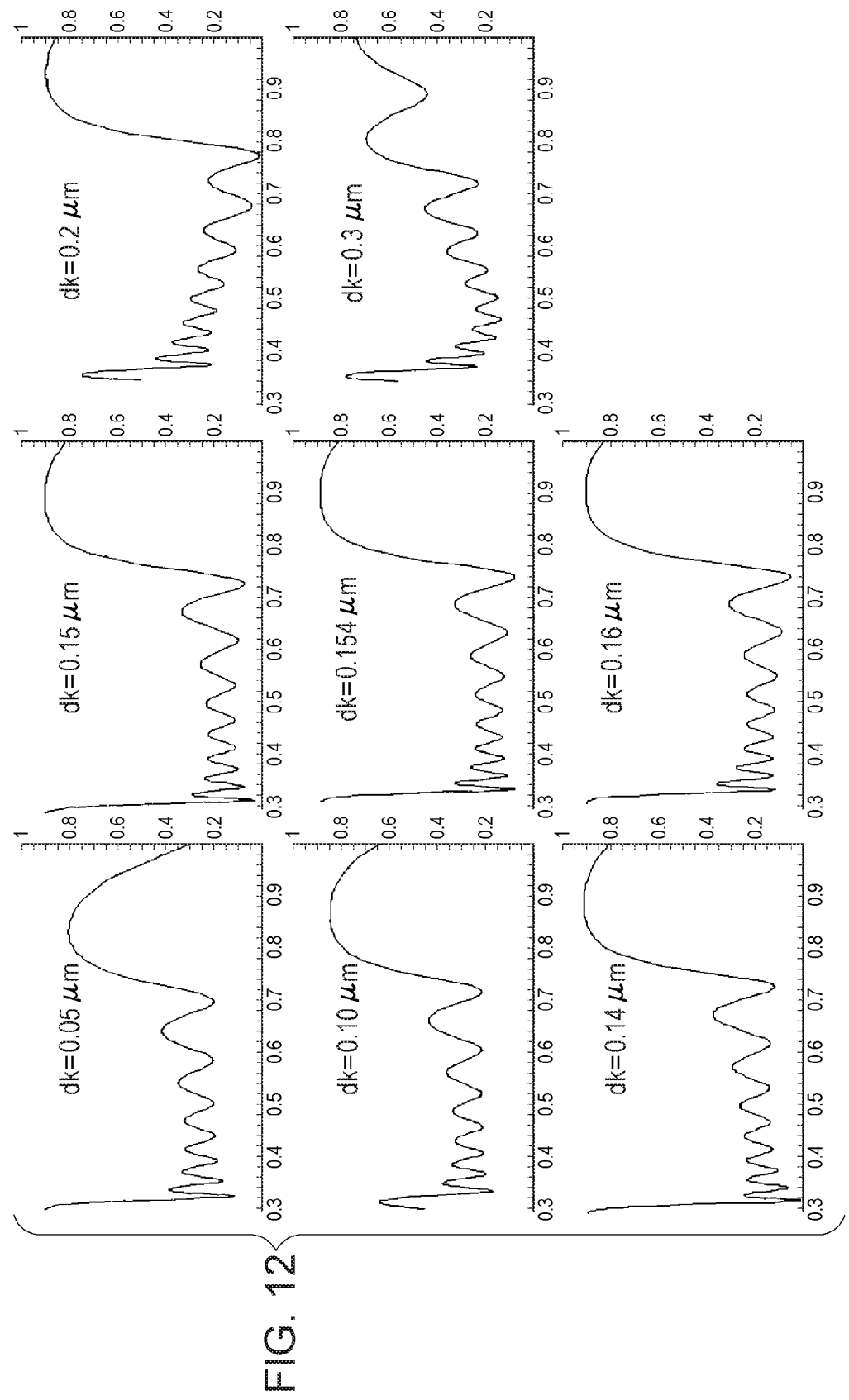
FIG. 12 is a reflection spectrum atlas (detailed reflection spectrum atlas) illustrating a spectral image sensor corresponding to single-wavelength spectral separation using a stacked film according to the first embodiment of the invention.

FIG. 12 is a spectrum atlas illustrating the dependency on variations in the thickness dk of the dielectric layer 1_$k$ including a silicon oxide $SiO_2$ layer. In particular, FIG. 12 shows the results with changes of the thickness dk within a range near the thickness dk of 0.154 μm. In each spectrum of FIG. 12, the wavelength (μm) is shown as abscissa, and reflectance R is shown as ordinate.

The results indicate that within a range of the thickness dk of 0.14 to 0.16 μm with the thickness dk of 0.154 μm as a center which satisfies conditional equation (1), reflection of visible light VL is suppressed.

Figure 13:
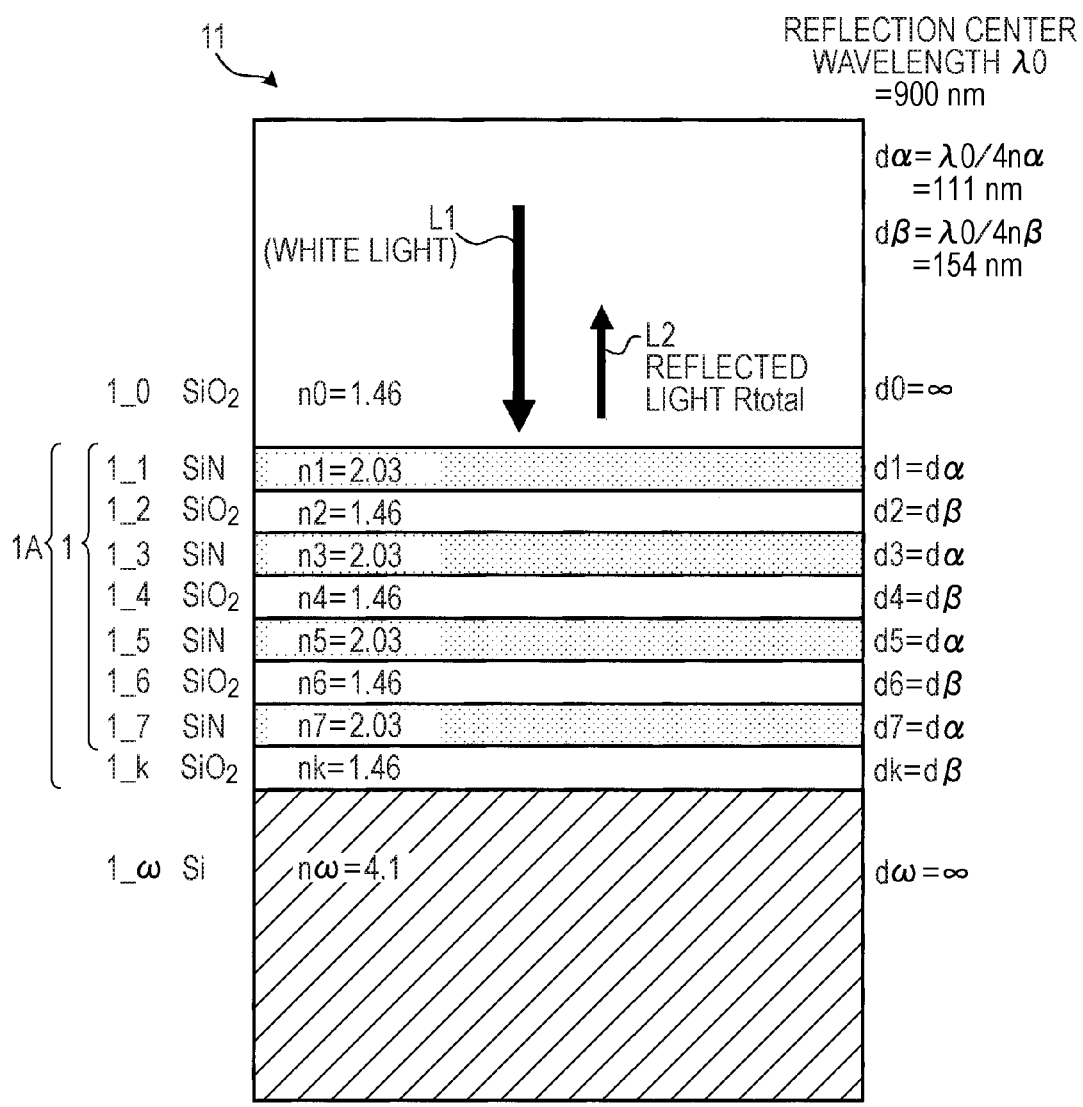
FIG. 13 is a structural drawing illustrating a spectral image sensor corresponding to single-wavelength spectral separation using a stacked film according to the first embodiment of the invention.
Figure 14:
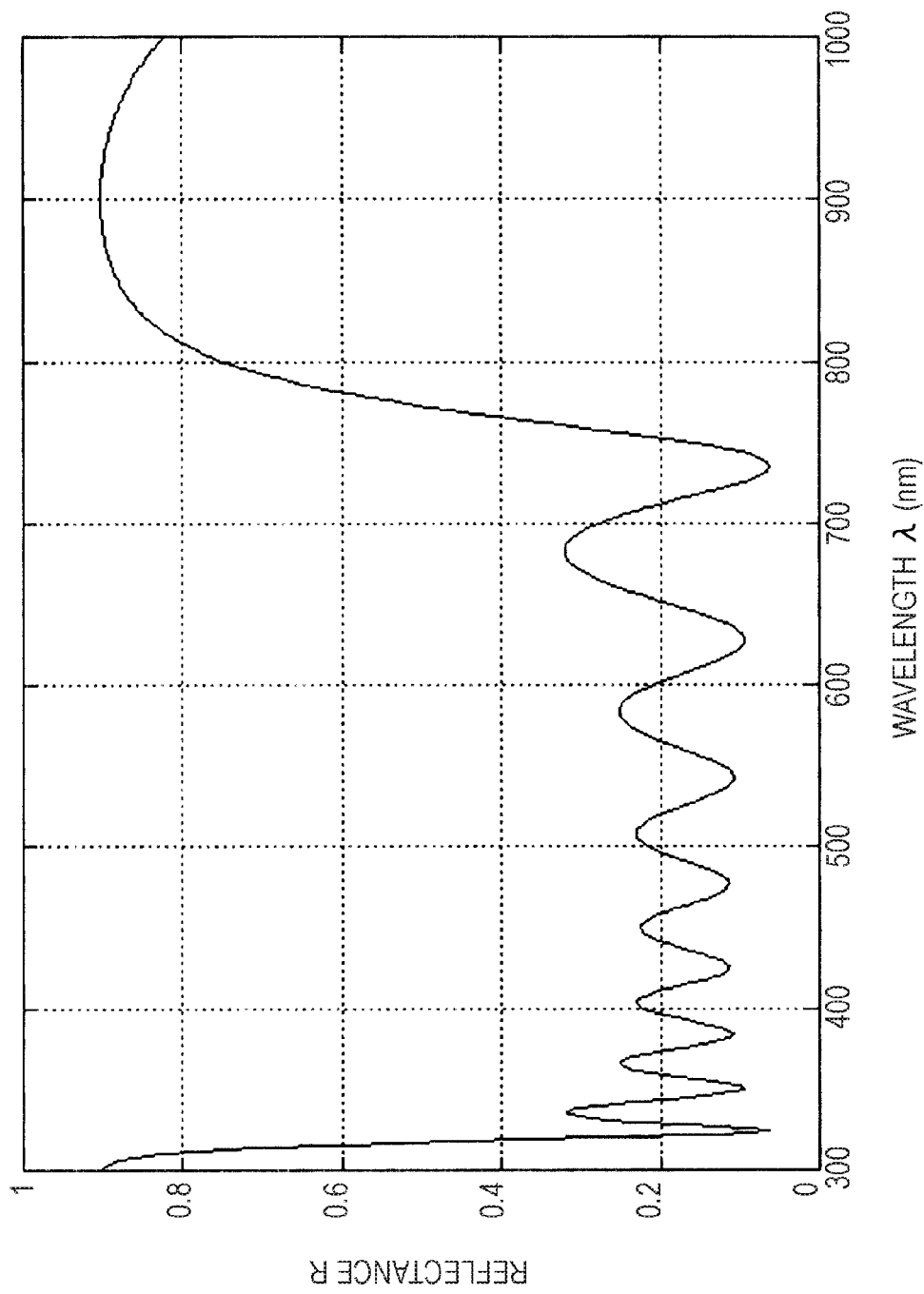
FIG. 14 is a reflection spectrum atlas illustrating a spectral image sensor corresponding to single-wavelength spectral separation using a stacked film according to the first embodiment of the invention.

Therefore, the optimum structure of the spectral image sensor 11 substantially includes a dielectric staked film 1A having eight layers including the kth dielectric layer 1_$k$, as shown by a structural drawing of FIG. 13. FIG. 14 is a spectrum atlas showing the calculation results of the reflection spectrum of the dielectric stacked film 1A. In other words, the dielectric stacked film 1A provided on a silicon substrate 1_$\omega$ has a structure including silicon oxide $SiO_2$ layers which are second material layers and provided in four cycles.

Spectral Image Sensor Using Dielectric Stacked Film

Second Embodiment

FIGS. 15 to 18 are drawings illustrating a spectral image sensor corresponding to single wavelength spectral separation using a dielectric stacked film 1 according to a second embodiment. The second embodiment uses a first modified example of the designing method of the first embodiment. On the basis of the method described above with reference to FIGS. 10 to 14, modification is made so as to decrease reflection in the visible light region.

In the first modified example, a third material layer is inserted between the kth dielectric layer 1_$k$ and a silicon substrate 1_$\omega$, the third material layer having an intermediate refractive index between the refractive index nk of the kth dielectric layer 1_$k$ and the refractive index n$\omega$ (=4.1) of the silicon substrate 1_$\omega$.

Also, in accordance with the modification, in designing the constants of the first to seventh layers of the dielectric stacked film 1, the reflection center wavelength $\lambda 0$ of infrared light IR is changed from 900 nm to a lower wavelength, for example, 852 nm, the thickness d$\alpha$ (=d1, d3, . . . ; j=odd number) of silicon nitride SiN is 105 nm, and the thickness d$\beta$ (=d2, d4, . . . ; j=even number) of silicon oxide $SiO_2$ is 146 nm. This is because a thin SiN layer (30 nm) is newly inserted to decrease the reflectance of visible light, and, at the same time, decrease the reflectance near the boundary at 780 nm between visible light and infrared light. Therefore, the entirety is shifted to a lower wavelength side to compensate for these decreases in reflectance, and the cut efficiency of infrared light near the boundary is improved. Of course, the reflection center wavelength $\lambda 0$ of infrared light IR may be kept at 900 nm.

Figure 15:
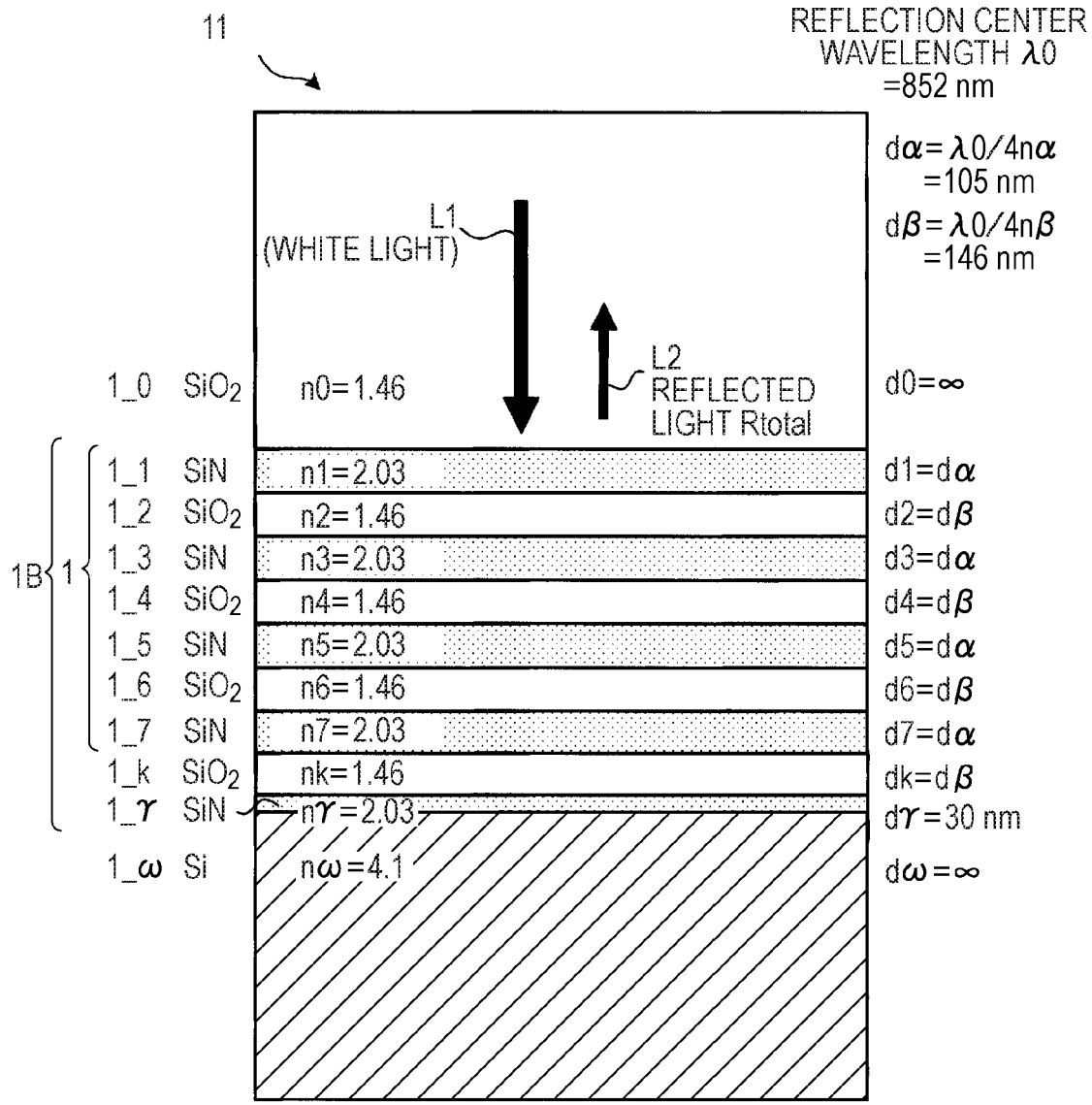
FIG. 15 is a structural drawing illustrating a spectral image sensor corresponding to single-wavelength spectral separation using a stacked film according to a second embodiment of the invention.
Figure 16:
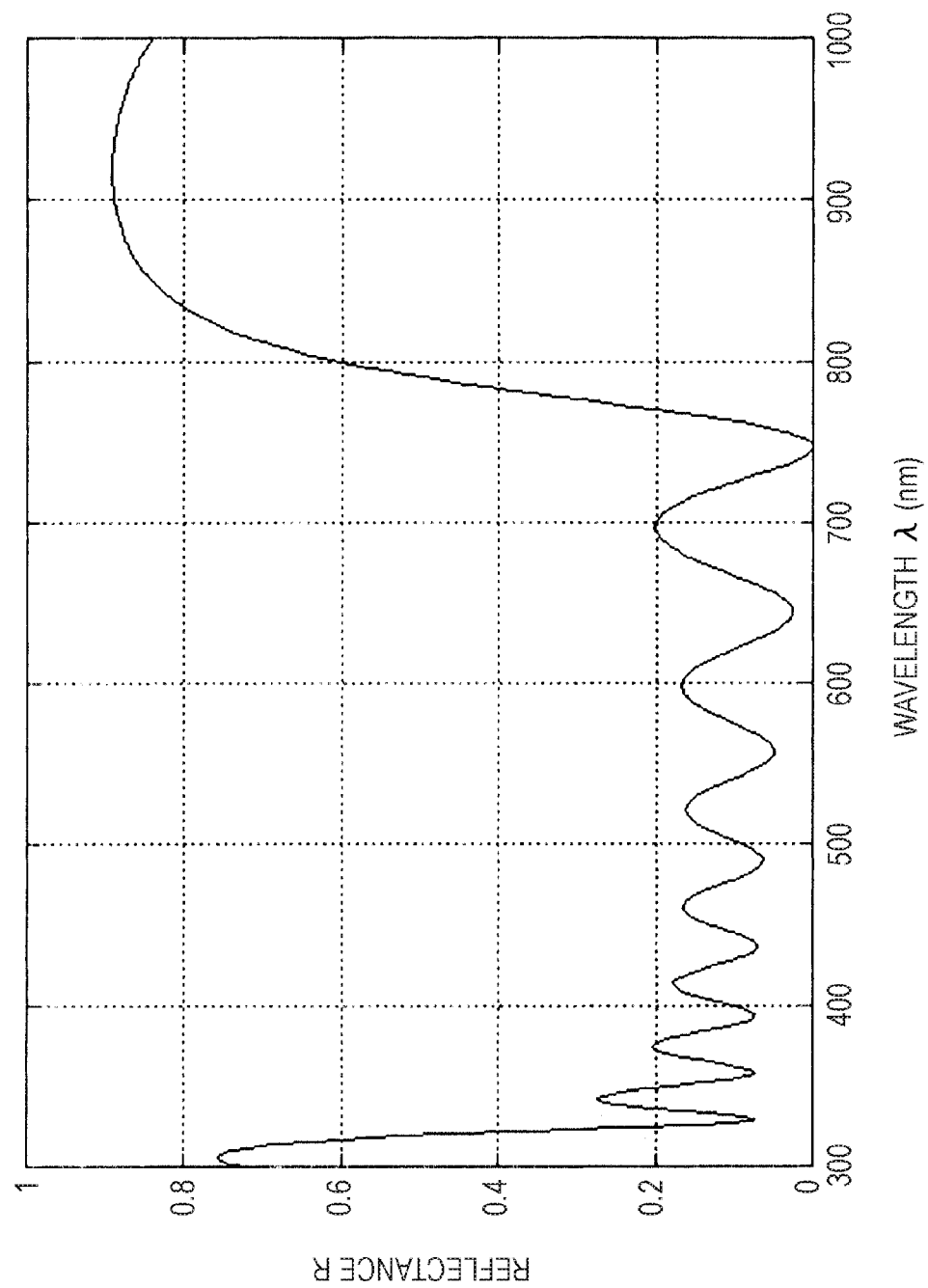
FIG. 16 is a reflection spectrum atlas illustrating a spectral image sensor corresponding to single-wavelength spectral separation using a stacked film according to the second embodiment of the invention.

Specifically, in the structure of the first modified example shown in FIG. 15, a silicon nitride SiN thin layer 1_$\gamma$ having a relatively small thickness d$\gamma$ is inserted as the third layer material between the kth layer of silicon oxide $SiO_2$ and the silicon substrate 1_$\omega$. In this example, the thickness d$\gamma$ is 0.030 μm. FIG. 16 shows the results of calculation of the reflection spectrum.

In the first modified example, the third layer material incorporated is the same as the first layer material, silicon nitride SiN. However, any other member having a higher refractive index than that of the silicon substrate 1_$\omega$ may be used.

The spectral image sensor 11 having the dielectric stacked film 1 of the first modified example substantially includes a dielectric stacked film 1B having a nine-layer structure including the seven layers of the dielectric stacked film 1, the kth dielectric layer 1_$k$ (silicon oxide $SiO_2$ layer), and the silicon nitride SiN layer 1_$\gamma$ as a whole.

Figure 17:
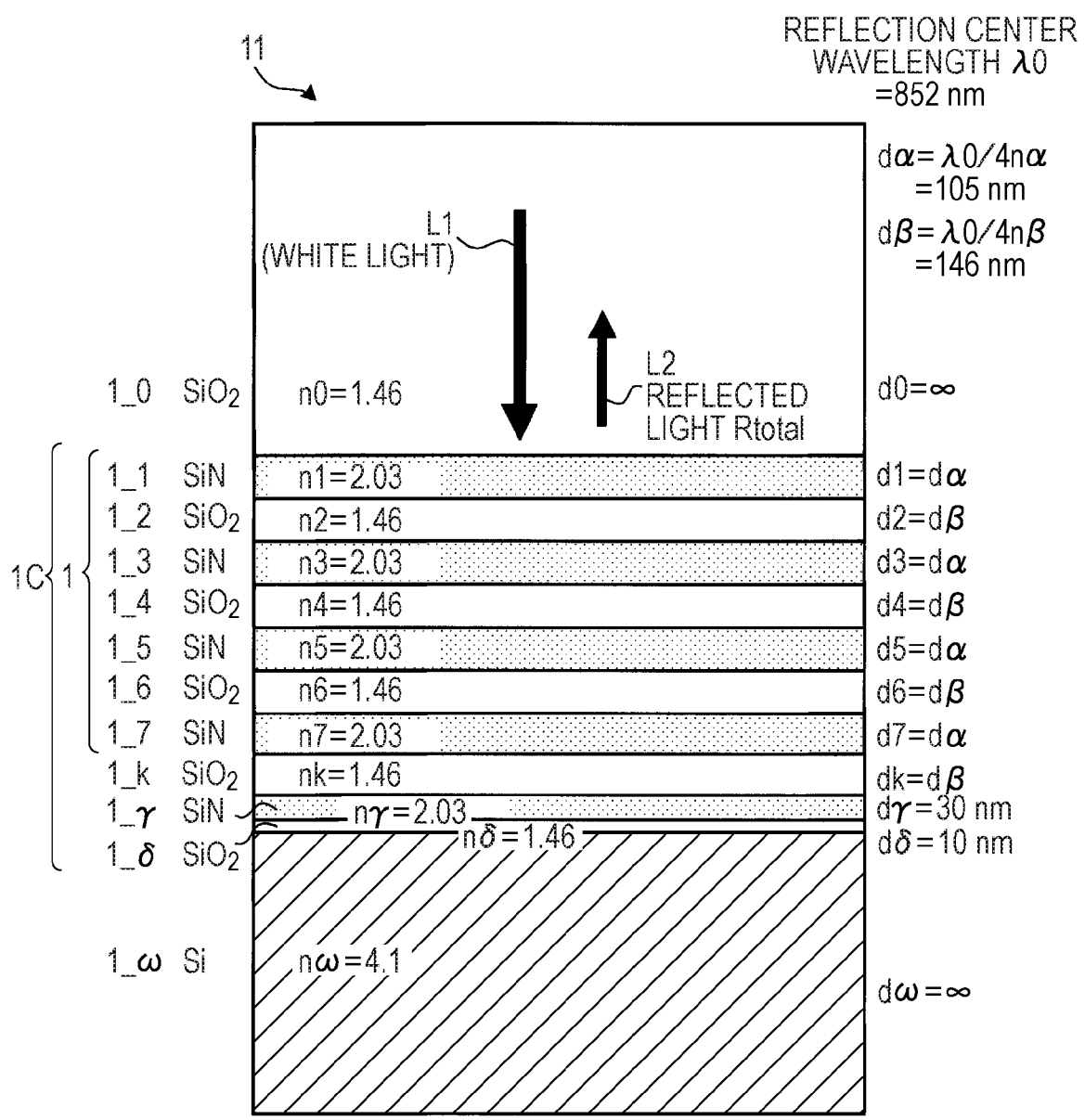
FIG. 17 is a structural drawing illustrating a spectral image sensor corresponding to single-wavelength spectral separation using a stacked film according to the second embodiment of the invention.
Figure 18:
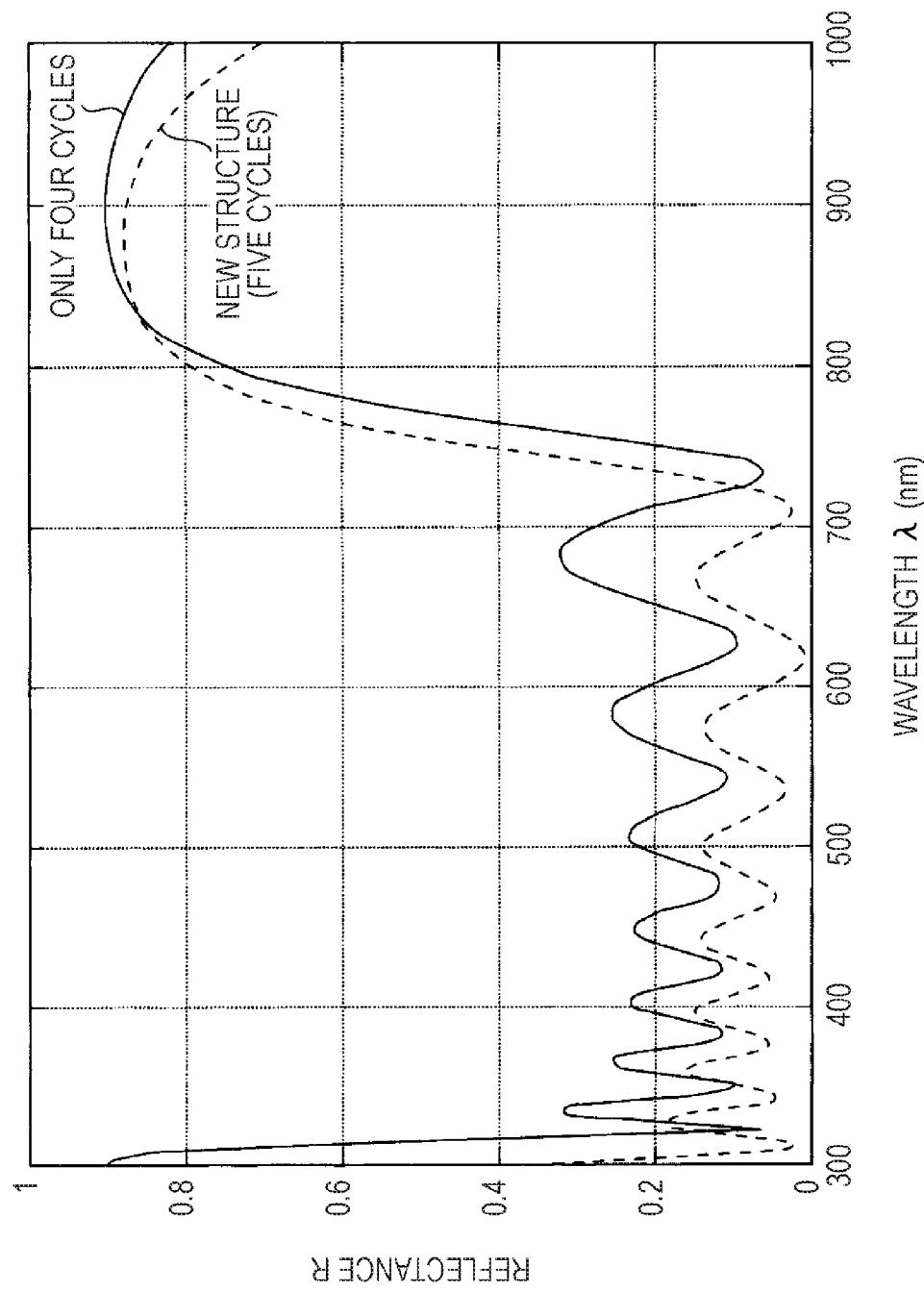
FIG. 18 is a reflection spectrum atlas illustrating a spectral image sensor corresponding to single-wavelength spectral separation using a stacked film according to the second embodiment of the invention.

Furthermore, in the structure of a second modified example shown in FIG. 17, a fourth layer material having a lower refractive index than that of the third layer material is inserted between the third layer material inserted in the first modified example and the silicon substrate 1_$\omega$. Specifically, a silicon oxide $SiO_2$ layer 1_$\delta$ is inserted as the fourth layer material between the silicon nitride SiN layer 1_$\gamma$ as the third layer material having the thickness d$\gamma$ and the silicon substrate 1_$\omega$. The thickness d$\delta$ of the fourth layer material is 0.010 μm. FIG. 18 shows the result of calculation of the reflection spectrum.

In the second modified example, the fourth layer material incorporated is the same as the second layer material, silicon oxide $SiO_2$. However, any other member having a lower refractive index than that of the third layer material (in this example, silicon nitride SiN) may be used.

The spectral image sensor 11 of the second modified example substantially includes a dielectric stacked film 1C having a ten-layer structure including the seven layers of the dielectric stacked film 1, the kth dielectric layer 1_k (silicon oxide $SiO_2$ layer), the silicon nitride SiN layer 1_γ, and the silicon oxide $SiO_2$ layer 1_δ as a whole. In other words, the dielectric stacked film 1C has a structure in which the second layer material, silicon oxide $SiO_2$, is provided in five cycles on the silicon substrate 1_ω.

The first and second examples are different in the presence of the silicon oxide $SiO_2$ layer 1_δ, but FIGS. 16 and 18 indicate that in both examples, the reflectance of visible light VL is sufficiently decreased. Also, as in the second example, the effect of decreasing the dark current by adding the silicon oxide $SiO_2$ layer 1_δ is obtained. The relation between the thicknesses of both layers is preferably dδ<<dγ so as not to decrease the effect of addition of the silicon nitride SiN layer 1_γ due to the addition of the silicon oxide $SiO_2$ layer 1_δ.

In this way, when the silicon nitride SiN thin layer 1_γ is added as an intermediate layer between the kth silicon oxide $SiO_2$ layer and the silicon substrate 1_ω, the intermediate layer including a member having an intermediate refractive index nγ (=nSiN) between the refractive index nk (=$nSiO_2$) and the reflective index nω (=nSi), reflection of visible light VL may be suppressed. This is understood by the following thought.

First, assuming that the wavelength of visible light VL is λVL, the intermediate refractive index is Nm, and the thickness of the intermediate layer is dm, conditional equation (4) is obtained from the same theory of a low-reflection film as equation (1). When equation (4) is satisfied, a satisfactory effect is exhibited.

Equation 4

$$dm = \lambda VL / (4 \times Nm) \quad (4)$$

wherein wavelength λVL indicates the whole of visible light VL, and thus the wavelength region is given by the following equation (5):

Equation 5

$$380 \text{ nm} \leq \lambda VL \leq 780 \text{ nm} \quad (5)$$

In each of the first and second examples, the silicon nitride SiN layer 1_γ is added as an intermediate layer and has a reflective index nγ (=nSiN=Nm). Therefore, equation (5) indicating the wavelength region is changed to equation (6) indicating the thickness dm of the intermediate layer, i.e., the thickness dγ of the silicon nitride SiN layer 1_γ.

Equation 6

$$47 \text{ nm} \leq dm \leq 96 \text{ nm} \quad (6)$$

$$47 \text{ nm} \leq d\gamma \leq 96 \text{ nm} \quad (6)$$

Although the thickness dm of the intermediate layer is ideally satisfies equation (6), the thickness dm may slightly deviate therefrom. According to experiments, a smaller thickness dm has an allowance. FIGS. 16 and 18 confirm that for example, when the thickness dm is 30 nm, an effect is exhibited. Of course, since the intermediate layer (third layer material) is inserted between the kth layer of silicon oxide $SiO_2$ and the silicon substrate 1_ω, the lower limit of the thickness of the intermediate layer is larger than 0 nm (excluding 0 nm). Namely, when the intermediate layer is inserted between the kth layer of silicon oxide $SiO_2$ and the silicon substrate 1_ω, the thicknesses dm and dγ of the intermediate layers preferably satisfy equation (7).

Equation (7)

$$0 \text{ nm} \leq dm \leq 96 \text{ nm} \quad (7)$$

$$0 \text{ nm} \leq d\gamma \leq 96 \text{ nm} \quad (7)$$

Spectral Image Sensor Using Dielectric Stacked Film

Third Embodiment

Figure 21:
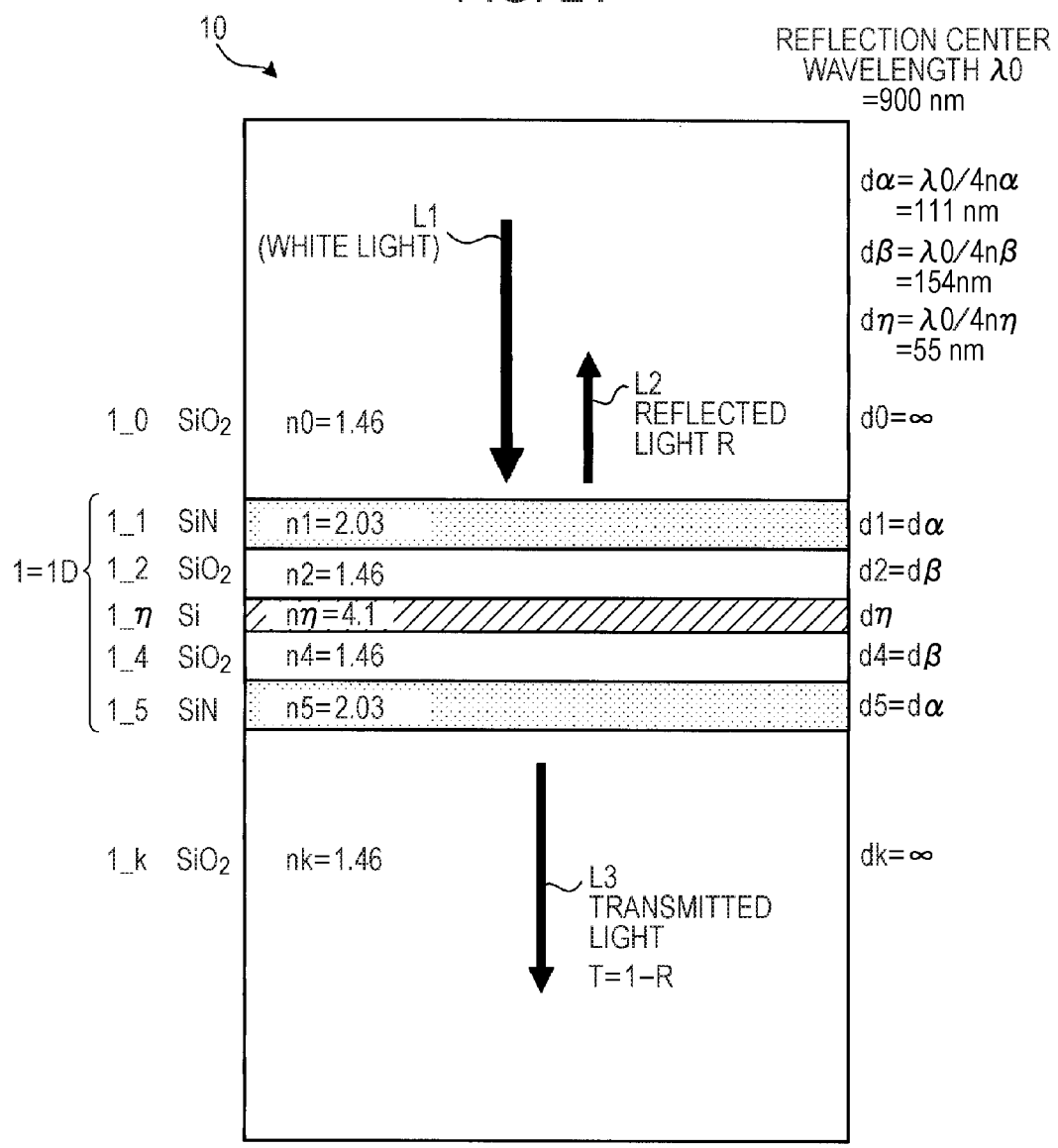
FIG. 21 is a structural drawing illustrating a spectral image sensor corresponding to single-wavelength spectral separation using a stacked film according to the third embodiment of the invention.
Figure 22:
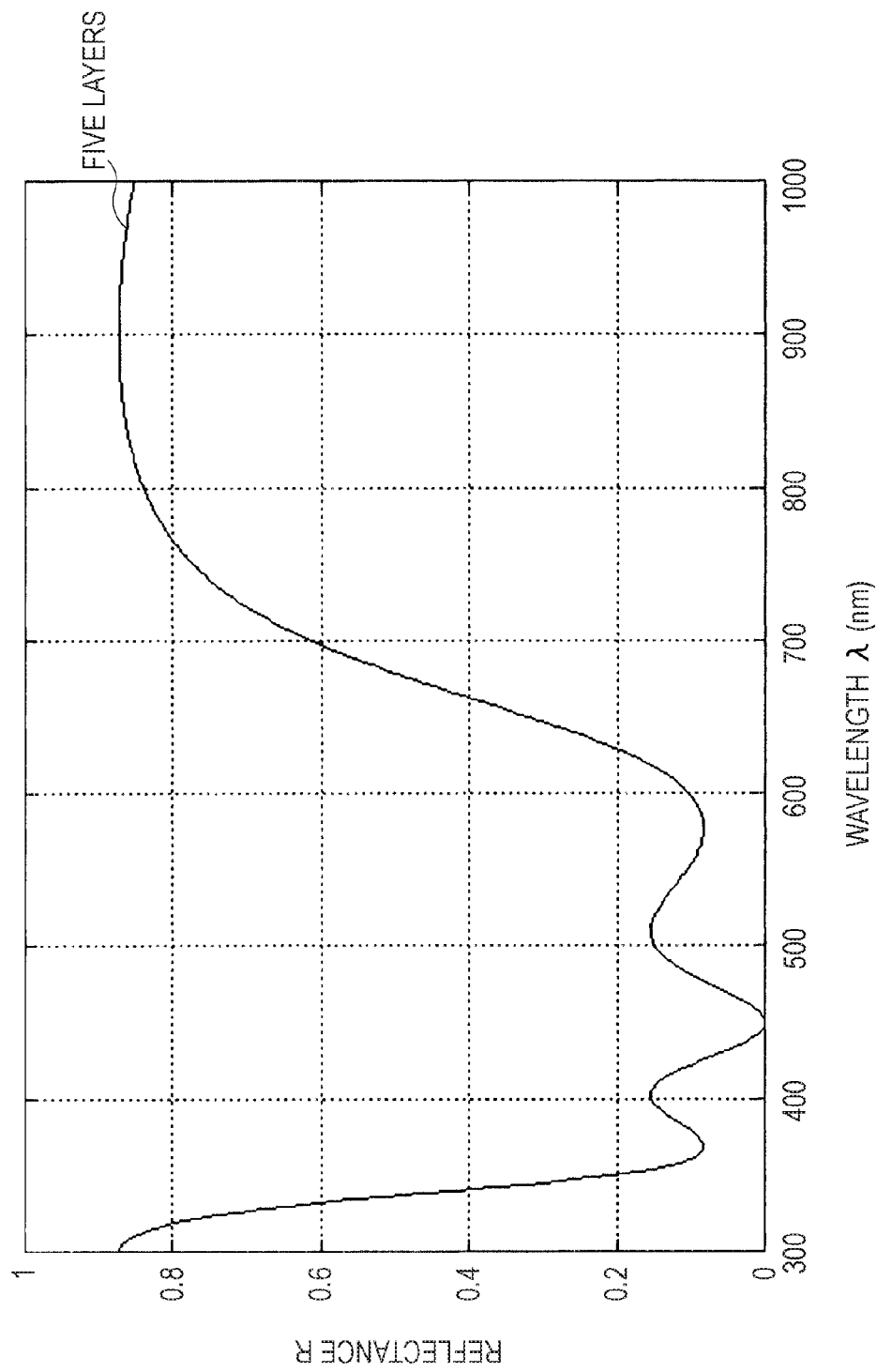
FIG. 22 is a reflection spectrum atlas illustrating a spectral image sensor corresponding to single-wavelength spectral separation using a stacked film according to the third embodiment of the invention.
Figure 23:
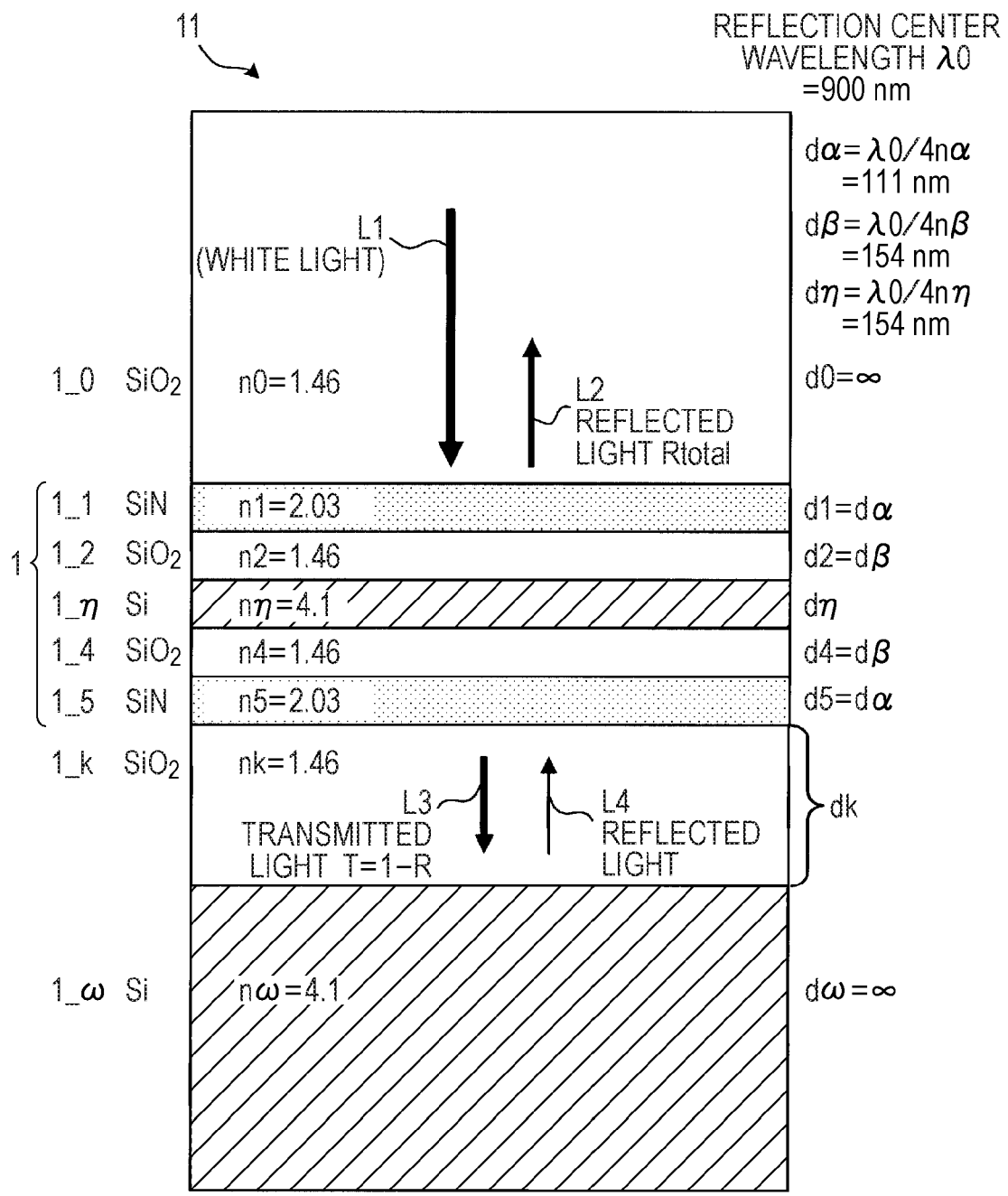
FIG. 23 is a structural drawing illustrating a spectral image sensor corresponding to single-wavelength spectral separation using a stacked film according to the third embodiment of the invention.
Figure 24:
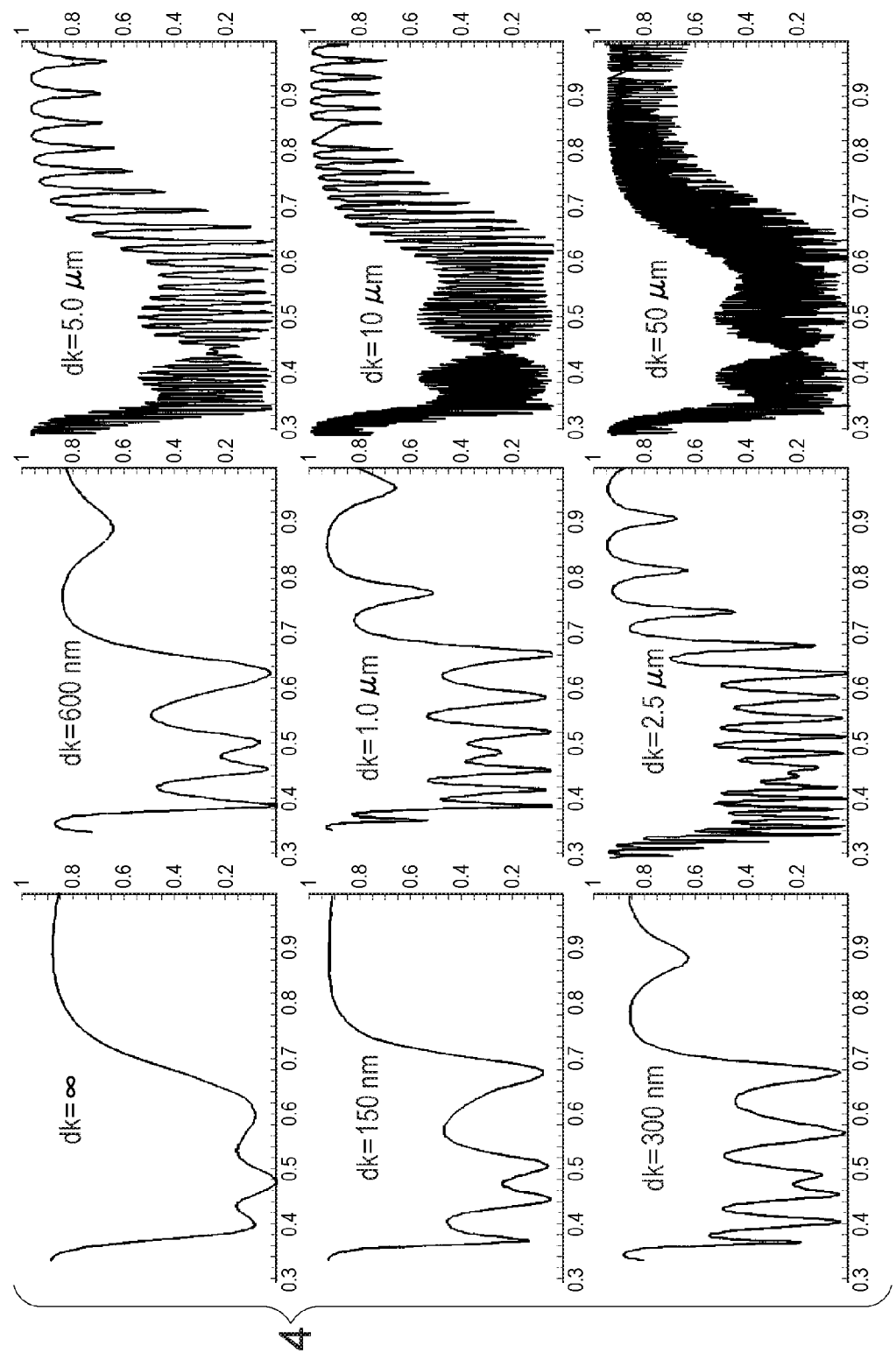
FIG. 24 is a reflection spectrum atlas illustrating a spectral image sensor corresponding to single-wavelength spectral separation using a stacked film according to the third embodiment of the invention.

FIGS. 19 to 24 are drawings illustrating a spectral filter 10 and a spectral image sensor 11 corresponding to single wavelength spectral separation using a dielectric stacked film 1 according to a third embodiment. FIGS. 19 to 22 are drawings illustrating the dielectric stacked film 1 constituting the spectral filter 10 according to the third embodiment, and FIGS. 23 and 24 are drawings illustrating the spectral image sensor corresponding to single wavelength spectral separation using the dielectric stacked film 1 according to the third embodiment.

In the third embodiment, the second modified example of the design method of the first embodiment is used, and the number of dielectric layers 1_j of the dielectric stacked layer 1 is decreased. In order to decrease the number of the dielectric layers, a member (layer material) having a higher refractive index than those of the first and second basic layer materials which constitute the dielectric stacked film 1 is added.

In order to add the member having a higher refractive index, one of the two basic layer materials, which has a higher refractive index, may be replaced by a fifth layer material having a more higher refractive index. The dielectric stacked film 1 of the second modified example becomes a dielectric stacked film ID substantially including a fifth layer material 1_η. In other words, the dielectric stacked film ID has a structure in which the second layer material, silicon oxide SiO2, is provided in N cycles on the silicon substrate 1_ω.

With respect to the thickness dη of the fifth layer material, on the assumption that the refractive index of the fifth layer materials is nη, equation (8) is obtained from the same theory of a low-reflection film as equation (1). When equation (8) is satisfied, a satisfactory effect is exhibited.

Equation (8)

$$d\eta = \lambda 0/(4n\eta) \quad (8)$$

Figure 19:
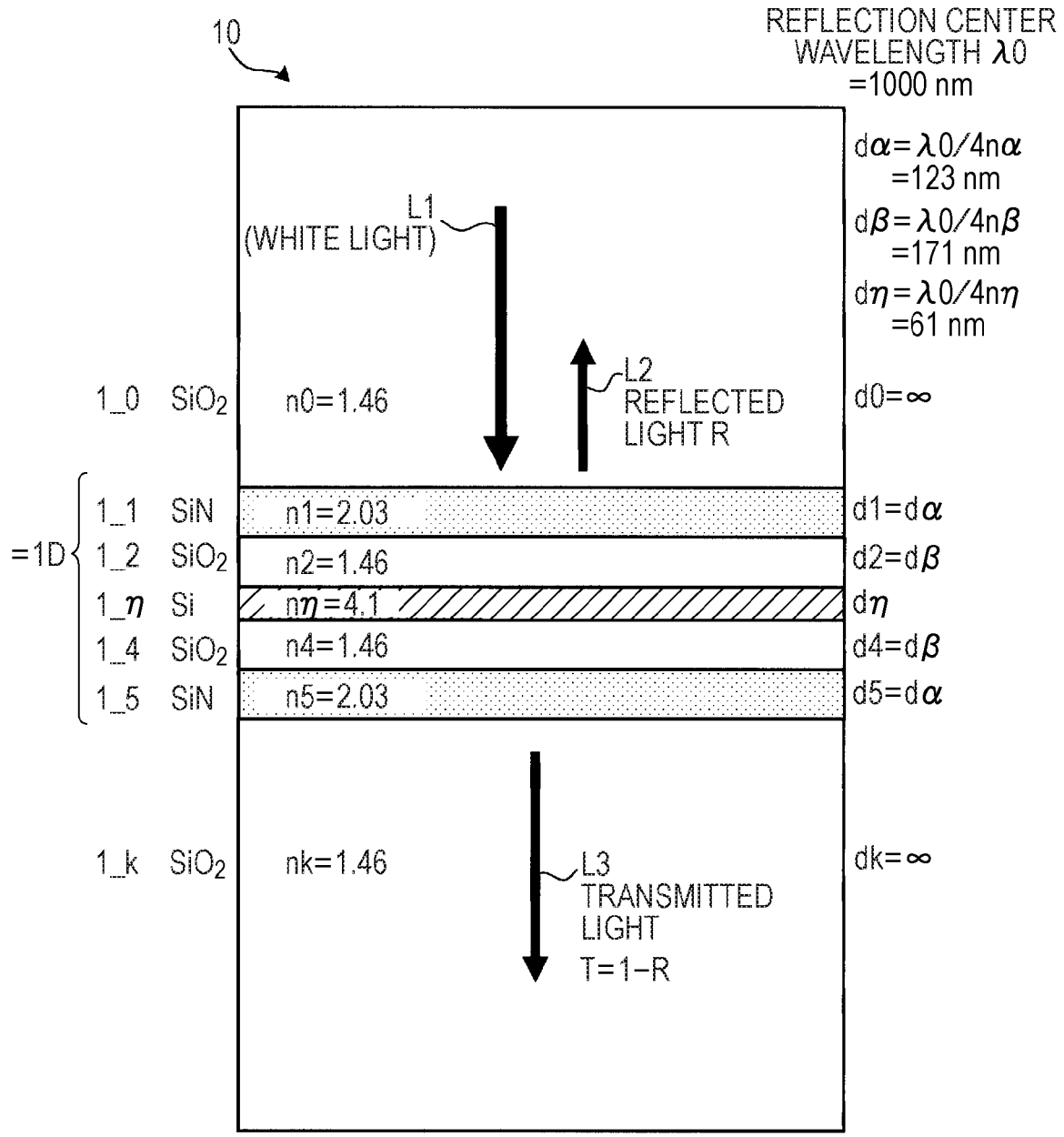
FIG. 19 is a structural drawing illustrating a spectral image sensor corresponding to single-wavelength spectral separation using a stacked film according to a third embodiment of the invention.

For example, in an example shown by a structural diagram of FIG. 19, a silicon Si layer having a thickness dη of 61 nm and a refractive index of 4.1 higher than those of silicon nitride SiN and silicon oxide $SiO_2$ is added as the fifth layer material in place of one layer of silicon nitride SiN (the third dielectric layer 1_3). The results of calculation of the reflection spectrum are as shown in FIG. 20.

Figure 20:
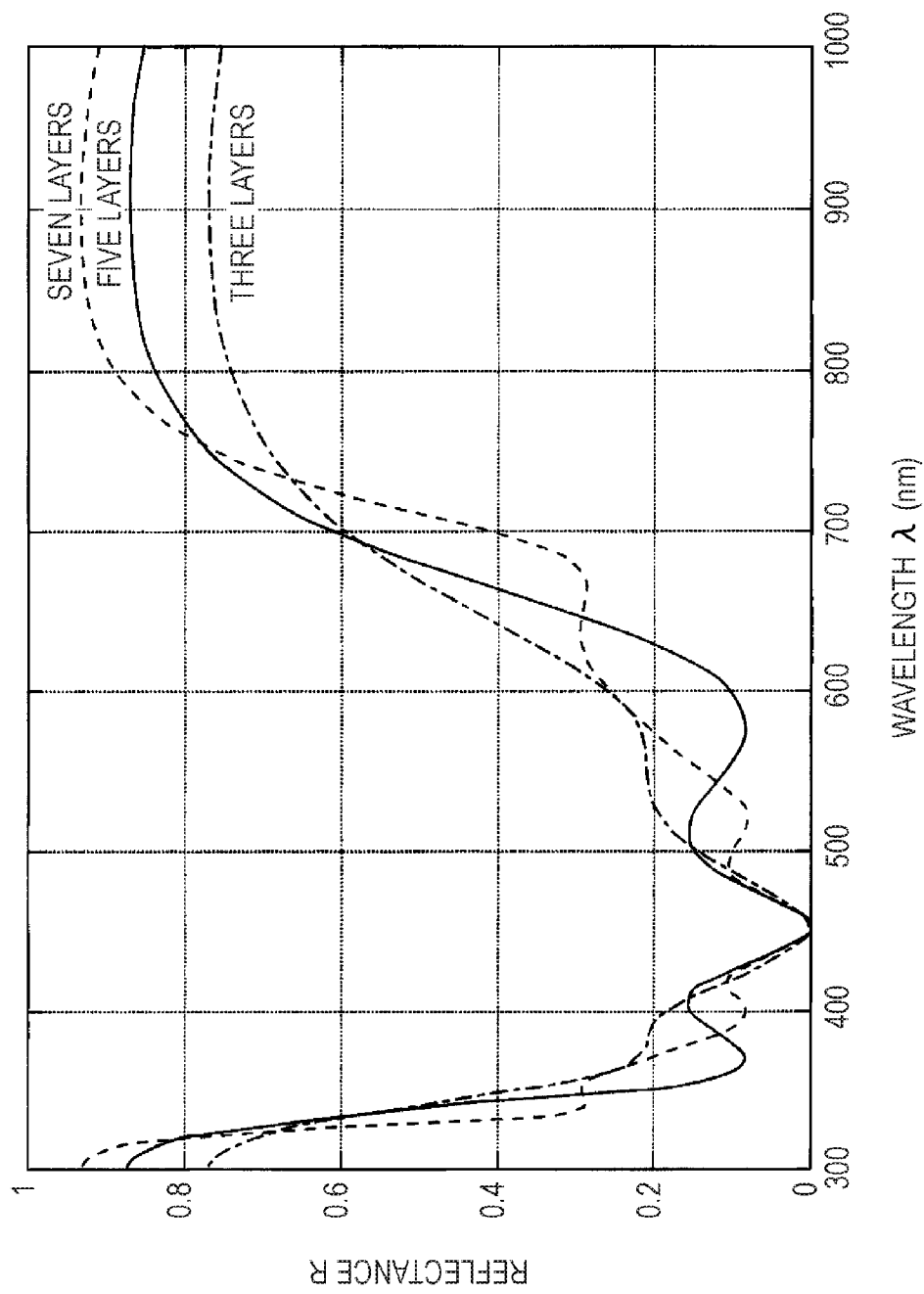
FIG. 20 is a reflection spectrum atlas illustrating a spectral image sensor corresponding to single-wavelength spectral separation using a stacked film according to the third embodiment of the invention.

FIG. 20 shows the results of calculation with changes in the total number of layers when a silicon nitride SiN layer at the center of the dielectric stacked film 1 having an odd total number of layers is replaced by a silicon Si layer.

In FIG. 19, in designing the constants of the respective layers of the dielectric stacked film 1, the reflection center wavelength λ0 of infrared light IR is changed from 900 nm to 1000 nm, the thickness dα (=d1, d3, . . . ; j=odd number) of silicon nitride SiN is 123 nm, and the thickness dβ (=d2, d4, . . . ; j=even number) of silicon oxide $SiO_2$ is 171 nm.

In an example shown in a structural drawing of FIG. 21, in designing the constants of the respective layers of the dielectric stacked film 1, the reflection center wavelength λ0 of infrared light IR is 900 nm, the thickness dα (=d1, d3, . . . ; j=odd number) of silicon nitride SiN is 111 nm, and the thickness dβ (=d2, d4, . . . ; j=even number) of silicon oxide $SiO_2$ is 154 nm. Also, the silicon Si layer having a thickness dη of 55 nm is added as the fifth layer material in place of one layer of silicon nitride SiN. The results of calculation of the reflection spectrum are as shown in FIG. 22.

The fifth layer material added to the second modified example is the same as the silicon substrate 1_ω constituting the semiconductor element layer. However, any other member having a higher refractive index than those of the other dielectric layers 1_j constituting the dielectric stacked film 1.

The calculation results of the reflection spectra shown in FIGS. 20 and 22 indicate that even with a small number of dielectric layers, sufficient reflectance is obtained by adding a layer material having a higher refractive index than those of the dielectric layers 1_j other than the fifth layer material in the dielectric stacked film 1. In particular, a five-layer structure is optimum for separating between visible light VL and infrared light IR because of the wide band width of visible light VL.

As described above in the first embodiment with reference to FIGS. 10 to 12, in order to form the dielectric stacked film ID on the semiconductor element layer (silicon substrate 1_ω), the distance between the semiconductor element layer and the dielectric stacked film ID, i.e., the thickness dk of the kth dielectric layer 1_k of silicon oxide $SiO_2$, is important.

This means that the total reflected light $LR_{total}$ changes with the interference effect with reflected light LR from the surface of the silicon substrate 1_ω which is the surface of the semiconductor element layer (photodetector or the like) composed of, for example, silicon Si (refractive index 4.1), as shown in a structural diagram of FIG. 23.

FIG. 24 is a reflection spectrum atlas illustrating the dependency of the total reflected light $LR_{total}$ on variations of the thickness dk of the dielectric layer 1_k of silicon oxide $SiO_2$ in the dielectric stacked film ID having the five layer structure shown in FIG. 21. In each spectrum of FIG. 24, the wavelength λ (μm) is shown as abscissa, and reflectance R is shown as ordinate.

The spectrum of FIG. 24 indicate that when the thickness dk is 0.15 μm, i.e., when the thickness dk is near 0.154 nm satisfying conditional equation (1) for the reflection center wavelength λ0 of infrared light IR, the reflection spectrum is little affected, and infrared light IR (wavelength λ≧780 nm) is strongly reflected. In contrast, when the thickness dk is 0.3 to 50 μm, other vibrations occur in comparison to the refection spectrum with the thickness dk=∞. It is thus found that there is a wavelength region in which reflection of infrared light is decreased in a dip form. This is the same as described above in the first embodiment with reference to FIGS. 11 and 12.

Spectral Image Sensor Using Dielectric Stacked Film

Fourth Embodiment

Figure 25:
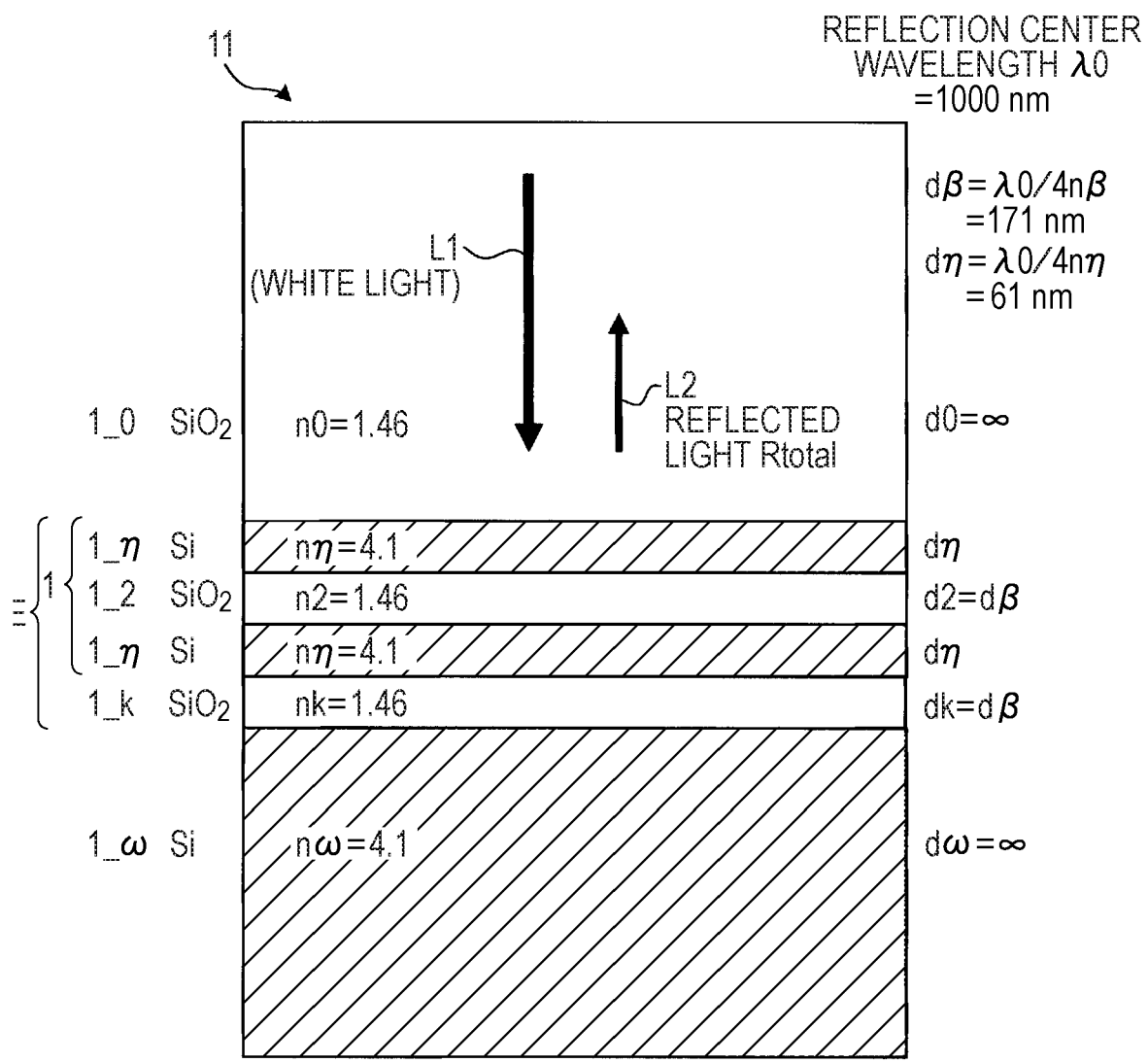
FIG. 25 is a structural drawing illustrating a spectral image sensor corresponding to single-wavelength spectral separation using a stacked film according to a fourth embodiment of the invention.
Figure 26:
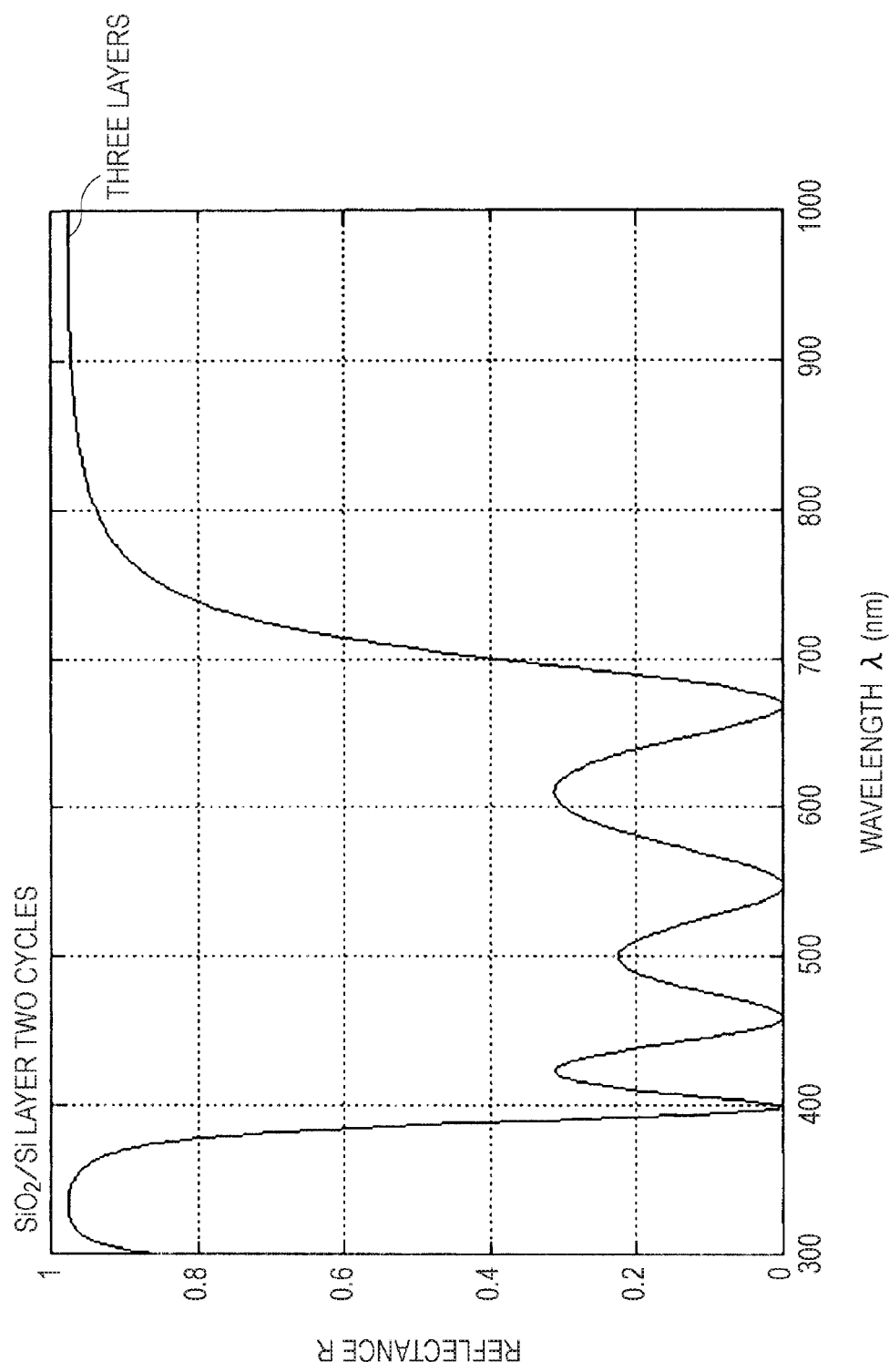
FIG. 26 is a reflection spectrum atlas illustrating a spectral image sensor corresponding to single-wavelength spectral separation using a stacked film according to the fourth embodiment of the invention.

FIGS. 25 and 26 are drawings illustrating a spectral image sensor 11 corresponding to single wavelength spectral separation using a dielectric stacked film 1 according to a fourth embodiment.

The fourth embodiment is a modified example of the third embodiment in which the number of the dielectric layers 1_j constituting the dielectric stacked film 1 is decreased. In the fourth embodiment, the number of the layers is further decreased. Specifically, in order to decrease the number of the layers, a plurality of members (layer materials) having higher refractive indexes than those of the first and second basic layer materials constituting the dielectric stacked film 1 is added. When a plurality of members having higher refractive indexes is added, one of the two basic layer materials, which as a higher refractive index, may be replaced by a fifth layer material having a higher refractive index. The dielectric stacked film 1 of this modified example is a dielectric stacked film 1E having a structure substantially including a plurality of fifth layer materials 1_η.

Like in the third embodiment, as the plurality of fifth layer materials 1_η, any members having higher refractive indexes than those of the other dielectric layers 1_j constituting the dielectric stacked film 1 serving as a base may be used. The plurality of fifth layer materials may be the same or different.

With respect to the thickness dηp of the fifth layer materials, on the assumption that the refractive index of the fifth layer materials is nηp, equation (9) is obtained from the same theory of a low-reflection film as equation (1). When equation (9) is satisfied, a satisfactory effect is exhibited.

Equation (9)

$$d\eta p = \lambda 0/(4n\eta p) \qquad (9)$$

For example, in the example shown in a structural drawing of FIG. 25, the dielectric stacked film 1E having a three-layer structure is formed, two silicon Si layers each having a thickness dη of 61 nm and a refractive index of 4.1 hither than those of silicon nitride SiN and silicon oxide $SiO_2$ are provided as the fifth layer material in place of silicon nitride. The results of calculation of the reflection spectrum are as shown in FIG. 26. In other words, the dielectric stacked film 1E has a structure in which a silicon oxide $SiO_2$ layer used as the second layer material is provided in two cycles on the silicon substrate 1_ω.

In designing the constants of each of the layers of the dielectric stacked film 1, the reflection center wavelength λ0 of infrared light IR is 1000 nm, the thickness of dη (=d1 and d3) of a silicon Si layer of the fifth layer material is 61 nm, and the thicknesses dβ (=d2) and dk of the two silicon oxide $SiO_2$ layers are 171 nm.

Spectral Image Sensor Using Dielectric Stacked Film

Fifth Embodiment

Figure 27:
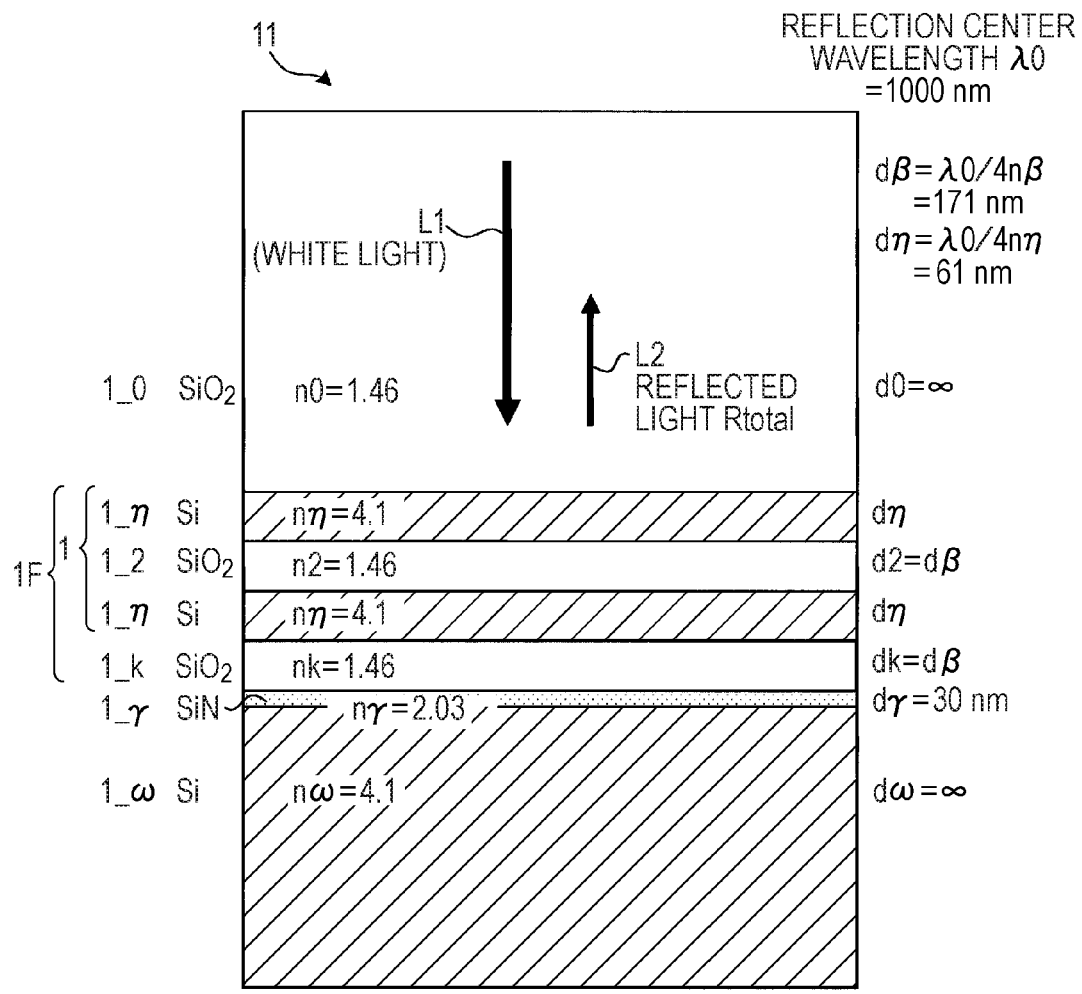
FIG. 27 is a structural drawing illustrating a spectral image sensor corresponding to single-wavelength spectral separation using a stacked film according to a fifth embodiment of the invention.

FIGS. 27 and 28 are drawings illustrating a spectral image sensor corresponding to single wavelength spectral 11 separation using a dielectric stacked film 1 according to a fifth embodiment.

Like in the second embodiment, in the fifth embodiment, the spectral image sensor 11 of the third or fourth embodiment is modified to decrease the reflection in the visible light region.

In the example shown in a structural drawing of FIG. 27, a third layer material is inserted between the kth dielectric layer 1_k and the silicon substrate 1_ω in the dielectric stacked film 1E of the fourth embodiment shown in FIG. 25, the third layer material having an intermediate refractive index between the refractive index nk of the kth dielectric layer 1_k and the refractive index nω (=4.1) of the silicon substrate 1_ω. Unlike in the second embodiment, in this embodiment, the reflection center wavelength λ0 of infrared light IR is kept at 1000 nm. Of course, like in the second embodiment, the reflection center wavelength λ0 of infrared light IR may be changed to a lower side, not 1000 nm.

Specifically, like in the first modified example in the second embodiment, in the structure shown in FIG. 27, a silicon nitride SiN layer 1_v having a relatively small thickness dv is deposited as a third layer material between the kth layer of silicon oxide $SiO_2$ and the silicon substrate 1_ω. The thickness dv is 0.030 µm. The results of calculation of the reflection spectrum are as shown in FIG. 28. The dielectric stacked film 1 in the spectral image sensor 11 of the modified example is a dielectric stacked film 1F having a five-layer structure substantially including the three layers of the dielectric stacked film 1, the kth dielectric layer 1_k (silicon oxide SiO2 layer), and the silicon nitride SiN layer 1_v as a whole.

The third layer material added in this modified example, is the same as the first layer material, silicon nitride SiN. However, any other member having a higher refractive index than that of the silicon substrate 1_ω may be used.

Although not shown in the drawings, like in the second modified example in the second embodiment, a fourth layer material having a lower refractive index than that of the third layer material may be inserted between the silicon substrate 1_ω and the third layer material inserted in this modified example.

In any cases, like in the second embodiment, reflectance in the visible light VL region may be decreased. In particular, the reflectances of a blue B component (wavelength near 420 nm) and a green G component (wavelength near 520 nm) are slightly increased, but the reflectance of a red R component (wavelength near 600 nm) is sufficiently decreased. Therefore, this example is suitable for separation from infrared light IR.

<Imaging Device Using Spectral Image Sensor: Corresponding to CCD>

Figure 29A:
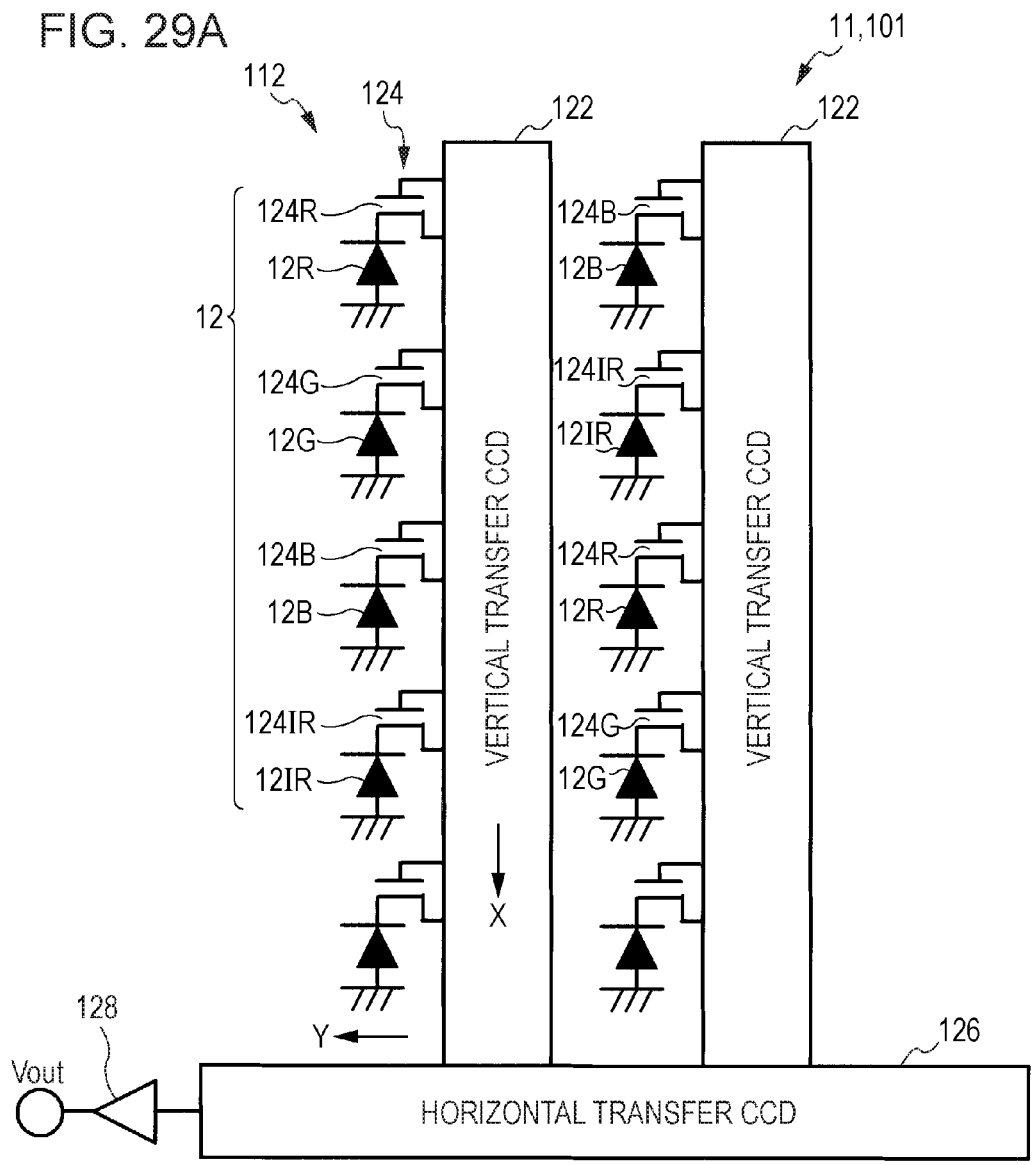
FIGS. 29A and 29B are drawings illustrating a circuit (corresponding to R, G, B, and infrared light IR) in the application of a stacked film to an IT_CCD image sensor.
Figure 29B:
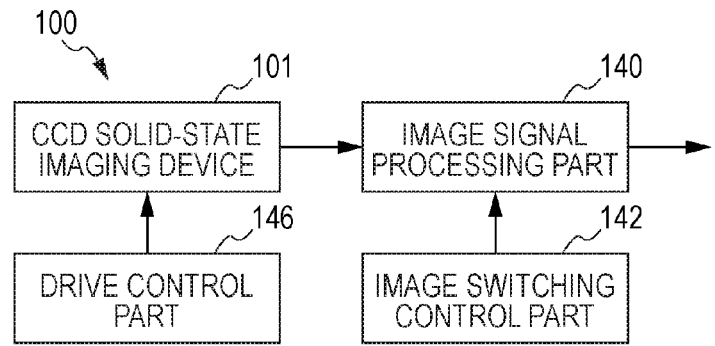
Figure 30:
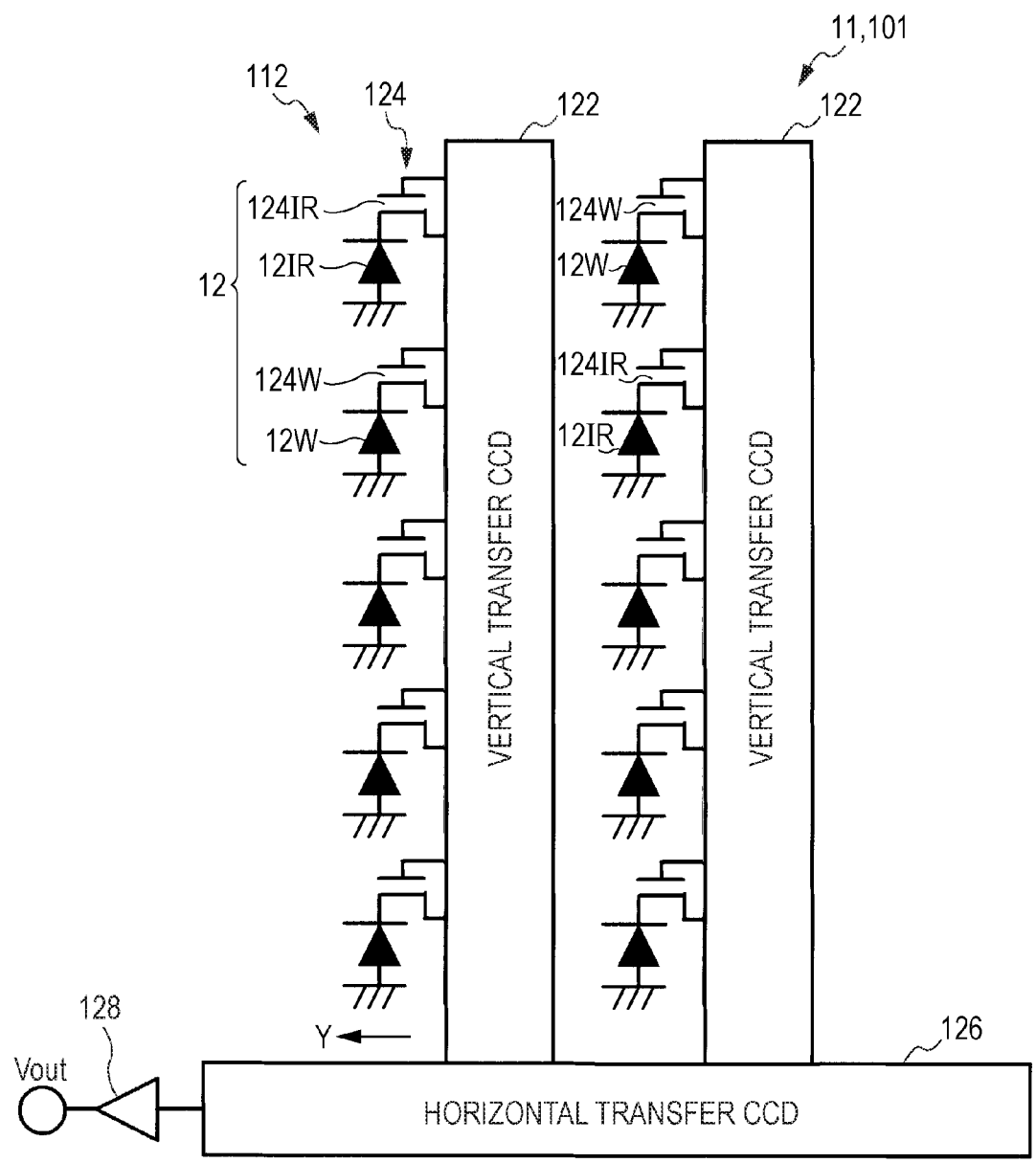
FIG. 30 is a drawing illustrating a circuit (corresponding to visible light VL and infrared light IR) in the application of a stacked film to an IT_CCD image sensor.

FIGS. 29A, 29B, and 30 are drawings of circuits in the application of the spectral image sensor 11 of any one of the above-described embodiments to an imaging device using an interline transfer-type CCD solid-state imaging device (IT_CCD image sensor). An imaging device 100 is an example of a physical information acquiring apparatus according to an embodiment of the invention.

In these drawings, reference numeral 11 denotes a spectral image sensor; reference numeral 12, a unit pixel matrix; reference numeral 100, an imaging device; reference numeral 101, a CCD solid-state imaging device; reference numeral 122, a vertical transfer CCD; reference numeral 124, a read gate; reference numeral 126, a horizontal transfer CCD; reference numeral 128, an output amplifier; reference numeral 140, an image signal processing part; reference numeral 142, an image switching control part; and reference numeral 146, a drive control part.

Like FIG. 3, FIGS. 29A and 29B show a structure for detecting infrared light IR while separating a visible light VL band into R, G, and B color components, blue light B, green light G, and red light R, in which visible light VL and infrared light IR are independently detected. The unit pixel matrix 12 has a structure substantially including pixels (photoelectric transducers) 12B, 12G, and 12R for respective wavelengths, and a pixel 12IR not having the dielectric stacked film 1.

For example, as shown in FIG. 29A, the CCD solid-state imaging device 101 includes a plurality of vertical transfer CCDs 122 provided in the vertical transfer direction in addition to the unit pixel matrix 12. The charge transfer direction of the vertical transfer CCDs 122, i.e., the read direction of image signals, coincides with the longitudinal direction (the X direction in FIG. 29A).

Furthermore, MOS transistors serving as read gates 124 (124B, 124G, 124R, and 124IR for respective wavelengths) are interposed between each vertical transfer CCD 122 and each unit pixel matrix 12, and a channel stop (not shown) is provided at the boundary of each unit cell (unit component).

As seen from FIG. 29A, one unit pixel matrix 12 has a structure for independently detecting blue light B, green light G, red light R, and infrared light IR, the structure substantially including the pixels 12B, 12G, 12R, and 12IR for respective wavelengths (colors). In an imaging area 110, a plurality of the vertical transfer CCDs 122 is provided for the respective columns, for vertically transferring signal charges read from sensor parts 112 by the read gates 124, the sensor parts 112 each including the unit pixel matrix 12.

In an arrangement of color filters 14, for example, the color filters 14 are disposed in the order of blue, green, red, IR, blue, green, red, IR, . . . in the longitudinal direction (X direction) of the vertical transfer CCDs 112 on the light-receiving surface of the silicon substrate 1_ω, and also in the order of blue, green, red, IR, blue, green, red, IR, . . . in the same direction (Y direction) with respect to the plurality of vertical transfer CCDs 122.

In each unit pixel matrix 12 (pixels 12B, 12G, 12R, and 12IR) of each sensor part 112, when a drive pulse φROG corresponding to a read pulse ROG is applied to the read gates 124, accumulated signal charges are read out to the vertical transfer CCDs 122 in the same vertical column. The transfer with the vertical transfer CCDs 122 is driven by a drive pulse φVx based on, for example, a 3- to 8-phase vertical transfer clock Vx so that the read signal charges are sequentially transferred for each portion corresponding to one scanning line (one line) in the vertical direction in a portion of a horizontal blanking period. The vertical transfer for each line is referred to as "line shift".

Furthermore, in the CCD solid-state imaging device 101, horizontal transfer CCDs 126 (horizontal register part or horizontal transfer part) arranged a line in a predetermined direction (for example, lateral direction) is provided at the transfer ends of the plurality of vertical transfer CCDs 122, i.e., adjacent to the vertical transfer CCDs 122 in the last line. The transfer with the horizontal transfer CCDs 126 is driven by drive pulses φH1 and φH2 based of, for example, 2-phase horizontal transfer clocks H1 and H2 so that signal charges for one line transferred from the plurality of vertical transfer CCDs 122 are sequentially horizontally transferred in a horizontal scanning period after the horizontal blanking period. Therefore, a plurality (two) of horizontal transfer electrodes corresponding to the two-phase transfer is provided.

Furthermore, the output amplifier 128 having a charge-voltage conversion part including a floating diffusion amplifier (FDA) is provided at the transfer end of the horizontal transfer CCDs 126. The output amplifier 128 is an example of physical information acquiring parts, in which the signal charges horizontally transferred by the horizontal transfer CCDs 126 are sequentially converted to voltage signals in the charge-voltage conversion part, amplified to a predetermined level, and then output. The voltage signals induce image signals as CCD outputs ($V_{out}$) according to the quantity of incident light from an object. As a result, the interline transfer-type CCD solid-state imaging device 11 is formed.

The image signals induced as CCD outputs ($V_{out}$) from the output amplifier 128 are input to the image signal processing part 140 shown in FIG. 29B. In the image signal processing part 140, an image switching control signal is input from the image switching control part 142 which is an example of signal switching control parts. The CCD solid-state imaging device 101 is driven by a drive pulse from the drive control part (an example of drive parts) 146.

The image switching control part 142 instructs to switch the output of the image signal processing part 140 to a visible VL monochrome or color image which is substantially not affected by infrared light IR, an infrared IR image which is substantially not affected by visible light VL, both images, or a mixed image of visible light VL and infrared light IR, i.e., a pseudo-monochrome or pseudo-color image to which the luminance of infrared light IR is added. In other words, the image switching control part 142 controls simultaneous imaging output and switched imaging output of a visible VL image and an infrared IR light.

This instruction may be given by external input for operating an imaging device or the image switching control part 142 may instruct to switch the images by automatic processing using the visible light luminance not containing infrared light and output from the image signal processing part 140.

The image signal processing part 140 performs, for example, synchronization for synchronizing image data R, G, B, or IR of each pixel, stripe noise correction for correcting stripe noise produced by a smear phenomenon and a blooming phenomenon, WB (White Balance) control for controlling WB, gamma correction for controlling a gradient, dynamic range enhancement for enhancing the dynamic range using pixel information of two screens having different charge storage times, or YC signal generation for generating luminance data (Y) and color data (C). As a result, a visible light VL band image (i.e., an ordinary image) is obtained on the basis of imaging data (pixel data of R, G, B, IR) of the primary colors of red (R), green (G), and blue (B).

The image signal processing portion 140 also produces an infrared IR image using pixel data of infrared light IR. For example, when a color filter 14C is not provided in the pixel 12IR in which the dielectric stacked film 1 is not formed so that not only infrared light IR but also visible light VL simultaneously contribute to signals, a high-sensitivity image is obtained using pixel data from the pixel 12IR. Alternatively, when a green filter 14G is provided as a color filter 14C, a mixed image of infrared light IR and green visible light LG is obtained. However, an image of infrared light IR alone is obtained using a difference from the green component obtained from pixels 12G. When a black filter 14BK is provided as a color filer 14C, an image of infrared light IR alone is obtained using pixel data from pixels IR.

Each of the images produced as described above is sent to a display part (not shown) and displayed as a visible image for the operator, stored directly in a storage device such as a hard disk device or the like, or sent as processed data to other functional parts.

FIG. 30 shows a structure for independently detecting visible light VL (blue light, green light, and red light) and infrared light IR. Although details are not described, the basic configuration is the same as shown in FIGS. 29A and 29B, one unit pixel matrix 12 (photodiode group) substantially includes a visible light VL pixel 12W and a pixel 12IR not having the dielectric stacked film 1. This structure is the same as shown in FIGS. 29A and 29B except that the arrangement of color filters 14 is different.

In an arrangement of the color filters 14, for example, the color filters 14 are disposed in the order of visible light VL, infrared light IR, visible light VL, infrared light IR, . . . in the longitudinal direction (X direction) of the vertical transfer CCDs 122 on the light-receiving surface of the silicon substrate 1_ω, and also in the order of visible light VL, infrared light IR, visible light VL, infrared light IR, . . . in the same direction (Y direction) with respect to the plurality of vertical transfer CCDs 122.

<Imaging Device Using Spectral Image Sensor; Corresponding to CMOS>

Figure 31A:
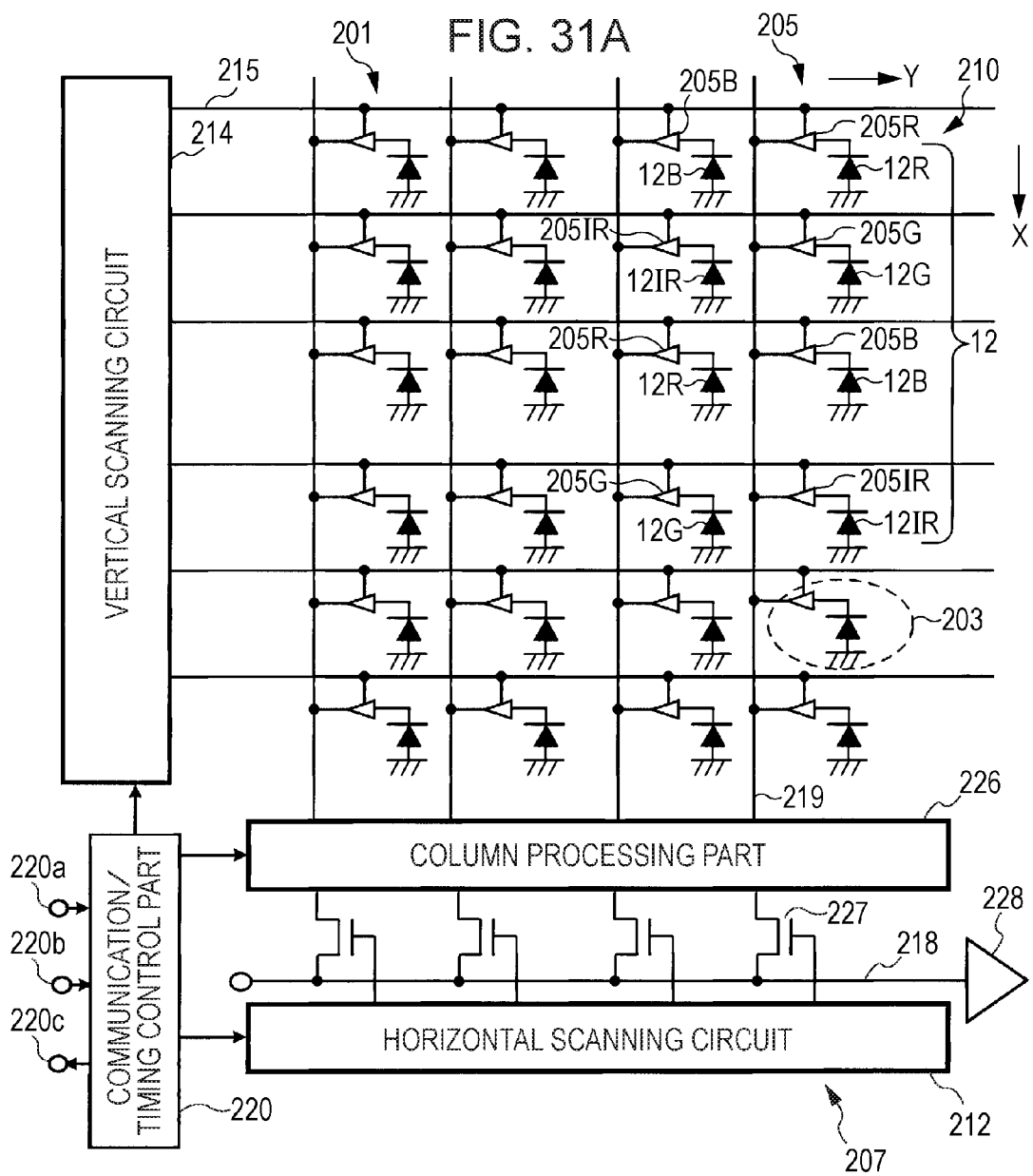
FIGS. 31A and 31B drawings illustrating a circuit (corresponding to R, G, B, and infrared light IR) in the application of a stacked film to a CMOS image sensor.
Figure 31B:
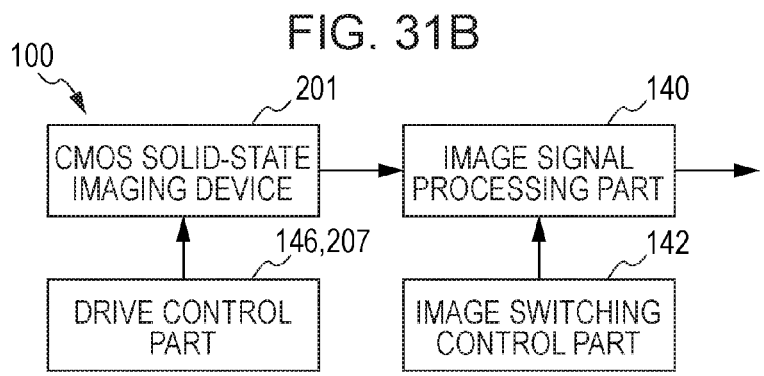
Figure 32:
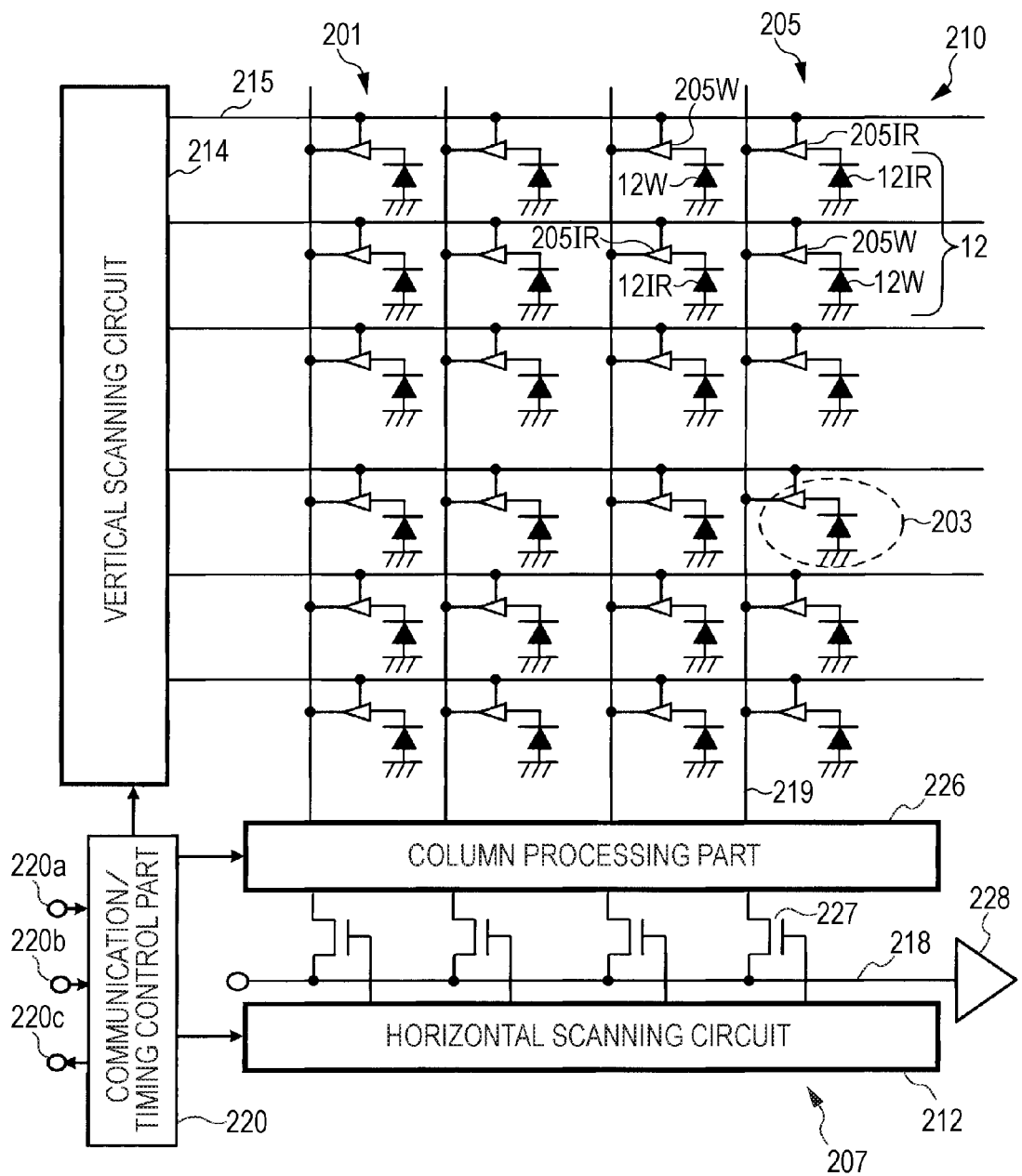
FIG. 32 is a drawing illustrating a circuit (corresponding to visible light VL and infrared light IR) in the application of a stacked film to a CMOS image sensor.

FIGS. 31A and 31B and 32 are drawings showing circuits in application of the spectral image sensor 11 above described in the embodiments to an imaging device using a CMOS solid-state imaging device (CMOS image sensor). An imaging device 100 is a physical information acquiring device according to an embodiment of the invention.

In the drawings, reference numeral 100 denotes an imaging device; reference numeral 201, a CMOS solid-state imaging device; reference numeral 205, a pixel amplifier; reference numeral 207, a drive control part; reference numeral 219, a vertical signal line; and reference numeral 226, a column processing part.

Like FIG. 3, FIGS. 31A and 31B show a structure for detecting infrared light IR while separating a visible light VL band into respective color components of R, G, and B. The structure is adapted for independently detecting blue light B, green light G, and red light R of visible light VL and infrared light IR, and one unit pixel matrix 12 substantially include pixels (photoelectric transducer) 12B, 12G, and 12R for respective wavelengths and a pixel 12IR not having a dielectric stacked film 1.

FIG. 32 shows a structure for independently detecting visible light VL (blue light, green light, and red light) and infrared light IR, and one unit pixel matrix 12 (photodiode group) substantially include a pixel (photoelectric transducer) 12W for visible light VL and a pixel 12IR not having a dielectric stacked film 1. This structure is basically the same as shown in FIG. 31A except that the arrangement of color filters 14 is different (the same as in FIG. 30).

When a spectral image sensor is applied to a CMOS, a cell amplifier is provided for each of pixels (photoelectric transducer) 12B, 12G, 12R, and 12IR in the unit pixel matrix 12. In this case, therefore, the structure shown in FIG. 31A or FIG. 32 is used, in which pixel signals are amplified by each cell amplifier and then output through a noise canceling circuit or the like.

For example, the CMOS solid-state imaging device 201 includes a pixel part in which a plurality of pixels each including a light-receiving element (an example of a charge generating part) which outputs a signal according to a quantity of incident light are arranged in lines and columns (i.e., in a tow-dimensional matrix). A signal output from each pixel is a voltage signal, and the imaging device 201 is a typical column type in which a CDS (Correlated Double Sampling) processing functional part, a digital conversion part (ADC; Analog Digital Converter), and the like are provided in parallel to the column direction.

Specifically, as shown in FIG. 31A, the CMOS solid-state imaging device 201 includes a pixel part (imaging part) in which a plurality of pixels 12 are arranged in lines and columns, and a drive control part 207, a column processing part 226, and an output circuit 228 which are provided outside the pixel part 210.

Also, if required, an AGC (Auto Gain Control) circuit having a single amplifying function may be provided in the same semiconductor region as the column processing part 226 in front or behind the column processing part 226. When AGC is performed in front of the column processing part 226, analogue amplification is performed, while when AGC is performed behind the column processing part 226, digital amplification is performed. Since simple amplification of n-bit digital data may degrade the gradient, data is rather preferably subjected to analogue amplification and then converted to digital data.

The drive control part 207 has a control circuit function to sequentially read signals of the pixel part 210. For example, the drive control part 207 includes a horizontal scanning circuit (column scanning circuit) 212 for controlling column addresses and column scans, a vertical scanning circuit (line scanning circuit) 214 for controlling line addresses and line scans, and a communication/timing control part 220 having the function as an interface with the outside and the function to generate an internal clock.

The horizontal scanning circuit 212 has the function as a read scanning part for reading count values from the column processing part 226. The components of the drive control part 207 are integrally formed together with the pixel part 210 in a semiconductor region of single crystal silicon using a technique equivalent to a technique for manufacturing a semiconductor integrated circuit to form a solid-state imaging device (imaging device) as an example of semiconductor systems.

FIG. 31A shows only a portion of lines and columns for the sake of simplicity, but several tens to several thousands of pixels 12 are arranged in each line and each column. Each of the pixels 12 includes the unit pixel matrix 12 serving as a light-receiving element (charge generating part) and pixel amplifiers (cell amplifiers; pixel signal generating part) 205 (205B, 205G, and 205R for respective colors) each having an amplification semiconductor element (for example, transistor).

As seen from FIG. 31A, one unit pixel matrix 12 has a structure for independently detecting blue light B, green light G, red light R, and infrared light IR, and substantially includes pixels 12B, 12G, 12R, and 12IR for respective wavelengths (colors).

In an arrangement of color filters 14, for example, the color filters 14 are disposed in the order of blue, green, red, IR, blue, green, red, IR, . . . in the X direction on a light-receiving surface of a silicon substrate $1\_\omega$, and also in the order of blue, green, red, IR, blue, green, red, IR, . . . in the Y direction perpendicular to the X direction.

As each pixel amplifier 205, a floating diffusion amplifier is used. An example of the pixel amplifiers 205 include four general-purpose transistors for a CMOS sensor, including a read selection transistor as an example of a charge read part (transfer gate part/read gate part) relative to a charge generation part, a reset transistor as an example of a reset gate part, a vertical selection transistor, and a source-follower amplification transistor as an example of a detecting element for detecting a voltage change of floating diffusion.

As disclosed in U.S. Pat. No. 2,708,455, another type of amplifier may be used, which includes the three transistors, i.e., an amplification transistor connected to a drain line (DRN), for amplifying a signal voltage corresponding to a signal charge generated from the charge generation part, a reset transistor for resetting the pixel amplifier 205, and a read selection transistor (transfer gate part) scanned by a vertical shift resistor through transfer wiring (TRF).

The pixels 12 are connected to the vertical scanning circuit 214 through line control lines 215 and to the column processing part 226 through vertical signal lines 219. The line control lines 215 include the entire wiring extending from the vertical scanning circuit 214 to the pixels. For example, the line control lines 215 are arranged in parallel to a long scatterer 3.

The horizontal scanning circuit 212 and the vertical scanning circuit 214 each include, for example, a shift resistor and a decoder to start an address selection operation (scanning) in response to a control signal output from the communication/timing control part 220. Therefore, the line control lines 125 include various pulse signals (for example, reset pulse RST, transfer pulse TRF, DRN control pulse DRN, etc.) for driving the pixels 12.

Although not shown in the drawing, the communication/timing control part 220 includes a functional block functioning as a timing generator TG (an example of read address control devices) for supplying a clock necessary for the operation of each part and a pulse signal with predetermined timing, and a functional block functioning as a communication interface for receiving a master clock CLKO through a terminal 220a, receiving data DATA for instructing an operation mode through a terminal 220b, and outputting data including information of the CMOS solid-state imaging device 201 through a terminal 220c.

For example, a horizontal address signal and a vertical address signal are output to a horizontal decoder and a vertical decoder, respectively, and each decoder selects a corresponding line or column to drive the pixels 12 and the column processing part 226 through a drive circuit.

In this case, since the pixels are arranged in a two-dimensional matrix, analogue pixel signals generated from the pixel amplifiers (pixel signal generating part) 205 and output in the column direction through the vertical signal lines 219 are accessed by column units (parallel to the column direction) and read by (vertical) scanning. Then, pixel signals are accessed in the line direction vertical to the vertical direction to read pixel signals (for example, digital pixel data) to the output side by (horizontal) scanning. Therefore, the read speeds of pixel signals and pixel data are desirably increased. Of course, random access may be carried out, in which the address of the pixel 12 to be read is directly specified to read only the information of the necessary pixel 12.

The communication/timing control part 220 supplies clock CLKI at same frequency as the master clock CLKO input through the terminal 220a and a low-speed clock obtained by dividing the frequency into two or more parts to each part of the device, for example, the horizontal scanning circuit 212, the vertical scanning circuit 214, the column processing part 226, and the like.

The vertical scanning circuit 214 selects a column of the pixel part 210 and supplies a pulse necessary for the column. For example, the vertical scanning circuit 214 includes a vertical decoder for specifying (selecting a column of the pixel part 210) a read column in the vertical direction, and a vertical drive circuit for supplying a pulse to the line control line 215 corresponding to the pixel 12 at the read address (column direction) specified by the vertical decoder to drive the pixel 12. The vertical decoder selects a column for an electronic shutter as well as a column for reading signals.

The horizontal scanning circuit 212 successively selects column circuits (not shown) in the column processing part 226 in synchronism with low-speed clock CLK2 and leads the signal to horizontal signal lines (horizontal output lines) 218. For example, the horizontal scanning circuit 212 includes a horizontal decoder for specifying (selecting each column circuit in the column processing part 226) a read column in the horizontal direction and a horizontal drive circuit for leading each signal of the column processing part 226 to the horizontal signal lines 218 using selection switches 227 according to the read address specified by the horizontal decoder. For example, when the number n (a positive inter) of bits handled by a column AD circuit is 10 (=n), the number of the horizontal signal lines 218 is 10 corresponding to the number of bits.

In the CMOS solid-state imaging device 201 having the above-described configuration, the pixel signals output from the pixels 12 supplied, for each vertical line, to the column circuits of the column processing part 226 through the vertical signal lines 219. The signal charges stored in the unit pixel matrix 12 (pixels 12B, 12G, 12R, and 12IR) are red through the same vertical signal line 219.

Each column circuit of the column processing part 226 receives signals from the pixels in one column and processes the signals. For example, each column circuit has an ADC (Analog Digital Converter) circuit for converting analogue signals to 10-bits digital data using, for example, the low-speed clock CLK2.

By using a proper circuit configuration, pixel signals input in a voltage mode through the vertical signal lines 219 may be processed so as to produce differences between the signal level (noise level) immediately after pixel reset and true (corresponding to the quantity of incident light) signal level $V_{sig}$. Consequently, noise signal components such as fixed pattern noise (FPN) and reset noise may be removed.

The analogue pixel signals (or digital pixel data) processed in the column circuits are transmitted to the horizontal signal lines 218 through the horizontal selection switches 217 driven by the horizontal selection signals output from the horizontal scanning circuit 212 and then input to the output circuit 28. The number 10 of bits is an example, and the number of bits may be less than 10 (for example, 8) or may exceed 10 (for example 14).

In the above-described configuration, pixel signals are sequentially output from the pixels in each vertical line in the pixel part 210 in which the unit pixel matrixes 12 (pixels 12B, 12G, 12R, and 12IR) serving as the charge generating parts are arranged in a matrix. Therefore, one image corresponding to the pixel part 210 in which the light-receiving devices are arranged in a matrix, i.e., a frame image, is displayed as a collection of the pixel signals of the entire pixel part 210.

The output circuit 228 corresponds to the output amplifier 128 in the CCD solid-state imaging device 101, and like in the CCD solid-state imaging device 101, the image signal processing part 140 is provided behind the output circuit 228, as shown in FIG. 31B. Also, like in the CCD solid-state imaging device 101, an image switching control signal is input to the image signal processing part 140 from then image switching control part 142.

As a result, an image of the visible light VL band (i.e., an ordinary image) is obtained on the basis of the imaging data (pixel data of R, G, B, and IR) of the primary colors of red (R), green (G), and blue (B) or pixel data for visible light VL, and infrared light IR image is also obtained using pixel data of infrared light IR.

Although not shown in the drawings, when the pixels 12IR are removed from the basic structure shown in FIG. 29 or 31A, the respective color components of R, G, and B in the visible light VL band are separately detected.

In an arrangement of color filters 14, for example, the color filters 14 are disposed in the order of blue, green, red, green, blue, green, red, green, blue, . . . in the longitudinal direction (X direction) of the vertical transfer CCDs 122 on the light-receiving surface of the silicon substrate 1_ω, and also in the order of blue, green, red, green, blue, green, red, green, blue . . . in the same direction (Y direction) with respect to the plurality of vertical transfer CCDs 122. Alternatively, in a 2×2 unit pixel matrix 12, two green (G) pixels and one pixel of each of red (R) and blue (B) colors are disposed in a so-called Bayer arrangement, or a fourth color (e.g., emerald) is added to the three colors of B, G, and R in order to extend a range of color reproduction.

In such a case, only an image of the visible light VL band is obtained, but an infrared cut filter may not be disposed as an example of subtractive color filters in front of a sensor. Since an expensive infrared cut filter may not be disposed, the cost is significantly decreased. Also, since a thick and heavy infrared cut filter may not be disposed, an optical system may be made lightweight and compact. Of course, an infrared cut filter insertion/extraction mechanism may not be provided, and thus a device is not increased in scale.

This advantage in cost also applies to a structure in which an existing infrared cut filter made of glass is replaced by a dielectric stacked film, and an imaging sensor and a dielectric stacked film are separately formed (a detecting part and a dielectric stacked film are separately formed).

For example, a device is advantageous in cost and made compact as compared with use of an existing infrared cut filter made of glass, and thus an imaging device having excellent portability, such as a digital camera or the like, may be provided.

In a structure in which an infrared cut filter is disposed in front of a sensor, a glass substrate is inserted in front of a CCD or CMOS imaging device to produce an air-glass interface in the course of an optical path. Therefore, visible light to be transmitted is reflected by the interface, thereby causing the problem of decreasing sensitivity. Furthermore, the number of such interfaces is increased, and thus the angle of refraction in oblique incidence (within glass) varies with wavelength, thereby causing blooming due to a change in the optical path. In this case, use of a dielectric stacked film has the advantage that the blooming according to wavelength is prevented.

<<Example of Manufacturing Process>>

FIGS. 33A to F are drawings illustrating an example of a process for manufacturing a spectral image sensor having any one of the sensor structures described above in the embodiments. Namely, FIGS. 33A to F are drawings illustrating an example of a process for manufacturing a spectral image sensor including a light receiving part for infrared light IR and a light receiving part for visible light VL.

Figure 33:
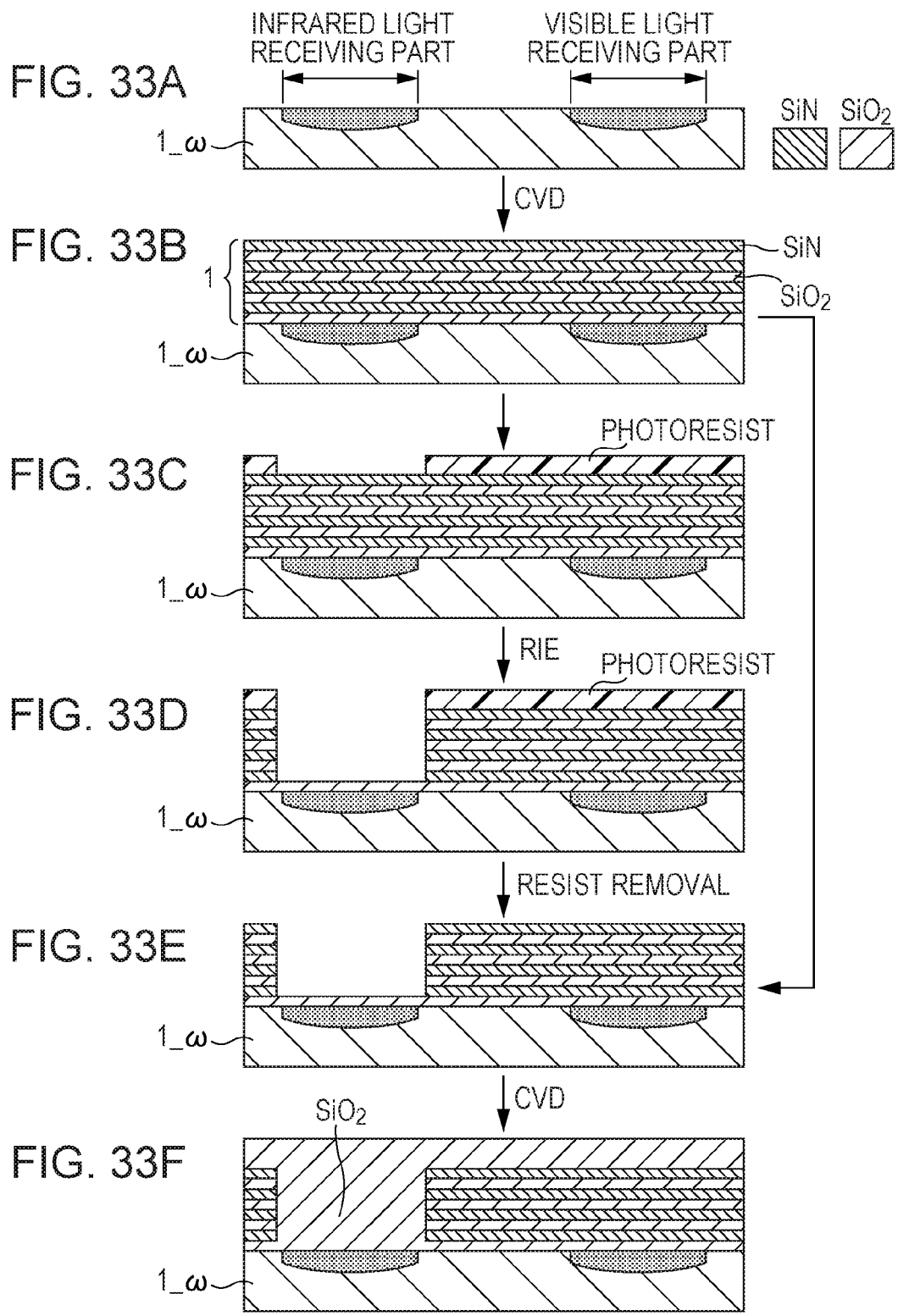
FIG. 33A to 33F are drawings illustrating an example of a process for manufacturing a spectral image sensor.

In forming this structure, as shown in FIG. 29, 30, or 31A and 32, a general CCD or CMOS-structure circuit is first formed (FIG. 33A). Then, a $SiO_2$ film and a SiN film are successively deposited on a Si photodiode by, for example, CVD (Chemical Vapor Deposition) or the like (FIG. 33B).

Then, only one of four pixels is etched by a RIE (Reactive Ion Etching) method or the like to form an opening in the light receiving part for infrared light IR so that the opening reaches the $SiO_2$ film in the lowermost layer (FIG. 33E).

Next, in order to protect the dielectric stacked film 1 and the like, a $SiO_2$ film is again deposited on the dielectric stacked film 1 by, for example, CVD, the dielectric stacked film 1 having the opening formed in a portion thereof (FIG. 33F). This process may be appropriately changed.

In this process, a photoresist having an opening corresponding to the light-receiving part for infrared light IR may be used so as not to etch the three pixels (R, G, and B components) of visible light VL (FIGS. 33C and 33D). In this case, the photoresist is removed before the $SiO_2$ film is deposited on the dielectric stacked film 1 (FIGS. 33D to E).

Although not shown in the drawings, a color filter and a micro lens may be further formed on the $SiO_2$ film for each pixel.

Furthermore, when infrared light IR slightly leaks to enter a photoelectric transducer (photodiode or the like) for visible light VL, an entirely weak ultraviolet cut filter may be disposed. For example, even when an infrared cut filter with a cut rate of 50% or less is disposed to cut infrared light to a level which causes substantially no influence on visible light VL, infrared light IR is converged in a photoelectric transducer (photodiode or the like) for infrared light IR, thereby causing sufficient sensitivity.

In this manufacturing process, etching is performed to a portion near the Si substrate, i.e., the opening reaching the $SiO_2$ film in the lowermost layer is formed in the light receiving part for infrared light IR (FIG. 33E). Therefore, etching may cause the problem of damaging. In this case, the damaging may be decreased by increasing the thickness d of the $SiO_2$ film immediately above the Si substrate.

When dk is 2.5 μm or more, as shown in FIG. 11, the half width of a dip in the infrared IR region of a reflection spectrum narrows, and thus the reflectance is averaged for general natural broad light, thereby permitting reflection of infrared light. Therefore, the thickness dk of the kth dielectric layer $1\_k$ is preferably 2.5 μm or more and more preferably 5 μm or more.

When metal wiring for photodiodes and pixel amplifiers which are formed on the silicon substrate $1\_\omega$, i.e., a wiring layer for forming signal lines for reading pixel signals as unit signals from the pixel amplifiers serving as unit signal generating parts in an imaging part (detection region), is formed immediately above the silicon substrate $1\_\omega$, the dielectric stacked film 1 is formed at some distance from the silicon substrate $1\_\omega$ as compared with a structure in which the dielectric stacked film 1 is formed immediately above the silicon substrate $1\_\omega$. In other words, the dielectric stacked film 1 is formed above the metal wiring, and thus the process is simplified, thereby causing the advantage of low cost. In detail, when the number of the layers constituting the dielectric stacked film 1 is increased, a rather satisfactory effect is obtained. Hereinafter, a metal wiring-conscious spectral image sensor will be described.

Spectral Image Sensor Using Dielectric Stacked Film

Sixth Embodiment

FIGS. 34 to 40 are drawings illustrating a spectral image sensor 11 corresponding to single wavelength spectral separation using a dielectric stacked film 1 according to a sixth embodiment. In the sixth embodiment, on the basis of the process described above with reference to FIGS. 10 to 14, the dielectric stacked film 1 is formed integrally with a detecting part such as a photodiode or the like above a silicon substrate $1\_\omega$ at some distance from the silicon substrate $1\_\omega$ in view of metal wiring.

Figure 34:
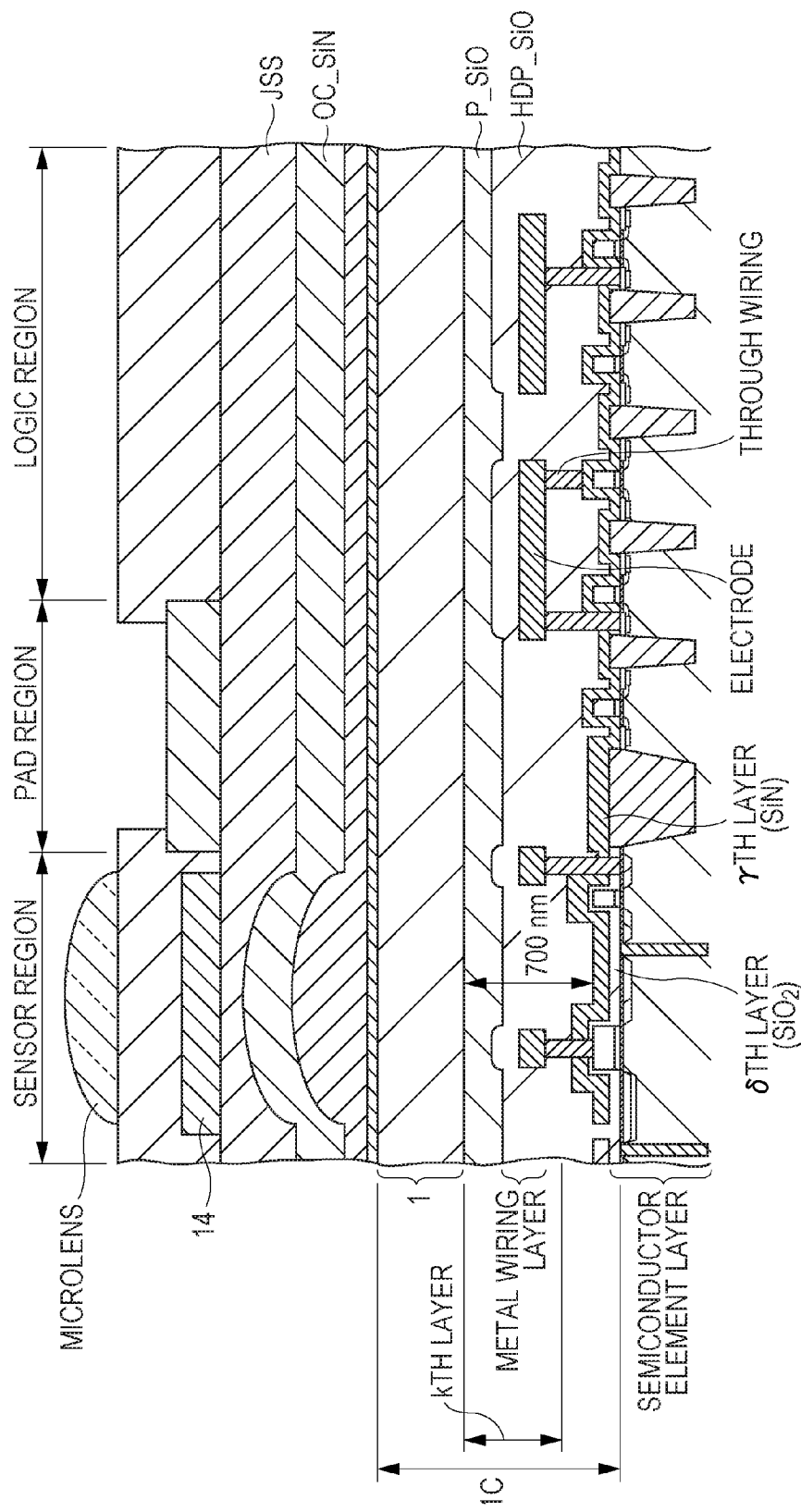
FIG. 34 is a structural drawing illustrating a spectral image sensor corresponding to single-wavelength spectral separation using a stacked film according to a sixth embodiment of the invention.

For example, in a CMOS structure, as shown in FIG. 34, a wiring layer is formed above a semiconductor element layer in which detecting parts such as photodiodes or the like are formed. When the thickness of the wiring layer is about 0.7 μm, a multilayer structure may be integrally formed about 0.7 μm above the silicon substrate $1\_\omega$ on which photodiodes are the like are formed, and the dielectric stacked layer 1 may be formed after the process for a first wiring layer. In this case, the wiring layer is provided in the kth layer having a thickness dk of about 0.7 μm.

Figure 35:
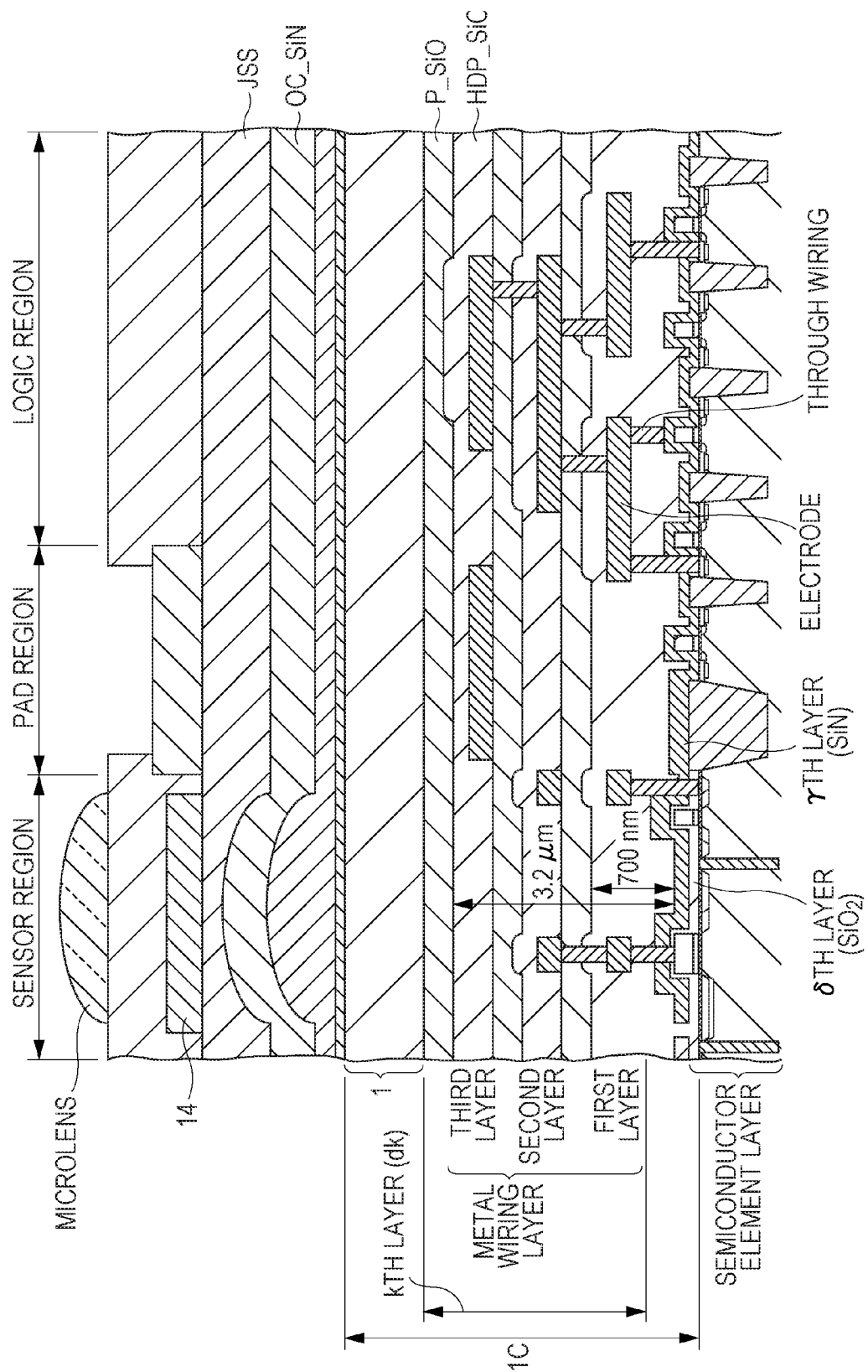
FIG. 35 is a structural drawing illustrating a spectral image sensor corresponding to single-wavelength spectral separation using a stacked film according to the sixth embodiment of the invention.

Furthermore, as shown in FIG. 35, when three wiring layers having a total thickness of about 3.2 μm are provided on a semiconductor element layer, a multilayer structure may be integrally formed about 3.2 μm above a silicon substrate $1\_on$ which photodiodes and the like are formed, and a dielectric stacked film 1 may be formed after the process for the third wiring layer at the top. In this case, the wiring layers may be formed in the kth layer having a thickness dk of about 3.2 μm.

In this example, as shown in the drawing, the thickness of about 3.2 μm represents the thickness of the layer k excluding the thickness of about 10 nm of a $SiO_2$ layer (δ layer) provided on the silicon substrate $1\_\omega$ and the thickness of about 65 nm of a SiN layer (γ layer) provided on the layer.

Color filters 14 and microlenses may be formed after the dielectric stacked film 1 is formed.

Figure 36:
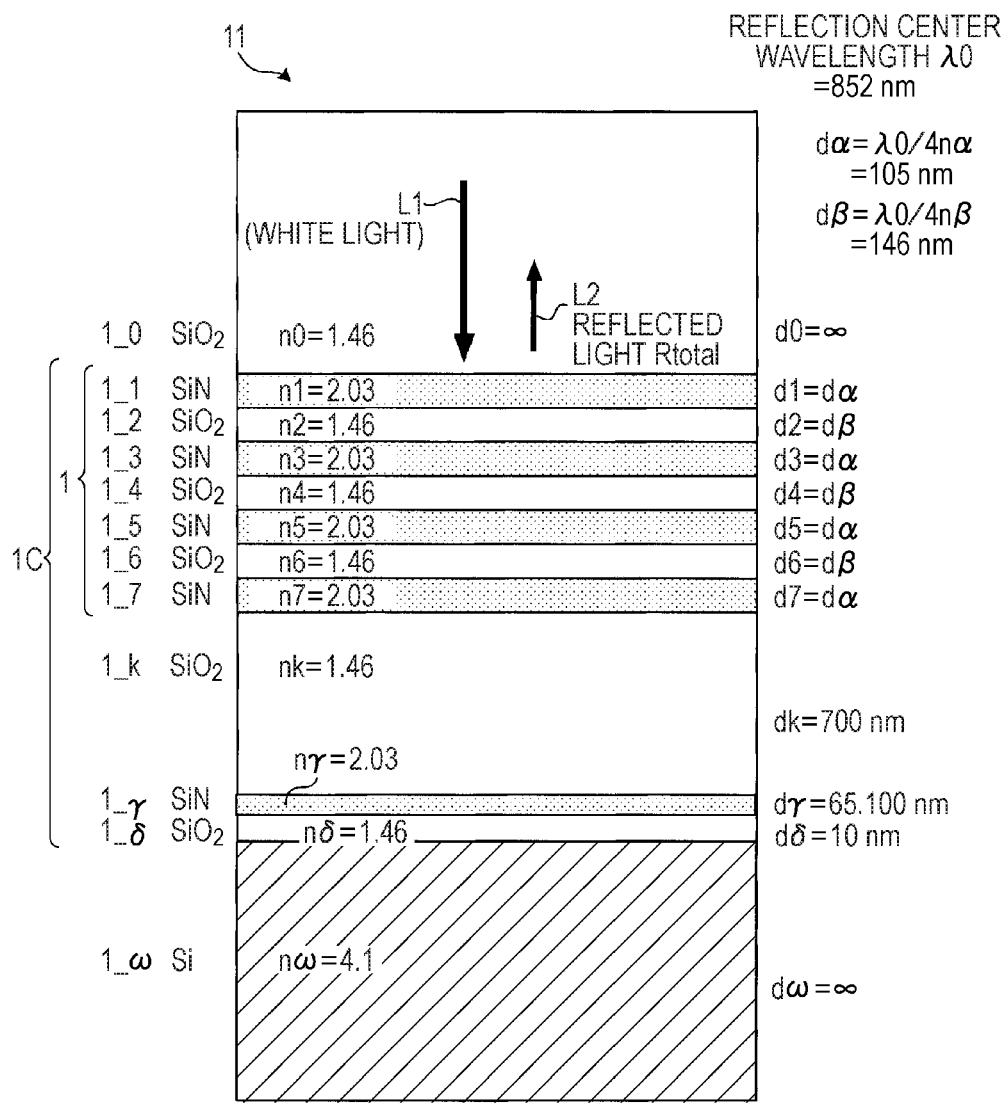
FIG. 36 is a structural drawing illustrating a spectral image sensor corresponding to single-wavelength spectral separation using a stacked film according to the sixth embodiment of the invention.

As the spectral image sensor 11 corresponding this example, for example, as shown in FIG. 36, in the seven-layer structure of the second embodiment shown in FIG. 17, a dielectric stacked film 1C including the three layers including the kth dielectric stacked layer $1\_k$ (silicon oxide $SiO_2$ layer), a silicon nitride SiN layer $1\_\gamma$, and a silicon oxide $SiO_2$ layer $1\_\delta$ is used as a base, the kth dielectric layer $1\_k$ having a thickness of 700 nm. In the dielectric stacked film 1C, the relatively thin silicon nitride SiN layer $1\_\gamma$ has a thickness dγ of 65 nm or 100 nm and is deposited as a third layer material between the kth silicon oxide $SiO_2$ layer and the silicon substrate $1\_\omega$, and the silicon oxide $SiO_2$ layer $1\_\delta$ has a thickness dδ of 10 nm and a lower refractive index than that of the third layer material and is deposited as a fourth layer material between the third layer material and the silicon substrate $1\_\omega$.

Figure 37:
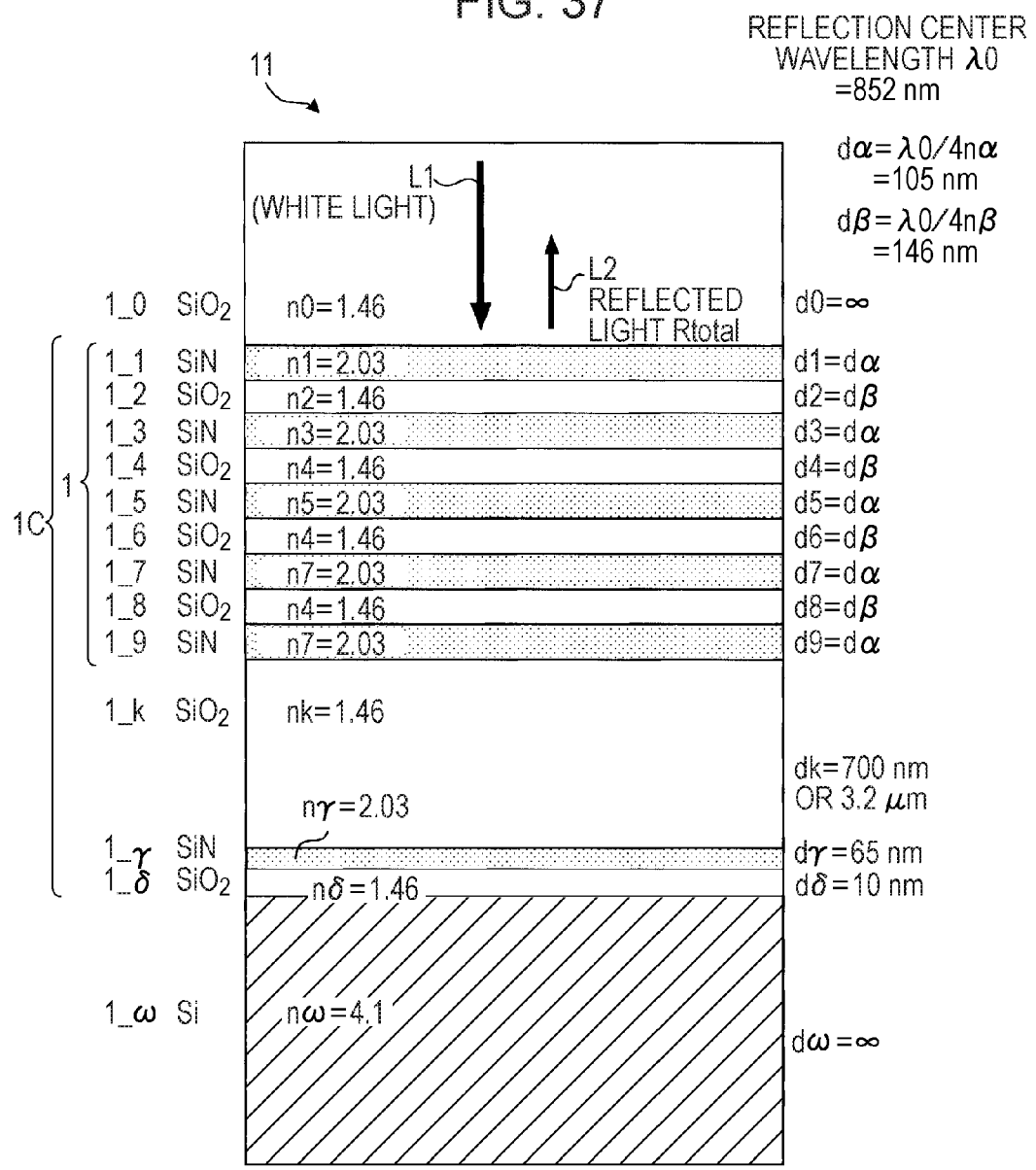
FIG. 37 is a structural drawing illustrating a spectral image sensor corresponding to single-wavelength spectral separation using a stacked film according to the sixth embodiment of the invention.

In FIG. 37, a basic dielectric stacked film 1 has a nine-layer structure in which the kth dielectric layer $1\_k$ has a thickness of 700 nm or 3.2 μm. In a dielectric stacked film 1C, a relatively thin silicon nitride SiN layer $1\_\gamma$ having a thickness dγ of 65 nm is deposited as a third layer material between the kth silicon oxide $SiO_2$ layer and the silicon substrate $1\_\omega$, and a silicon oxide $SiO_2$ layer $1\_\delta$ has a thickness dδ of 10 nm and a lower refractive index than that of the third layer material is deposited as a fourth layer material between the third layer material and the silicon substrate $1\_\omega$.

Figure 38:
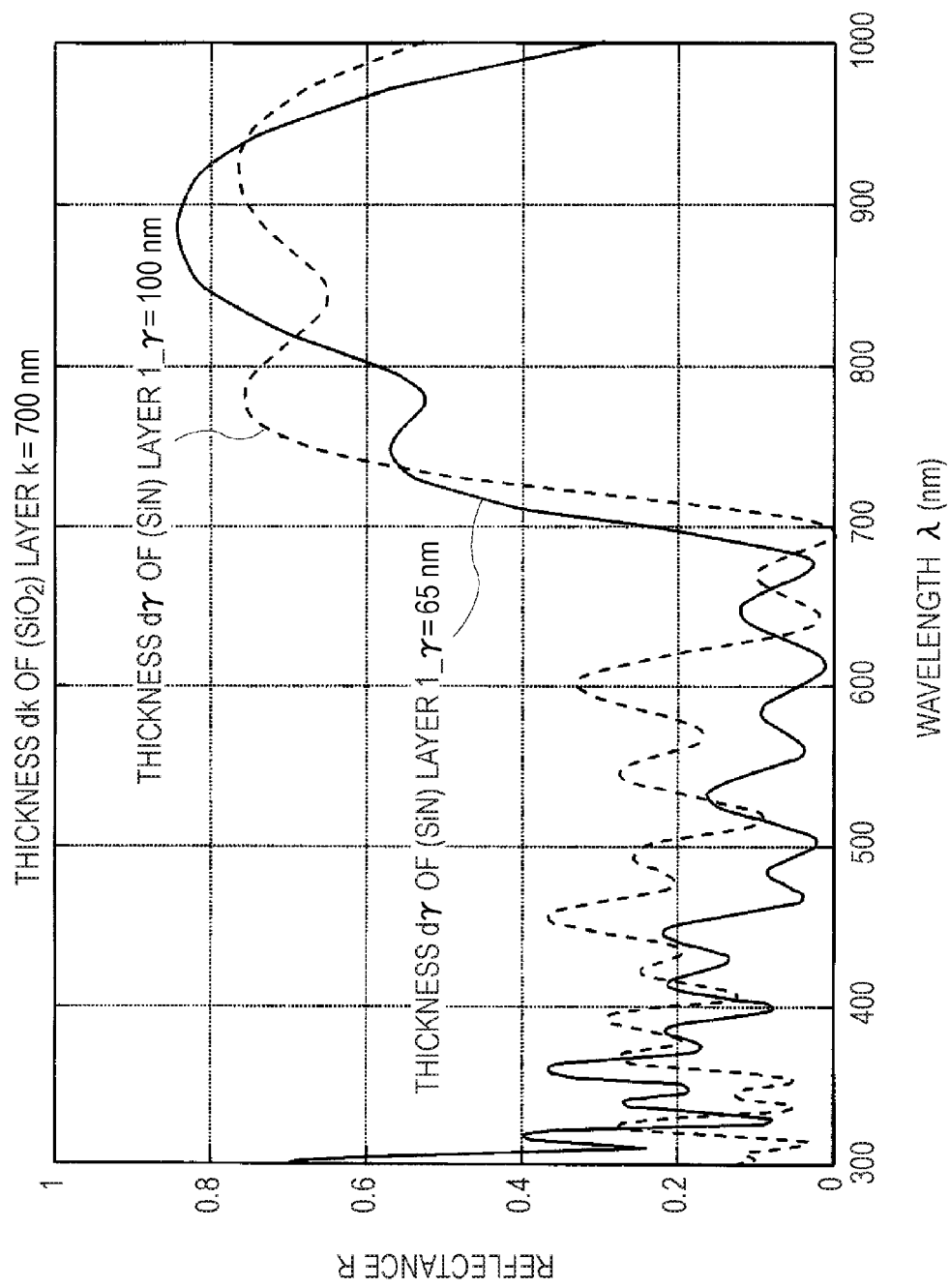
FIG. 38 is a drawing illustrating a spectral image sensor corresponding to single-wavelength spectral separation using a stacked film according to the sixth embodiment of the invention.
Figure 39:
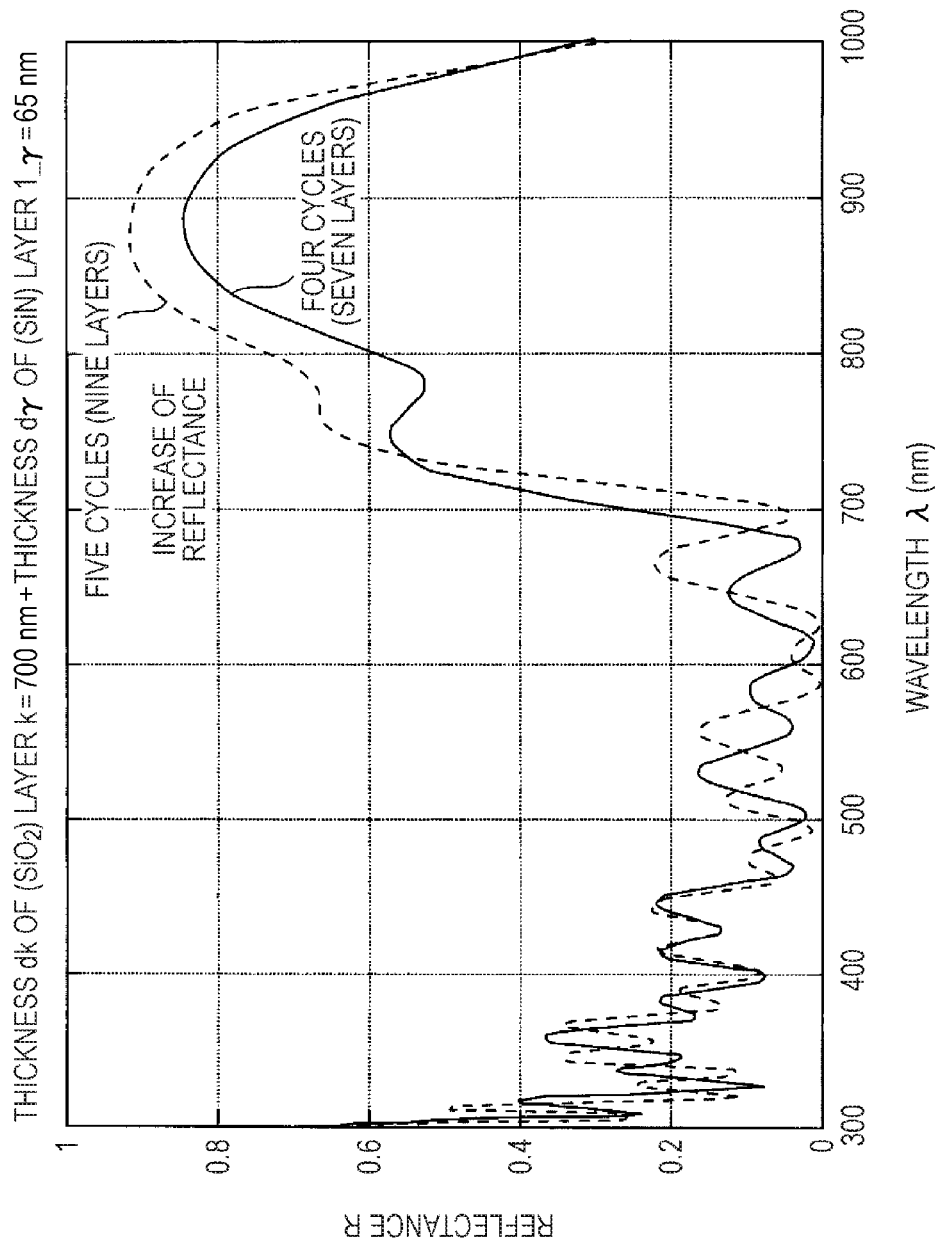
FIG. 39 is a reflection spectrum atlas illustrating a spectral image sensor corresponding to single-wavelength spectral separation using a stacked film according to the sixth embodiment of the invention.
Figure 40:
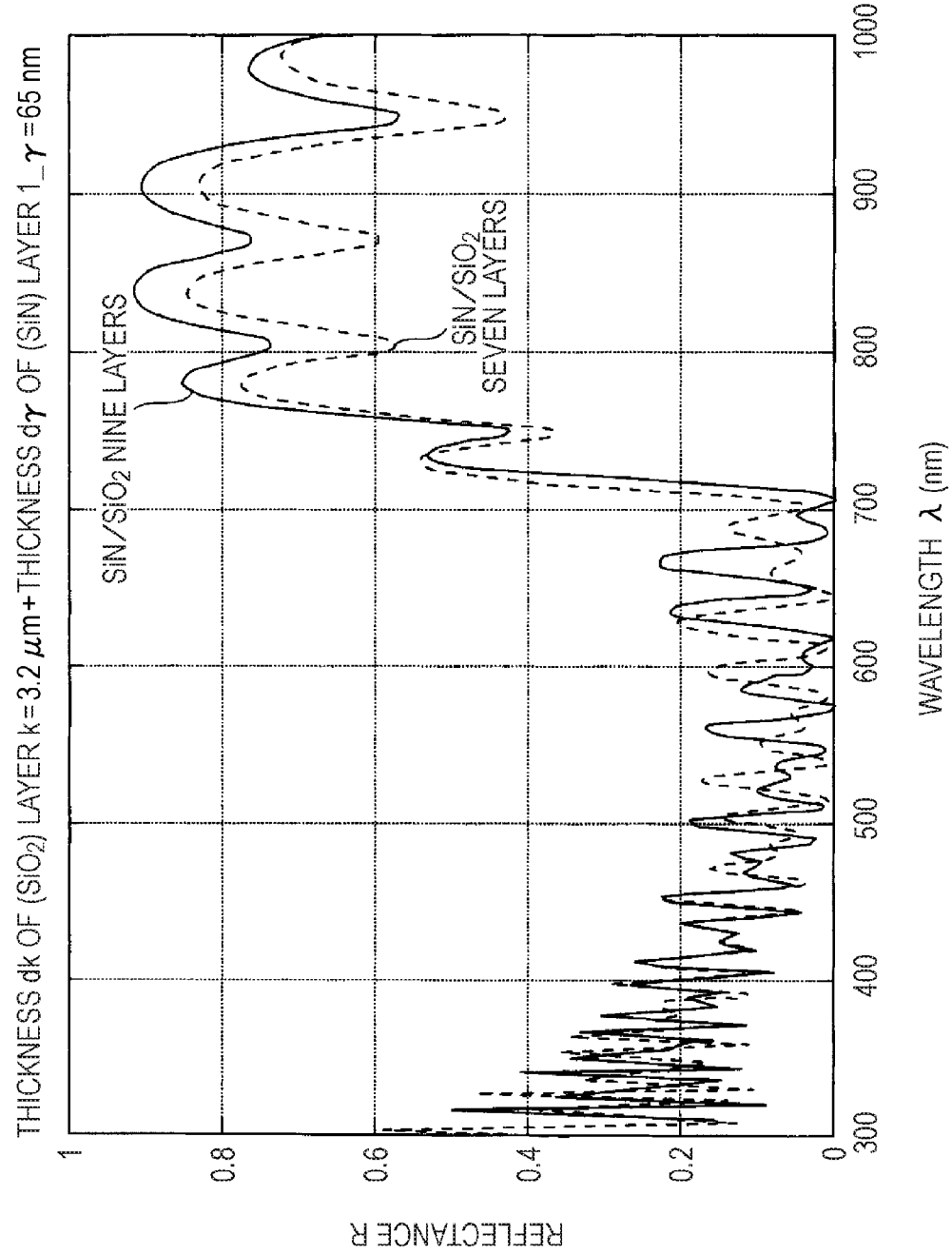
FIG. 40 is a reflection spectrum atlas illustrating a spectral image sensor corresponding to single-wavelength spectral separation using a stacked film according to the sixth embodiment of the invention.

The results of calculation of reflection spectra of these structures are as shown in FIGS. 38 to 40. As seen from FIGS. 37 and 36, the dielectric stacked film 1 is formed about 0.7 μm or 3.2 μm above the silicon substrate $1\_\omega$, and thus the wiring process is simplified. Correctly, the $SiO_2$ layer as the fourth layer material and the SiN layer as the third layer material having thicknesses of 10 nm and 65 nm (or 100 nm), respectively, are present in order immediately above the silicon substrate $1\_\omega$, the dielectric stacked film 1 is more than 0.7 μm or 3.2 μm above the silicon substrate $1\_\omega$.

The seven-layer dielectric stacked film 1 and the nine-layer dielectric stacked film 1 each including SiN films and $SiO_2$ films are described above. However, as shown in FIG. 39, when the number of the layers is increased from 7 to 9, the reflectance R in the infrared IR region is sufficiently increased to 0.9 or more.

As shown in FIG. 40, in a seven-layer structure in which the thickness dk of the kth dielectric layer $1\_k$ is 3.2 μm, a dip in the infrared reflection region is large, resulting in a significant decrease in reflection. However, it is found that the dip is decreased by increasing the number of layers to 9, reflection in the infrared IR region becomes sufficient.

Also, FIG. 38 indicates that when the thickness dγ of the SiN layer as the third layer material is large, reflection in the visible light VL region is increased. This possibly due to the fact that as described above in the second embodiments, the third layer material is provided as an intermediate layer for decreasing reflection in the visible light region, and the thickness dγ of the dielectric layer $1\_\gamma$ provided as an intermediate layer ideally satisfies equation (6). Namely, there is a large allowance on the thin layer side, but there is a small allowance on the thick layer side.

As described above, when the dielectric stacked film 1 is formed after a general wiring process, manufacture is simplified, and a new process may not be added, thereby causing an advantage in cost. In other words, the process for manufacturing the CMOS structure shown in FIG. 35 is simplified to exhibit a good effect. When the wiring process is performed after the dielectric stacked film 1 is formed, it may be difficult to remove the dielectric stacked film 1.

Further embodiments of the invention will be described below.

Figure 54:
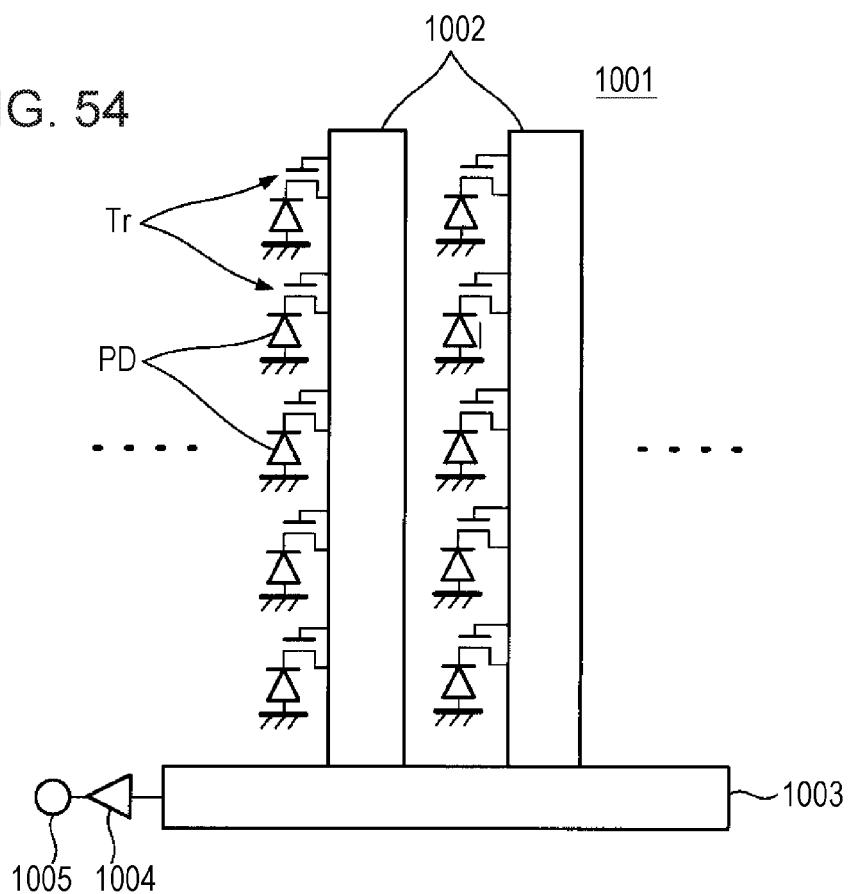
FIG. 54 is a schematic drawing (schematic plan view) showing the configuration of a solid-state imaging device according to a seventh embodiment of the invention.

FIG. 54 is a drawing (schematic plane view) showing a schematic configuration of a solid-state imaging device according to a seventh embodiment.

In this embodiment, a solid-state imaging device according to an embodiment is applied to a CCD solid-state imaging device.

In FIG. 54, reference numeral 1001 denotes a solid-state imaging device; reference numeral 1002, a CCD register; reference numeral 1003, a horizontal CCD register; and reference numeral 1004, an output amplifier.

In the solid-state imaging device 1001, photodiodes PD serving as light receiving parts are arranged in a matrix, and the vertical CCD registers 1002 extending vertically (in the longitudinal direction in the drawing) are provided for the respective columns of the light receiving parts (photodiodes PD). Also, the horizontal CCD register 1003 extending horizontally (the lateral direction of the drawing) is connected to the ends of the vertical CCD registers 1002. Furthermore, an output part 1005 is connected to an end of the horizontal CCD register 1003 through the output amplifier 1004.

Figure 55:
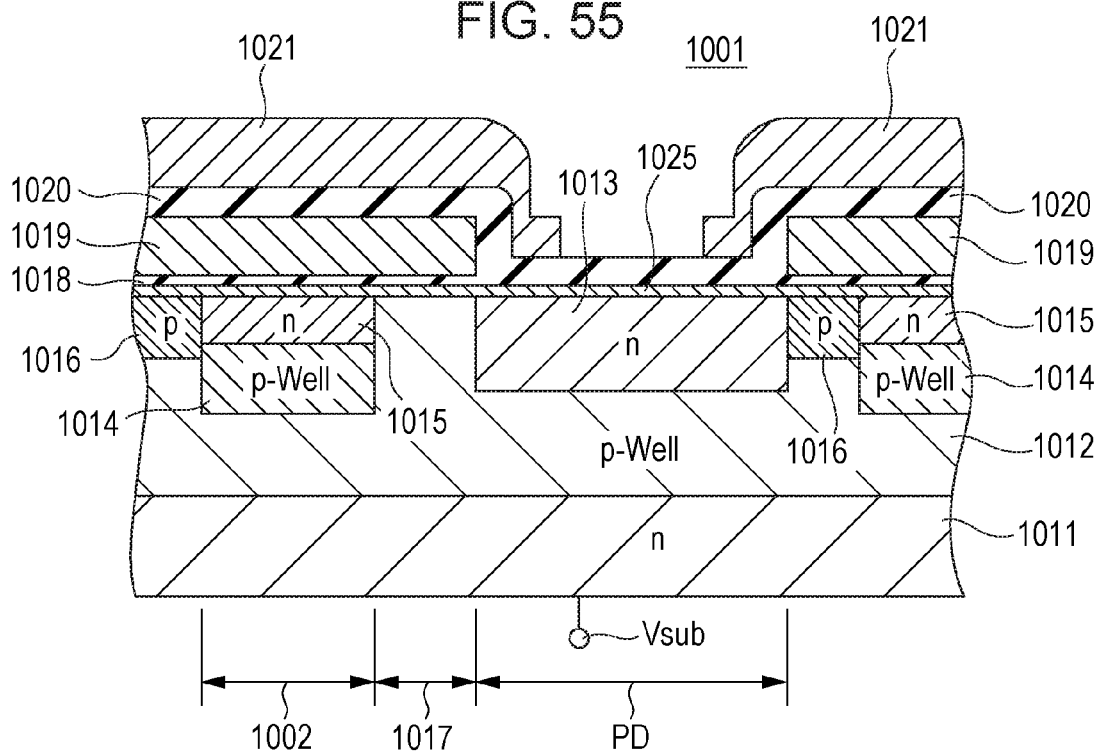
FIG. 55 is a sectional view of the solid-state imaging device shown in FIG. 54.

FIG. 55 is a sectional view of the solid-state imaging device 1001 including the light receiving parts shown in FIG. 54.

In FIG. 55, reference numeral 1001 denotes the solid-state imaging device; reference numeral 1002, the vertical CCD register; reference numeral 1011, a silicon substrate; reference numeral 1012, a p-type semiconductor well region; reference numeral 1013, a (n-type) charge storage region; reference numeral 1015, a transfer channel region; reference numeral 1019, a transfer electrode; reference numeral 1021, a light-shielding film; and reference numeral 1025, a single crystal layer. PD represents a photodiode.

As shown in FIG. 55, the p-type semiconductor well region 1012 is formed on the n-type silicon substrate 1011, and a semiconductor region in which the photodiodes PD and the vertical CCD registers 1002 are formed is formed in the p-type semiconductor well region 1012.

Each photodiode PD serves as a photoelectric transducer and includes the n-type charge storage region 1013 formed in an upper portion of the p-type semiconductor well region 1012, these regions 1012 and 1013 constituting each photodiode.

In each vertical CCD register 1002, the n-type transfer channel region 1015 to which signal charges are transferred is formed near the surface of the p-type semiconductor well region 1012, and a second p-type semiconductor well region 1014 is formed below the n-type transfer channel region 1015.

Also, a p-type channel stop region 1016 is formed between the n-type charge storage region 1013 of each photodiode PD and the right n-type transfer channel region 1015, for preventing signal charges from flowing into the right n-type transfer channel region 1015 from the n-type charge storage region 1013.

Furthermore, a read gate region 1017 is formed between the n-type charge storage region 1013 of each photodiode PD and the left n-type channel region 1015.

Furthermore, the transfer electrode 1019 composed of polycrystalline silicon is formed on the silicon substrate 1011 with a gate insulating film 1018 provided therebetween. The transfer electrode 1019 is formed over the read gate region 1017, the transfer channel region 1015, and the channel stop region 1016, and the transfer electrode 1019 has an opening formed above the charge storage region 1013 of each photodiode PD.

In the solid-state imaging device according to this embodiment, the single crystal layer 1025 composed of a material, for example, SiC or SiGeC, which has a wider band gap than that of silicon of the silicon substrate 1011, is bonded to the top of the silicon substrate 1011 on which the photodiodes (photoelectric transducers) of the light receiving parts are formed.

By providing the single crystal layer 1025, the dark current is significantly decreased, as compared with a general configuration.

As described above, when SiC or SiGeC is used for the single crystal layer 1025, the thickness of the single crystal layer 1025 is preferably 30 nm or less, for example, about 10 nm.

The single crystal layer 1025 may be formed by any one of the above-descried methods such as CVD and the like.

In the solid-state imaging device 1001 according to this embodiment, the single crystal layer 1025 composed of a material having a wider band gap than that of silicon of the silicon substrate 1011 is bonded to the silicon substrate 1011 on which the photodiodes PD are formed. Since the single crystal layer 1025 has a wider band gap, the barrier against electrons at the surface level is increased to decrease the dark current due to the electrons. For example, the dark current may be significantly decreased by 12 digits, and thus the S/N ratio of signals for incident light may be significantly increased.

As a result, even when the signal gain is increased for increasing sensitivity under imaging conditions such as a small quantity of incident light in a dark room or the like, an image without significant noise may be obtained.

Also, even when the solid-state imaging device 1001 has low sensitivity, a high-quality image may be obtained only by amplification with an amplifier regardless of the quantity of incident light.

Furthermore, even when the pixels of the solid-state imaging device 1001 made fine to decrease the quantity of incident light, a sufficient S/N ratio may be secured, and thus an image without significant noise may be obtained only by amplification with an amplifier for compensating for low sensitivity.

Therefore, by making the pixels in the solid-state imaging device 1001 fine, the number of pixels in the solid-state imaging device 1001 may be increased, and the solid-state imaging device may be decreased in size.

EXAMPLES

A solid-state imaging device 1001 according to this embodiment was actually formed and examined with respect to characteristics.

First, a solid-state imaging device 1001 including a SiC layer formed as a single crystal layer 1025 was formed.

The SiC layer was grown to a thickness of about 10 nm on a silicon substrate 1011 by, for example, a CVD method to form the single crystal layer 1025. In this step, for example, $C_3H_8$ and monosilane $SiH_4$ were used as raw materials, and the substrate temperature was 1100° C. or less.

The SiC layer may be formed by a method other than the CVD method. For example, the SiC layer may be grown by a laser abrasion method using SiC as a target material.

Next, the solid-state imaging device 1001 shown in FIGS. 54 and 55 was manufactured by a usual process for manufacturing a CCD solid-state imaging device.

In actual imaging with the solid-state imaging device 1001 manufactured, the dark current was significantly decreased, and an image without significant noise was obtained even by imaging under dark conditions.

Next, a solid-state imaging device 1001 including a SiGeC layer formed as a single crystal layer 1025 was formed.

First, a silicon substrate 1011 was dipped in a mixed solution of $NH_4OH$, $H_2O_2$, and $H_2O$ (mixing ratio of 1:1:5) for 10 minutes to wash the surface.

Then, the substrate was treated with HF ($HF:H_2O=1:50$) for 10 seconds to remove a native oxide film from the surface of the silicon substrate 1101.

In these steps, the surface of the silicon substrate 1011 was cleaned, for improving the crystallinity of subsequent crystal growth.

The silicon substrate 1011 from which the native oxide film was removed by the above-described pre-treatment was mounted on a substrate holder.

Next, the SiGeC layer was deposited as the single crystal layer 1025 on the silicon substrate 1011 by low-pressure CVD.

First, propane $C_3H_8$ was supplied at 450 μmol/min at a pressure of $1\times10^4$ Pa, a substrate temperature of 1150° C., and a hydrogen gas flow rate of 1 l/min, and this state was maintained for 2 minutes to carbonize the surface of the silicon substrate 1011.

Furthermore, monosilane $SiH_4$, $C_3H_8$, and $GeH_4$ were simultaneously supplied at 36 μmol/min, 59 μmol/min, and 10 μmol/min, respectively, to grown a SiGeC crystal on the silicon substrate for 30 seconds by low-pressure CVD. As a result, the SiGeC crystal as the single crystal layer 1025 was deposited to a thickness of about 10 nm.

Although, in this example, low-pressure CVD was used, the SiGeC layer may be formed by another method. For example, the crystal may be grown by a laser abrasion method using SiGeC as a target material or by a gas source MBE method using an organometallic material such as an organosilane material or the like.

Next, the solid-state imaging device 1001 shown in FIGS. 54 and 55 was manufactured by a usual process for manufacturing a CCD solid-state imaging device.

In actual imaging with the solid-state imaging device 1001 manufactured, the dark current was significantly decreased, and an image without significant noise was obtained even by imaging under dark conditions.

In the above embodiment, the single crystal layer 1025 is formed over the entire region of the silicon substrate 1011. However, the single crystal layer may be partially etched off by RIE (reactive ion etching) or the like excluding portions corresponding to the photodiodes PD, for improving electric characteristics. In this case, the photodiodes may be protected with a mask by photolithography before etching.

An embodiment relating to this case will be described below.

Figure 57:
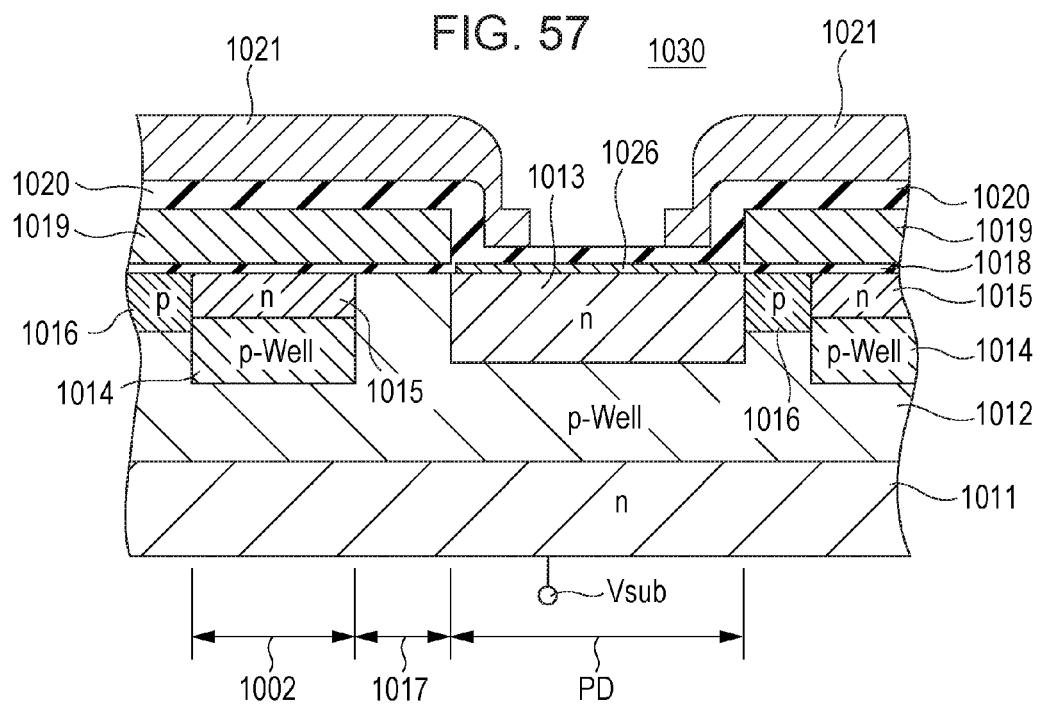
FIG. 57 is a schematic drawing (sectional view) showing the configuration of a solid-state imaging device according to another embodiment of the invention.

FIG. 57 is a drawing (sectional view) showing a schematic configuration of a solid-state imaging device according to another embodiment of the invention.

In FIG. 57, reference numeral 1030 denotes a solid-state imaging device; reference numeral 1002, a vertical CCD register; reference numeral 1011, a silicon substrate; reference numeral 1012, a p-type semiconductor well region; reference numeral 1013, a (n-type) charge storage region; reference numeral 1015, a transfer channel region; reference numeral 1019, a transfer electrode; reference numeral 1021, a light-shielding film; reference numeral 1026, a single crystal layer; and reference numeral 1051, a cell amplifier. PD represents a photodiode.

In the solid-state imaging device 1030 according to this embodiment, the single crystal layer 1026, for example, composed of SiC or SiGeC, is formed the surfaces of only the photodiodes PD of the silicon substrate 1011. The single crystal layer 1026 is boded to the silicon substrate 1011.

The other portions are the same as in the solid-state imaging device 1001 of the above-described embodiment, and are denoted by the same reference numerals and not described below.

The single crystal layer 1026 may be formed by depositing a film for the single crystal layer 1026 over the entire region, and then partially removing the film by etching such as RIE (reactive ion etching) to leave portions corresponding to the photodiodes PD.

In the configuration of the solid-state imaging device 1030 of this embodiment, the single crystal layer 1026 having a wider band gap than that of silicon of the silicon substrate 1011 is provided to be bonded to the photodiodes PD on the silicon substrate 1011. Since the single crystal layer 1026 has a wider band gap, the barrier against electrons at the surface level is increased to decrease the dark current due to the electrons. Furthermore, the dark current may be significantly decreased by 12 digits to significantly improve the S/N ratio of signals of incident light.

Therefore, even when the signal gain is increased for increasing sensitivity under imaging conditions such as a small quantity of incident light in a dark room or the like, an image without significant noise may be obtained.

Also, even when the solid-state imaging device 1030 has low sensitivity, a high-quality image may be obtained only by amplification with an amplifier regardless of the quantity of incident light.

Furthermore, even when the pixels of the solid-state imaging device 1030 is made fine to decrease the quantity of incident light, a sufficient S/N ratio may be secured, and thus an image without significant noise may be obtained only by amplification with an amplifier for compensating for low sensitivity.

Therefore, by making the pixels in the solid-state imaging device 1030 fine, the number of pixels in the solid-state imaging device 1030 may be increased, and the solid-state imaging device may be decreased in size.

A solid-state imaging device 1030 according to the embodiment shown in FIG. 57 was actually formed and examined with respect to characteristics.

Pre-treatment and deposition of a SiGeC layer were performed as described above to form a SiGeC layer as a single crystal layer 1026 on a silicon substrate 1011.

Next, SiGeC layer was partially removed by lithography and RIE technique to leave portions corresponding to photodiodes PD, thereby forming the single crystal layer 1026 composed of SiGeC only on the photodiodes PD.

Next, the solid-state imaging device 1030 shown in FIG. 57 was manufactured by a usual process for manufacturing a CCD solid-state imaging device.

In actual imaging with the solid-state imaging device 1030 manufactured, the dark current was significantly decreased, and an image without significant noise was obtained even by imaging under dark conditions.

Alternatively, the single crystal layer may be formed only on the photodiodes PD using a mask.

For example, the silicon substrate 1011 is covered with a mask except portions other than the photodiodes PD, and the surface of the silicon substrate 1011 is carbonized. As a result, the single crystal layer is formed only on the photodiodes PD.

Figure 58:
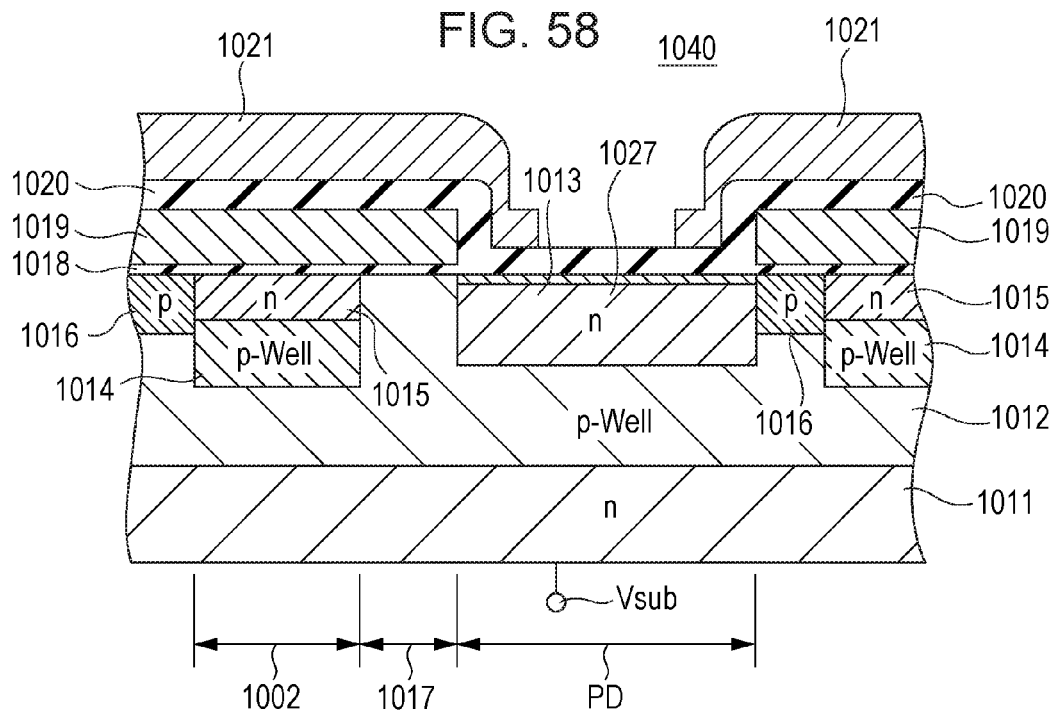
FIG. 58 is a schematic drawing (sectional view) showing the configuration of a solid-state imaging device including a single crystal layer formed by a method different from that used for the solid-state imaging device shown in FIG. 57.

FIG. 58 is a drawing (sectional view) showing a schematic configuration of a solid-state imaging device including a single crystal layer formed by a method different from that for the solid-state imaging device shown in FIG. 57.

In FIG. 58, reference numeral 1040 denotes a solid-state imaging device; reference numeral 1002, a vertical CCD register; reference numeral 1011, a silicon substrate; reference numeral 1012, a p-type semiconductor well region; reference numeral 1013, a (n-type) charge storage region; reference numeral 1015, a transfer channel region; reference numeral 1019, a transfer electrode; reference numeral 1021, a light-shielding film; and reference numeral 1027, a single crystal layer. PD represents a photodiode.

As shown in a sectional view of FIG. 58, the solid-state imaging device 1040 is different from that shown in FIG. 57 in that the single crystal layer 1027 is formed on the photodiodes PD so as to enter the silicon substrate 1011.

In each of the above-described embodiments, the single crystal layer 1025, 1026, or 1027 composed of SiC or SiGeC is formed on the silicon substrate 1101. However, another material having a wider band gap than that of silicon of the silicon substrate 1101 may be used for the single crystal layer.

Examples of a material other then SiC having a wider band gap than that of silicon are listed below together with the lattice constants. All materials listed below have the same cubic system as silicon Si. This is because the same cubic system is preferred for epitaxial growth on silicon.

| Material | Band gap Eg (eV) | Lattice constant (Å) |
| --- | --- | --- |
| GaAs | 1.43 | 5.654 |
| AlAs | 2.16 | 5.66 |
| GaN | 3.27 | 4.55 |
| AlN | 6.8 | 4.45 |
| ZnSe | 2.67 | 5.667 |
| ZnS | 3.70 | 5.41 |
| MgSe | 3.6 | 5.62 |
| MgS | 4.5 | 5.89 |

Herein, GaAs, AlAs, GaN, and AlN are group III-V element compound semiconductors, and may be used as an AlGaAs ternary mixed crystal or AlGaN ternary mixed crystal. Other group III-V compound semiconductors include an AlGaInP quaternary mixed crystal and the like.

Also, ZnSe and ZnS are group 1'-VI compound semiconductors and may be used as a ZnMgSSe quaternary mixed crystal. Other group II-VI compound semiconductors include a ZnMgO ternary mixed crystal and the like.

The present invention may be applied to a solid-state imaging device including photoelectric transducers formed in a semiconductor layer other than a silicon layer.

For example, the present invention may be applied to a solid-state imaging device including photoelectric transducers (photodiodes) formed in a compound semiconductor layer.

In order to detect infrared light in a wavelength region of 0.9 μm to 1.7 μm, a compound such as GaInAs is used for a semiconductor layer in which photoelectric transducers are formed.

In order to detect infrared light in a wavelength region of 3 μm to 5 μm, a compound such as InSb or PtSi is used for a semiconductor layer in which photoelectric transducers are formed.

In order to detect infrared light in a wavelength region of 8 μm to 14 μm, a compound such as HgCdTe is frequently used for a semiconductor layer in which photoelectric transducers are formed.

The detection of these wavelength regions permits the invention to be applied to, for example, a photodiode for silica glass fiber optical communication and a solid-state imaging device (commonly called "infrared thermography") for obtaining temperature information.

When any one of these materials is used for a semiconductor layer in which photoelectric transducers are formed, a single crystal layer having a wide band gap is bonded to the surface of a silicon substrate because of the wide band gap of the material, thereby causing the same effect of decreasing the dark current as that of bonding between a silicon substrate and a SiC compound.

The material of the single crystal layer is not limited the compound semiconductors, and the invention may be applied to a case in which photoelectric transducers (photodiodes) are formed in a semiconductor layer composed of a group IV element other than silicon, for example, Ge.

In each of the above-described embodiments, the invention is applied to a CCD solid-state imaging device. However, the invention may be applied to other types of solid-state imaging devices, for example, a CMOS solid-state imaging device.

Figure 59:
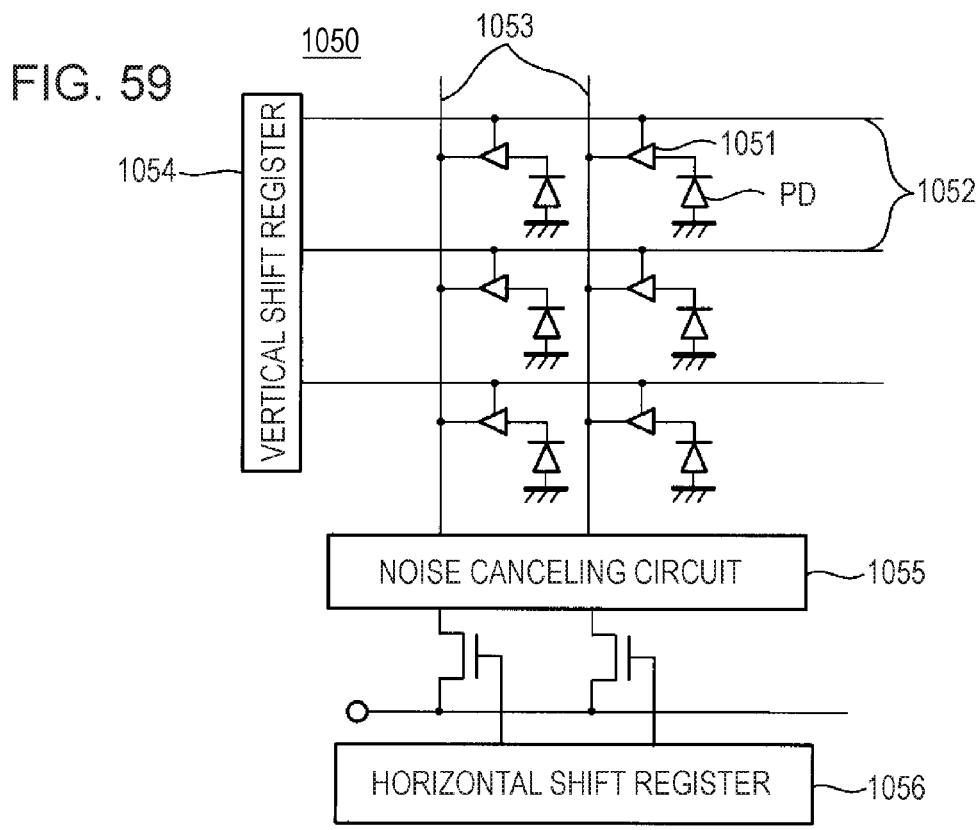
FIG. 59 is a schematic drawing (schematic plan view) showing the configuration of a solid-state imaging device according to a further embodiment of the invention.

FIG. 59 is a drawing (schematic plan view) showing a schematic configuration of a solid-state imaging device according to a further embodiment of the invention. In this embodiment, the invention is applied to a CMOS solid-state imaging device.

In FIG. 59, reference numeral 1050 denotes a solid-state imaging device; reference numeral 1051, a cell amplifier; reference numeral 1052, a vertical signal line; reference numeral 1053, a horizontal signal line; reference numeral 1054, a shift register; reference numeral 1055, a noise canceling circuit; and reference numeral 1056, a horizontal shift register. PD represents a photodiode.

As shown in FIG. 59, the solid-state imaging device 1050 includes the photodiodes PD serving as light receiving parts which are arranged in a matrix and each of which is connected to the corresponding signal lines 1052 and 1053 through the cell amplifier 1051. The signal lines include the vertical signal lines 1052 connected to the vertical shift register 1054, and the horizontal signal lines 1053. The photodiode PD of each pixel is provided near each of the intersections of the signal lines 1052 and 1053.

The horizontal signal lines 1053 are connected to a signal line for outputting signal voltages through the noise canceling circuit 1055 and MOS transistors shown in a lower portion of the drawing.

The gates of the MOS transistors are connected to the horizontal shift register 1056 so that the MOS transistors are turned on and off by the horizontal shift register 1056.

Although not shown in the drawing, in this embodiment, a single crystal layer is provided on at least the photodiodes PD formed in a semiconductor layer in which the photodiodes PD and the source and drain regions of the MOS transistors are formed, the single crystal layer having a wider band gap than that of the semiconductor layer.

As a result, like in each of the above-described embodiments in which the invention is applied to the CCD solid-state imaging device, the dark current may be significantly decreased, and even when the pixels of the solid-state imaging device 1050 is made fine to decrease the quantity of incident light, a sufficient S/N ratio may be secured. Therefore, a satisfactory image without significant noise may be obtained only by amplification with an amplifier for compensating for low sensitivity.

Therefore, by making the pixels in the solid-state imaging device 1050 fine, the number of pixels in the solid-state imaging device 1050 may be increased, and the solid-state imaging device may be decreased in size.

Furthermore, the invention may be applied not only to a configuration in which photoelectric transducers such as photodiodes are arranged in a matrix but also to a configuration in which pixels including photoelectric transducers are arranged in a staggered form (checked pattern) and a configuration in which pixels are arranged in a line or a plurality of lines (line sensor or the like).

The invention may be applied not only to a solid-state imaging device but also to a light-receiving device including photodiodes (photoelectric transducers) formed in a single crystal semiconductor layer.

For example, the invention may be applied to a photodiode, a PIN photodiode, or a Schottky sensor which is used as a high-performance sensor with low noise.

Furthermore, a light receiving device according to an embodiment of the invention and a light receiving device such as a semiconductor laser or a light-emitting diode may be mounted on a common substrate to form a hybrid structure, or a semiconductor substrate may also be used as a semiconductor layer to form a monolithic optical device.

In order to manufacture a light receiving device or a solid-state imaging device according to an embodiment of the invention, a step of forming a semiconductor region for forming photoelectric transducers and other semiconductor regions in a semiconductor layer, and a step of forming a polycrystalline layer may be performed in any desired order.

The invention is not limited to the above-described embodiments, and various modifications may be made within the range of the gist of the invention.

Arrangement of Color Separation Filter

First Example

FIGS. 41A, 41B, and 41C are drawings showing a first example of arrangement of color separation filters. In the first example, a detection region for removing visible light and receiving and detecting only infrared light and a detection region for visible color imaging are provided.

FIG. 41A shows a mosaic arrangement of respective color filters, i.e., a Bayer arrangement of basic color filters. Namely, a pixel part has a configuration in which a repeat unit of color separation filters include 2×2 pixels so that unit pixels in a square lattice correspond to three color filers of red (R), green (G), and blue (B). In order to provide the detection part (detection region) for removing visible light and receiving and detecting only infrared light, one of two green filters is replaced by a black filter BK. In other words, the four types of color filters having respective filter characteristics are regularly arranged for visible color imaging, the color filters including filters for the wavelength regions (color components) of the primary colors R, G, and B and the black filter BK for infrared light different from the components of the primary color filters R, G, and B.

For example, first color pixels for detecting a first color (red; R) are arranged in even-numbers rows and odd-numbers columns, second color pixels for detecting a second color (green; G) are arranged in odd-numbered rows and odd-numbered columns, third color pixels for detecting a third color (blue; B) are arranged in odd-numbers rows and even-numbers columns, and fourth color pixels (black correction pixels) for detecting infrared light IR are arranged in even-numbered rows and even-numbered columns. Therefore, G/B pixels or R/BK pixels are arranged in a checked pattern. In such a Bayer arrangement of basic color filters, G/B or R/BK two colors are repeated in both the row direction and the column direction.

Therefore, a visible color image is obtained by detection with the corresponding detection region through the primary color filters R, G, and B, and an infrared image is obtained by detection with the corresponding detection region through the black filter BK independently of the visible color image and at the same time as the visible color image. The detection portions (detection elements) in which the primary color filters R, G, and B are respectively disposed separate a visible light region, which is a transmitted wavelength region, into wavelengths and detects the respective components.

Although, in this example, the primary color filters 14R, 14G, and 14B are used as colors filters 14 for visible color imaging, complementary color filters Cy, Mg, and Ye may be used. The detection portions (detection elements) in which the complementary color filters Cy, Mg, and Ye are respectively disposed separate a visible light region, which is a transmitted wavelength region, into wavelengths and detects the respective components. In this case, for example, as shown in FIG. 41B, the primary color filters 14R, 14G, and 14B may be replaced by the yellow filter Ye, the magenta filter Mg, and the Cyan filter Cy, respectively. In addition, one of two magenta colors in a diagonal direction may be replaced by a black filter BK for a correction pixel.

In this case, a dielectric stacked film 1 is formed on each of pixels 12Cy, 12Mg, and 12Ye excluding a pixel in which the black filter is disposed, and the complementary color filters 14Cy, 14Mg, and 14Ye are further provided on the respective dielectric stacked films 1. Namely, light components of cyan Cy, magenta Mg, and yellow Ye in visible light VL are received through the corresponding complementary color filters 14Cy, 14Mg, and 14Ye, respectively. Since the dielectric stacked film 1 is formed on the detection portion of each of the pixels in which the complementary color filters are disposed, there is the function to effectively cut infrared light.

Instead of a combination of complementary color filters Cy, Mg, and Ye, a combination of a green filter G, which is one of the primary color filters, and a white filter W may be used. In this case, pixels of a black filter BK which serve as correction pixels may also be provided. For example, as shown in FIG. 41C, in a field storage frequency interleave system in which two complementary color filters Cy and Mg and a green color filter G as a primary color filter are combined, one of two primary color filters G in four pixels may be replaced by a black color filter BK for correction pixels.

<First Example of Sensor Structure; Corresponding to CCD>

Figure 42:
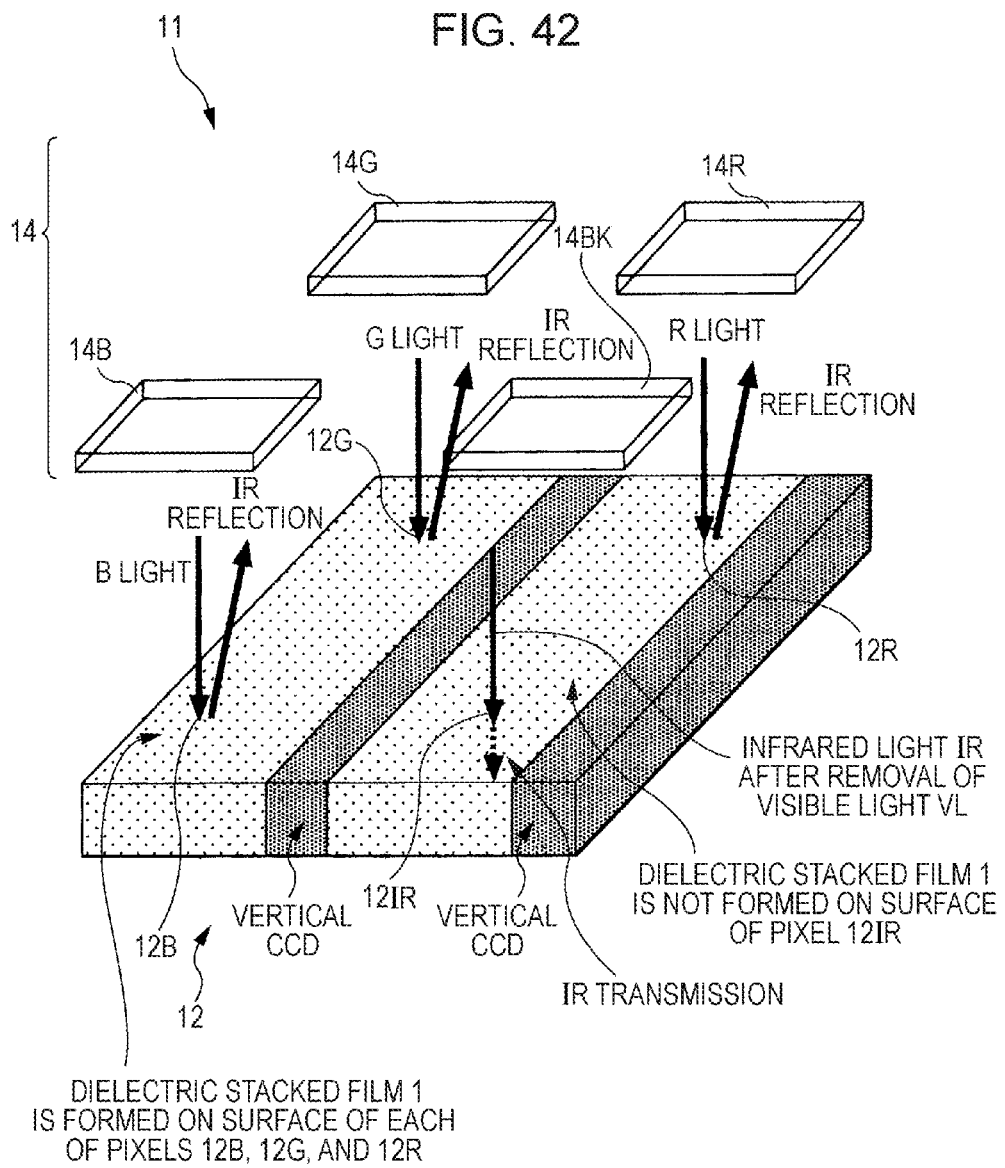
FIG. 42 is a drawing (perspective view) illustrating an example of a configuration of a CCD solid-state imaging device having the arrangements of color separation filters shown in FIGS. 41A, B, and C.
Figure 43:
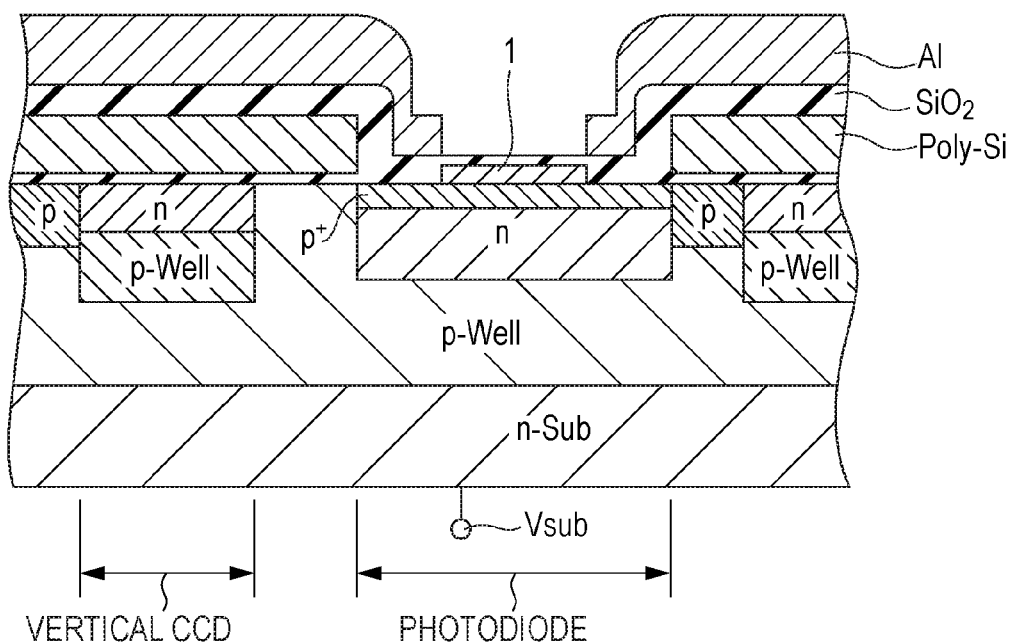
FIG. 43 is a drawing (sectional structural drawing) illustrating an example of a configuration of a CCD solid-state imaging device capable of separately imaging the two wavelength components, i.e., infrared light and visible light, at the same time.

FIGS. 42 and 43 are drawings illustrating a CCD solid-state imaging device having the arrangement of color separation filters shown in FIGS. 41A, 41B, and 41C so that images of the two wavelength components of infrared light IR and visible light VL are separately taken at the same time. FIG. 42 is a sketch (perspective view) showing an example of a structure, and FIG. 43 is a drawing showing a sectional structure near a substrate surface. The two drawings show an example of application to a CCD solid-state imaging device 101 using a dielectric stacked film 1.

In the drawings, reference numeral 1 denotes the dielectric stacked film; reference numeral 11, a spectral image sensor; and reference numeral 12, a unit pixel matrix.

In the structure of the CCD solid-state imaging device shown in FIG. 42, only the unit pixel matrix 12 including four pixels is shown. However, in fact, the unit pixel matrix 12 is repeated in the lateral direction and the longitudinal direction.

Among the four pixels in the periodic arrangement of the unit pixel matrix 12, the dielectric stacked film 1 is not formed in a pixel 12IR, but a black filter 14BK is provided in a pixel 12Ir so that only infrared light IR is received through the black filter 14Bk. Namely, the black filter 14Bk is used as a color filter 14 in the pixel 12IR for infrared light IR, and thus visible light VL is cut off, and only infrared light IR is received. The pixel 12IR in which the black filter 14Bk is disposed is also referred to as the "black pixel 12BK".

On the other hand, the dielectric stacked film 1 is provided on each of the other pixels 12B, 12G, and 12R, and primary color filters 14R, 14G, and 14B are further provided thereon so that the primary color components of blue B, green G, and red R in visible light VL are received through the corresponding primary color filters 14B, 14G, and 14R, respectively. Namely, the dielectric stacked film 1 is formed on the detection portion of each of the pixels in which the primary color filters are respectively disposed, and thus there is the function to effectively cut off infrared light. The circuit configuration used is as shown in FIG. 29.

FIG. 43 showing a sectional structure near a substrate surface shows a pixel which receives only visible light VL. A pixel 12IR which receives infrared light IR has a structure not including the dielectric stacked film 1 and the black filter 14BK. Namely, as in the manufacturing process shown in FIGS. 33A to 33F, a SiN film and a SiO$_2$ film are successively deposited by a CVD method to form a dielectric stacked film having the structure shown in FIG. 13. Then, the dielectric stacked film is removed only from a pixel receiving infrared light by lithography and a RIE method. Then, a SiO$_2$ layer is again deposited to planarize the surface.

By using an imaging device having the above-described structure, a visible color image based on the primary color components and an infrared image are simultaneously obtained. In other words, when the black filter 14BK which absorbs only visible light VL is provided as a color filter 14C, visible light VL is absorbed by the black color filter 14BK, and thus an infrared IR image is obtained on the basis of image data from the pixels 12IR for infrared light IR.

Arrangement of Color Separation Filter

Second Example

FIGS. 44A, 44B, and 44C are drawings showing a second example of arrangement of color separation filters. In the second example, a detection region for receiving and detecting all wavelength components of visible light together with infrared light and a detection region for visible color imaging are provided.

FIG. 44A shows a Bayer arrangement of basic color filters. Namely, a pixel part has a configuration in which a repeat unit of color separation filters include 2×2 pixels so that unit pixels in a square lattice correspond to three color filers of red (R), green (G), and blue (B). In order to provide the detection part (detection region) for receiving and detecting all wavelength components of visible light together with infrared light, one of two green filters is replaced of a white filter W. In other words, the four types of color filters having respective filter characteristics are regularly arranged for visible color imaging, the color filters including filters for the wavelength regions (color components) of the primary colors R, G, and B and the white filter W for infrared light different from the components of the primary color filters R, G, and B.

A white pixel in which the white filter W is disposed transmits all wavelength components ranging from visible light to infrared light (particularly near-infrared light). From this viewpoint, in fact, color filters may not be provided.

For example, first color pixels for detecting a first color (red; R) are arranged in even-numbers rows and odd-numbers columns, second color pixels for detecting a second color (green; G) are arranged in odd-numbered rows and odd-numbered columns, third color pixels for detecting a third color (blue; B) are arranged in odd-numbers rows and even-numbers columns, and fourth color pixels (white pixels) for detecting infrared light IR are arranged in even-numbered rows and even-numbered columns. Therefore, G/B pixels or R/W pixels are arranged in a checked pattern. In such a Bayer arrangement of basic color filters, G/B or R/W two colors are repeated in both the row direction and the column direction.

Therefore, a visible color image is obtained by detection with the corresponding detection regions through the primary color filters R, G, and B, and an infrared image or a mixed image of infrared light and visible light is obtained by detection with the corresponding detection region through the white filter W independently of the visible color image and at the same time as the visible color image. For example, by using pixel data from the pixels 12IR which receive a mixed component of visible light VL and infrared light IR, an image of the mixed component of visible light VL and infrared light IR is obtained, and the sensitivity is increased. Also, both an image of the mixed component of visible light VL and infrared light IR and a visible VL image are obtained. However, only an infrared IR image may be obtained using a difference between both images.

Although, in this example, the primary color filters 14R, 14G, and 14B are used as colors filters 14 for visible color imaging, complementary color filters Cy, Mg, and Ye may be used. In this case, for example, as shown in FIG. 44B, the primary color filters 14R, 14G, and 14B may be replaced by the yellow filter Ye, the magenta filter Mg, and the cyan filter Cy, respectively. In addition, one of two magenta colors in a diagonal direction may be replaced by a white filter W for infrared imaging.

In this case, a dielectric stacked film is formed on each of pixels 12Cy, 12Mg, and 12Ye excluding a pixel in which the white filter is disposed, and the complementary color filters 14Cy, 14Mg, and 14Ye are further provided on the respective dielectric stacked films 1. Namely, light components of cyan Cy, magenta Mg, and yellow Ye in visible light VL are received through the corresponding complementary color filters 14Cy, 14Mg, and 14Ye, respectively. Since the dielectric stacked film 1 is formed on the detection portion of each of the pixels in which the complementary color filters are disposed, there is the function to effectively cut infrared light.

Instead of a combination of complementary color filters Cy, Mg, and Ye, a combination of a green filter G, which is one of the primary color filters, and a complementary filter may be used. In this case, pixels of a white filter W which serve as correction pixels may also be provided. For example, as shown in FIG. 44C, in a field storage frequency interleave system in which two complementary color filters Cy and Mg and a green color filter G as a primary color filter are combined, one of two primary color filters G in four pixels may be replaced by a white color filter W for correction pixels.

Since the white correction pixels 12W have sensitivity in a wide wavelength region from visible light VL and infrared light IR, a signal is easily saturated as compared with pixels for visible color imaging (pixel in which a primary color filter is disposed), and the saturation phenomenon becomes a problem, particularly, in imaging in a bright environment. Specifically, in a bright environment, a proper infrared image is not obtained.

In order to solve the problem of saturation, the detection time of the detection part in which the white filter W is disposed may be controlled by the drive control part 146. For example, in a bright environment, high-speed imaging may be performed by exposure control using a shutter function (including a mechanical shutter and an electronic shutter). For example, exposure of an imaging device may be performed with a short period to read pixel signals from the imaging device (particularly, the detection part), and the pixel signals may be transmitted to the image signal processing part 140.

In this case, exposure and signal reading are performed at a rate higher than, for example, 60 frames/second, to cause an increased effect on the saturation. Alternatively, signal reading may be simply performed within a time (storage time) shorter than 0.01667 second. In this case, charge signals may be discharged to the substrate side using overflow so that stored charges are effectively read within a short time.

More preferably, exposure and signal reading are performed at a rate higher than 240 frames/second to further improve the effect on the saturation. Alternatively, signal reading may be simply performed within a time (storage time) shorter than 4.16 milliseconds.

The pixels from which charges are read within a short time (storage time) so as to prevent saturation may be limited to the correction white pixels 12W or may be all pixels including the other pixels (primary color pixels in which the primary color filters are respectively disposed) for visible color imaging.

Alternatively, signals read within a short exposure time may be integrated two times to convert weak signals in a dark place to strong signals, thereby increasing the S/N ratio. In this case, for example, proper sensitivity and a high S/N ratio are obtained by imaging in both a dark environment and a bright environment, thereby extending the dynamic range. Namely, saturation in the white correction pixels 12W is prevented by high-speed imaging, and a wide dynamic range is achieved by integration of signals.

<Second Example of Sensor Structure; Corresponding to CCD>

Figure 45:
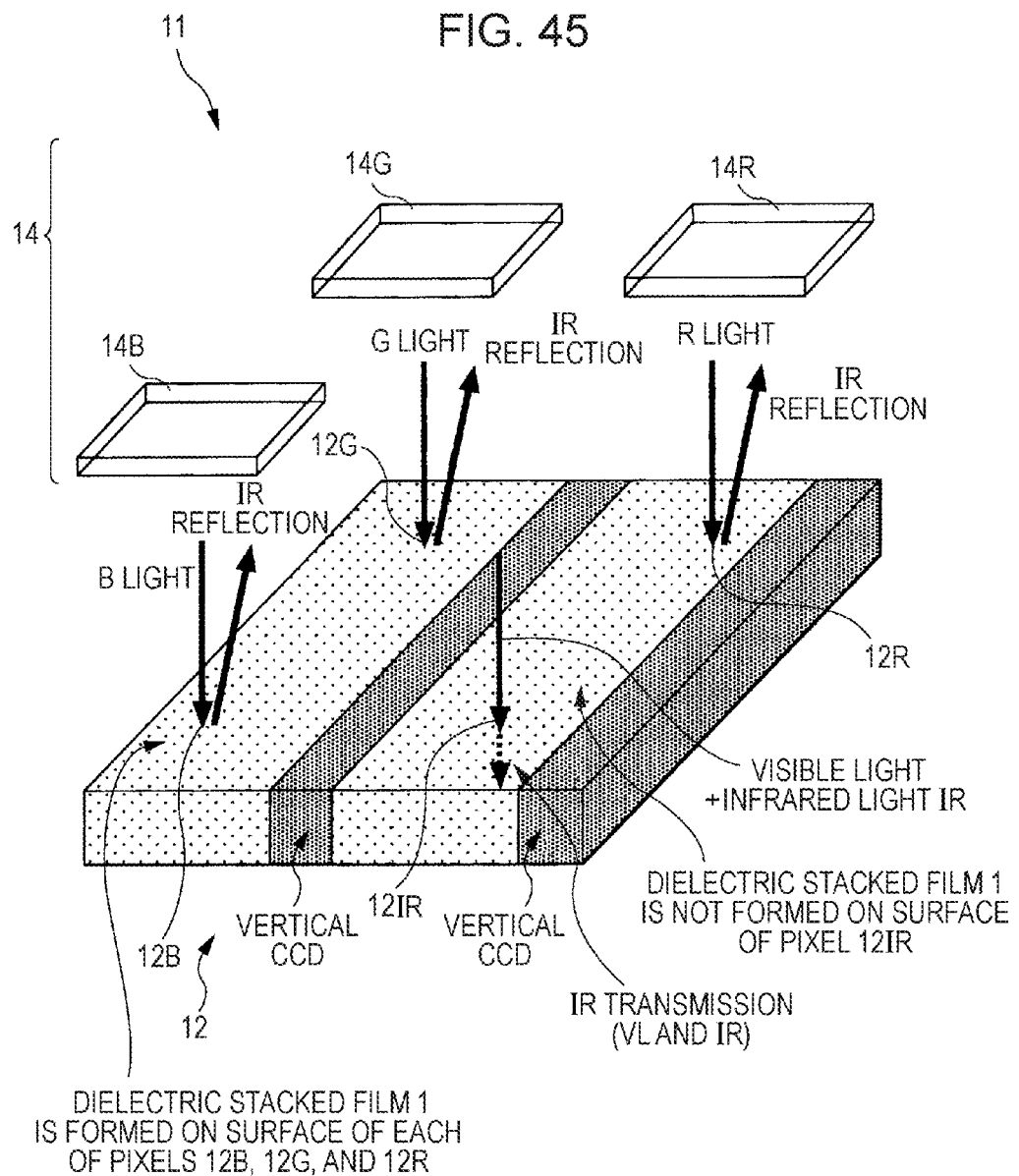
FIG. 45 is a drawing (perspective view) illustrating an example of a configuration of a CCD solid-state imaging device having the arrangements of color separation filters shown in FIGS. 44A, B, and C.

FIG. 45 is a drawing illustrating a CCD solid-state imaging device which has the arrange of color separation filters shown in FIGS. 44A, 44B, and 44C so that images of two wavelength components of visible light VL and infrared light IR are separately obtained at the same time. FIG. 45 is a sketch (perspective view) which shows an example of application to a CCD solid-state imaging device 101 using a dielectric stacked film. A sectional structure near a substrate surface is the same as in FIG. 43.

In the structure of the CCD solid-state imaging device 101 shown in FIG. 45, only a unit pixel matrix 12 including four pixels is shown. However, in fact, the unit pixel matrix 12 is repeated in the lateral direction and the longitudinal direction.

Among the four pixels in the periodic arrangement of the unit pixel matrix 12, the dielectric stacked film 1 is not formed in a pixel 12IR, and a color filter 14 is not provided in a pixel 12Ir so that infrared light IR is received without being passed through the color filter 14. In this case, the pixels 12IR receive a mixed component of infrared light IR and visible light VL. The pixels 12IR in each of which the color filter 14 is not provided are referred to as "white pixels 12W" or "whole-range transmitting pixels".

In each of the pixels 12IR in which the dielectric stacked film 1 is not formed, the color filter 14 is not disposed in the white pixel 12W so that both infrared light IR and visible light VL simultaneously contribute to signals. In this case, the pixels 12IR for infrared light IR function as pixels not only for infrared light IR but also for both infrared light IR and visible light VL.

On the other hand, the dielectric stacked film 1 is provided on each of the other pixels 12B, 12G, and 12R, and primary color filters 14R, 14G, and 14B are further provided thereon so that the primary color components of blue B, green G, and red R in visible light VL are received through the corresponding primary color filters 14B, 14G, and 14R, respectively. Namely, the dielectric stacked film 1 is formed on the detection portion of each of the pixels in which the primary color filters are respectively disposed, and thus there is the function to effectively cut off infrared light. As the primary color filters 14R, 14G, and 14B used in the second embodiment, the first example shown in FIG. 46A may be used. The circuit configuration used is as shown in FIG. 29.

By using an imaging device having the above-described structure, a visible color image based on the primary color components and an infrared IR image or a mixed image of infrared light IR and visible light VL are simultaneously obtained. For example, an image of a mixed component of infrared light IR and visible light VL may be obtained using pixel data from the pixels 12IR which receive a mixed component of infrared light IR and visible light VL, thereby increasing the sensitivity. Also, both an image of a mixed component of infrared light IR and visible light VL and a visible VL image are obtained, but only an infrared IR image may be obtained by using a difference between both images.

Although not shown in the drawing, a white filter 14W may be replaced by a green filter which transmits a G color component in the visible region and an infrared component and cuts off the other components (B component and R component in the visible region). Namely, a detection region for receiving and detecting infrared light and a specified wavelength component in visible light may be provided.

In this case, an image of a mixed component of infrared light IR and a specified wavelength component in visible light VL may be obtained using pixel data from the pixels 12IR which receive a mixed component of infrared light IR and the specified wavelength component in visible light VL, thereby increasing the sensitivity. Also, both an image of a mixed component and a visible VL image are obtained, but only an infrared IR image may be obtained by using a difference between infrared light IR and the specified wavelength component in visible light VL.

<Other Examples of Arrangement of Color Separation Filter>

FIGS. 46 to 52 are drawings illustrating a pixel arrangement conscious of a decrease in resolution. With respect to a pixel arrangement, when the arrangement shown in FIG. 41 or 44 is used, pixels for detecting infrared light (or mixture of infrared light and visible light) are added to pixels for visible light in which RGB ordinary primary color filters or CyMgYe complementary color filters (or a primary color filter G) are disposed.

For example, green pixels G or magenta pixels Mg for visible color imaging are replaced by black correction pixels, white pixels, green correction pixels, or magenta correction pixels, thereby possibly decreasing resolution of any of a visible color image and an infrared image. For example, when one G pixel in an ordinary Bayer arrangement is replaced by a red pixel, resolution is decreased. However, when a correction pixel and a pixel (for example, a green pixel G) for a wavelength component which greatly contributes to resolution are appropriately arranged, the problem of resolution may be resolved.

In this case, it is important that like in a ordinary structure, in a color separation filter arrangement in which color filters are arranged in a mosaic pattern, pixels for infrared light (for mixture of infrared light and visible light) may be arranged in a mosaic pattern with a predetermined lattice spacing, and pixels of one color of primary colors RGB of visible light or complementary colors Cy, Mg, and Ye may be arranged in a mosaic pattern with a predetermined lattice spacing.

The mosaic pattern means that pixels of one color are arranged in a lattice form with a predetermined lattice spacing, and pixels of one color may not be adjacent to each other. In a typical example of a pixel arrangement in which pixels of one color are adjacent to each other, square pixels of infrared light and square pixels of other colors are alternatively arranged in a grid pattern (checked pattern). Alternatively, square pixels of one of the primary colors RGB of visible light or one of the complementary colors CyMgYe and squired pixels of the other colors are alternately arranged in a grid pattern (checked pattern).

<Example of Application to Primary Color Filter>

For example, in order to suppress a decrease in resolution of a visible color image using RGB primary color filters, the arrangement density of G pixels in the visible region may be maintained, and pixels of R or B of the visible region may be replaced by correction black pixels, white pixels, or green pixels. For example, as shown in FIGS. 46A and B, in a 2×2 unit pixel matrix 12 including, color pixels G for detecting a green component in the visible region are arranged in odd-numbered rows and odd-numbered columns and even-numbered rows and even-numbered columns, and correction black pixels (FIG. 46A), white pixels (FIG. 46B), or green pixels (not shown) are arranged in even-numbered rows and odd-numbered columns.

In addition, in the unit pixel matrixes 12 in an odd-numbered column, color pixels B for detecting a blue component in the visible region are disposed at an odd-numbered row and at even-numbered column in an odd-numbered unit pixel matrix 12 in the column direction, and color pixels R for detecting a red component of the visible region are arranged disposed at an odd-numbered row and at even-numbered column in an even-numbered unit pixel matrix 12 in the column direction. In the unit pixel matrixes 12 in an even-numbered column, the color pixels b and the color pixels R are disposed in an arrangement opposite to the above. As a whole, the repeat cycles of the color filters 14 are completed by the 2×2 unit pixel matrix 12.

Figure 46A:
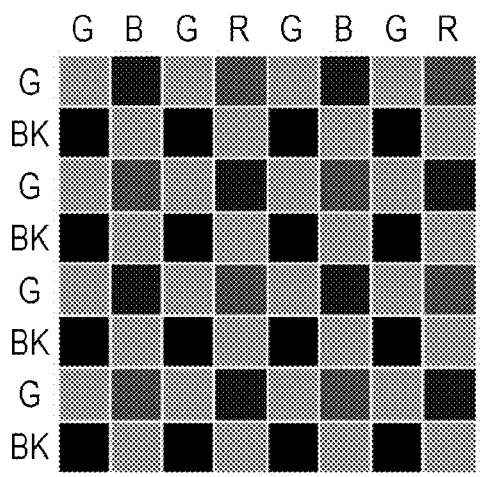
FIGS. 46A and 46B are drawings illustrating a first example of pixel arrangements conscious of a decrease in resolution.
Figure 46B:
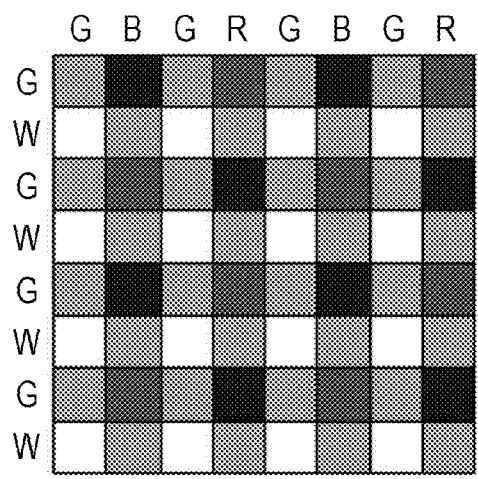
Figure 47:
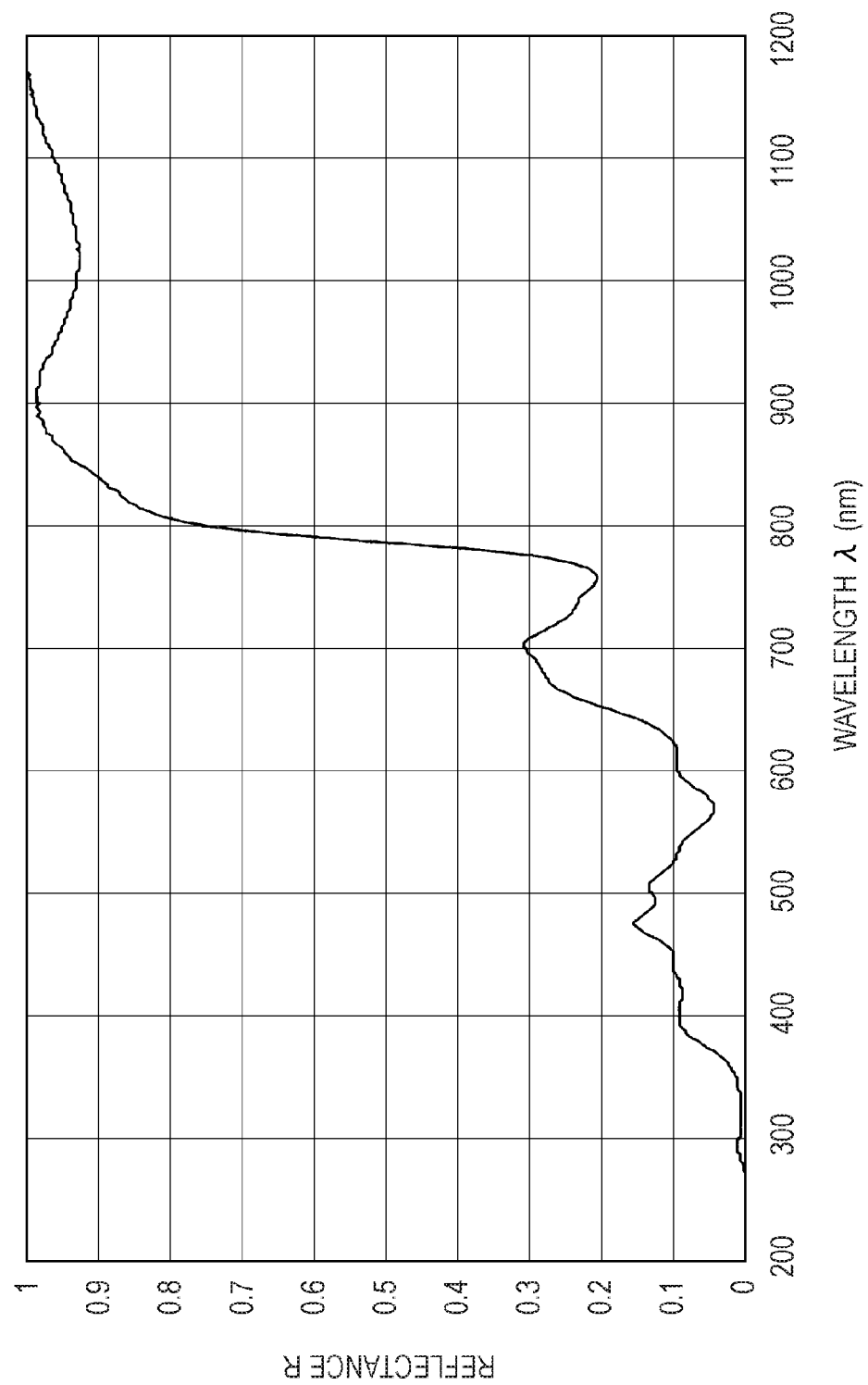
FIG. 47 is a diagram showing an example of the transmission spectral characteristics of a black filter.

In the arrangement shown in FIGS. 46A and 46B, pixels of one of the primary colors RGB of visible light and pixels of the other colors are alternately arranged in a checked pattern. In this arrangement, the density of color pixels G greatly contributing to the resolution of a visible color image may be set to the same as in a Bayer arrangement, thereby preventing a decrease in resolution of a visible color image.

However, the arrangement density of color pixels R and color pixels B is ½ of that of the Bayer arrangement, and thus color resolution is decreased. However, human visibility for red R and blue B is lower than that for green G, the decrease in color resolution is not a large problem. On the other hand, in an infrared image using correction pixels, the arrangement density of the correction pixels is ½ of that of color pixels G for detecting a green component in the visible region, and thus the resolution is lower than that of a visible color image.

For example, a CMOS solid-state imaging device (pixel circuit configuration shown in FIG. 31) having the layer structure shown in FIG. 31 (sectional structure corresponding to pixels for receiving visible light being as shown in FIG. 35) was experimentally manufactured by the manufacturing process shown in FIGS. 33A to 33F. In the CMOS solid-state imaging device, a black filter 14BK having the transmission spectral characteristics shown in FIG. 47 was used, and black correction pixels were arranged in the pattern shown in FIG. 46A. As a result, it was found that a high-resolution color image of the primary colors and an infrared image with relatively high resolution lower than that of the color image are simultaneously obtained.

In addition, a CMOS solid-state imaging device (pixel circuit configuration shown in FIG. 31) having the layer structure shown in FIG. 37 (sectional structure corresponding to pixels for receiving visible light being as shown in FIG. 35) was experimentally manufactured by the manufacturing process shown in FIGS. 33A to 33F. In the CMOS solid-state imaging device, white pixels were arranged in the pattern shown in FIG. 46B. As a result, it was found that a high-resolution color image of the primary colors and an image of a mixed component of infrared light and visible light are simultaneously obtained, the image of the mixed component having relatively high resolution lower than that of the color image. It was also found that an infrared image is simultaneously obtained by decreasing the intensity of blue, red, and green detected by the primary color pixels R, G, and B, respectively, for visible light.

In order to prevent saturation, all pixels may be exposed within a short time to read charge signals, and signals read within a shorter time may be integrated two times, thereby converting to large signals. Therefore, even in a dark environment or bright environment, proper sensitivity is obtained, and the dynamic range is extended.

Furthermore, a structure in which such a black correction pixel as shown in FIG. 46A and a multilayer film are combined, or a structure in which such a white pixel as shown in FIG. 46B and a multilayer film are combined exhibits the same effect on the CCD structure shown in FIG. 43 and on the CMOS solid-state imaging device.

Figure 48A:
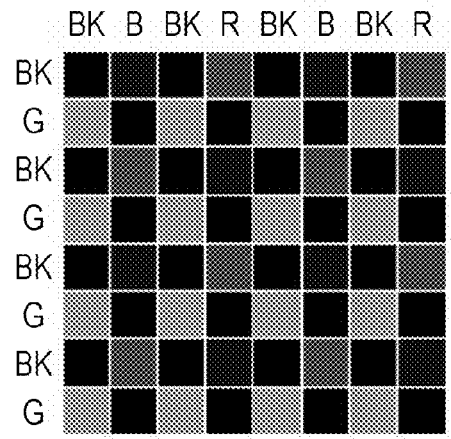
FIGS. 48A and 48B are drawings illustrating a second example of pixel arrangements conscious of a decrease in resolution.
Figure 48B:
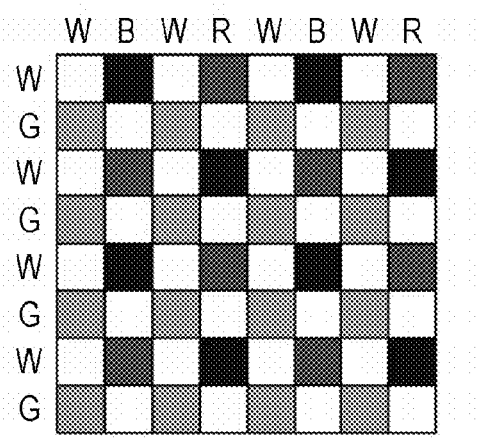

In order to suppress a decrease in resolution of an infrared image, as shown in FIGS. 48A and 48B, color pixels G for detecting a green component of the visible region shown in FIG. 46A may be interchanged with correction black pixels (FIG. 48A), white pixels (FIG. 48B), or green pixels (not shown). In this case, infrared pixels as correction pixels and pixels of the other colors are alternately arranged in a checked pattern. In this arrangement, the density of the correction pixels may be set to the same as in a Bayer arrangement, thereby preventing a decrease in resolution of an infrared image. However, the arrangement density of color pixels G greatly contributing to the resolution of a visible color image is ½ of that of the correction pixels, and thus the resolution of a visible color image is lower than that of an infrared image. The color resolution is the same as in FIGS. 46A and 46B.

For example, a CMOS solid-state imaging device (pixel circuit configuration shown in FIG. 29, and a sectional structure corresponding to pixels for receiving visible light being as shown in FIG. 43) was experimentally manufactured. In the CMOS solid-state imaging device, a black filter 14BK exhibiting the transmission spectral characteristics shown in FIG. 47 was used, and black correction pixels were arranged in the pattern shown in FIG. 48A. As a result, it was found that a high-resolution infrared image and a visible color image with relatively high resolution lower than that of an infrared image are simultaneously obtained.

In addition, a CMOS solid-state imaging device (pixel circuit configuration shown in FIG. 29, and a sectional structure corresponding to pixels receiving visible light being as shown in FIG. 43) was experimentally manufactured. In the CMOS solid-state imaging device, white correction pixels were arranged in the pattern shown in FIG. 46B. As a result, it was found that a high-resolution image of a mixed component of infrared light and visible light is obtained. It was also found that an infrared image is obtained by decreasing the intensity of blue, red, and green detected by the primary color pixels R, G, and B, respectively, for visible light, and, at the same time, a visible color image with relatively high resolution lower than that of an infrared image is obtained.

It was further confirmed that in either of the imaging devices, imaging with high color reproducibility is performed even in an infrared environment without using an infrared cut filter. It was further found that in the structure using the white pixels, luminance signals obtained on the basis of a visible image of the primary colors are corrected using a visible component obtained from the white pixels, thereby further improving the sensitivity of a visible color image independently of color reproducibility.

In order to prevent saturation, charges of only the white pixels may be read within a short time using overflow, and signals read within a shorter time may be integrated two times, thereby converting to large signals. Therefore, even in a dark environment or bright environment, proper sensitivity is obtained, and the dynamic range is extended.

Furthermore, a structure in which such a black correction pixel as shown in FIG. 48A and a multilayer film are combined, or a structure in which such a white pixel as shown in FIG. 48B and a multilayer film are combined exhibits the same effect on the CCD structure shown in FIG. 43 and on the CMOS solid-state imaging device.

Figure 49A:
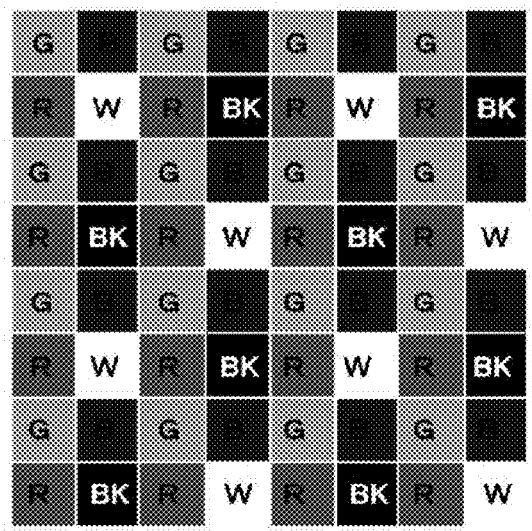
FIGS. 49A, 49B, and 49C are drawings illustrating a third example of pixel arrangements conscious of a decrease in resolution.
Figure 49B:
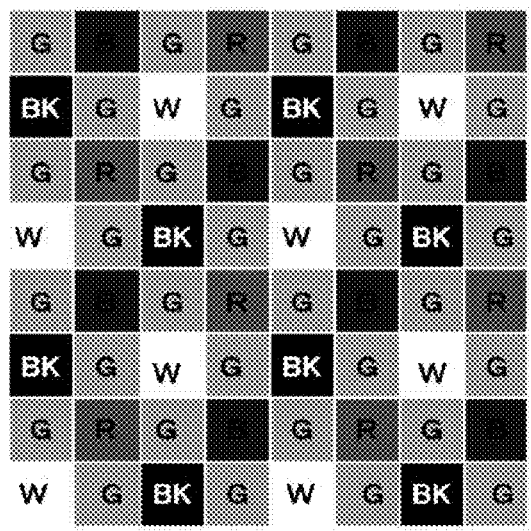
Figure 49C:
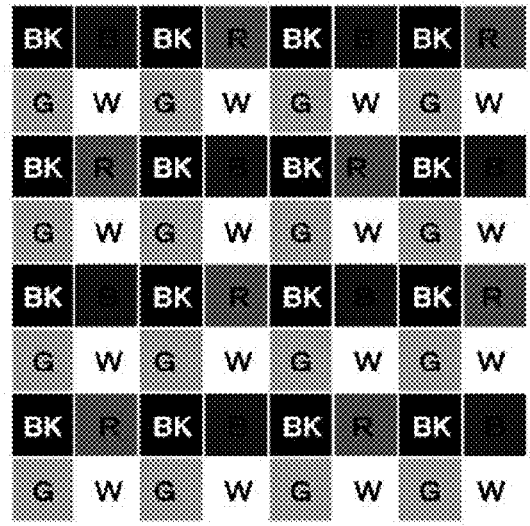
Figure 52A:
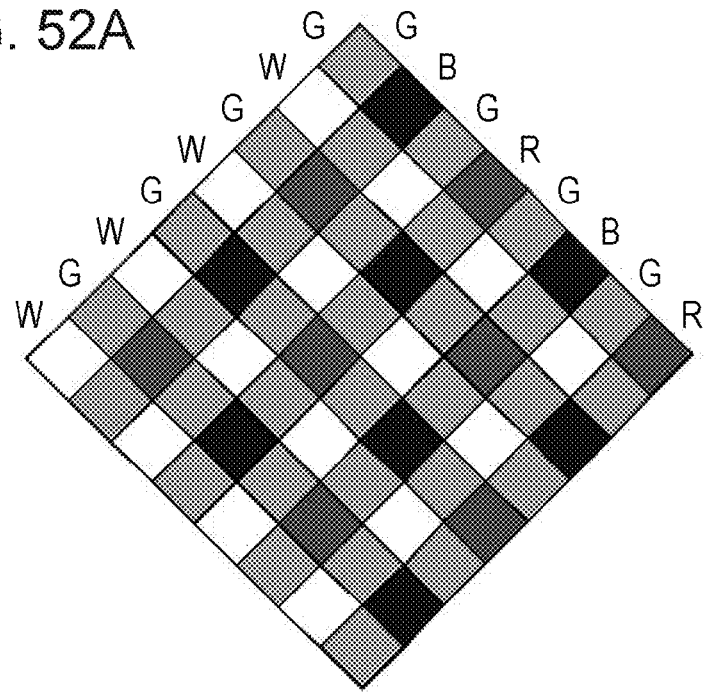
FIGS. 52A and 52B are drawings illustrating a sixth example of pixel arrangements conscious of a decrease in resolution.
Figure 52B:
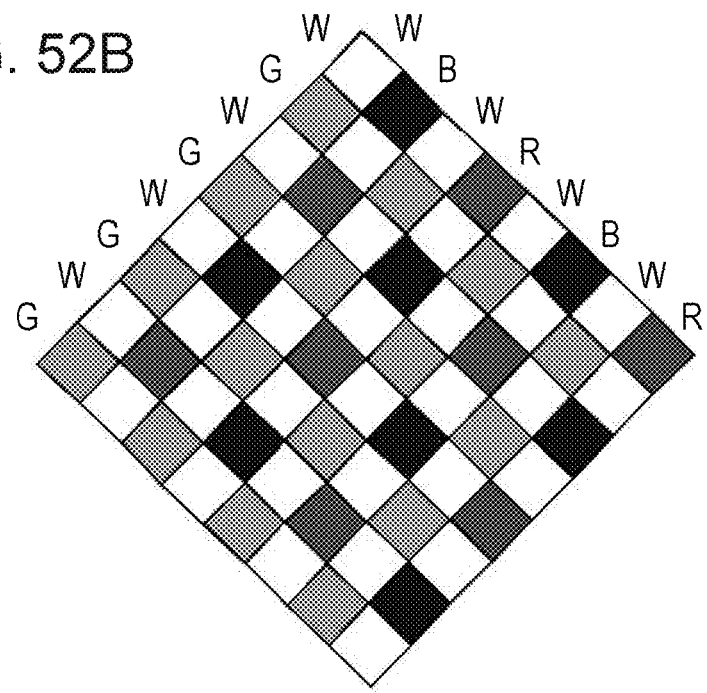

FIGS. 49A, 49B, and 49C are drawings illustrating other examples of a pixel arrangement in which pixels for obtaining an infrared image are provided independently of a visible color image. In these examples, a plurality of color filters is combined for a pixel for obtaining an infrared image. For example, the examples shown in each of FIGS. 49A, 49B, and 49C, the first and second examples are combined, and in a unit pixel matrix 12, a black filter 14BK and a white filter 14W are alternately arranged for pixels for obtaining an infrared image. FIG. 49A shows a combination of FIGS. 41 and 44, FIG. 49B shows a combination of FIGS. 46A and 46B, and FIG. 49C shows a combination of FIGS. 48A and 48B.

In an arrangement including each of these combinations, for example, white pixels 12W are mainly used for increasing sensitivity, and black pixels 12Bk are used for maintaining normal illumination and high illumination. By combining the outputs of both types of pixels, a wide range of reproduction ranging from a low illumination level to a high illumination level may be achieved, and the dynamic range may be also extended.

<Example of Application to Complementary Filter>

Figures 50A, 50B, 51A, 51B:
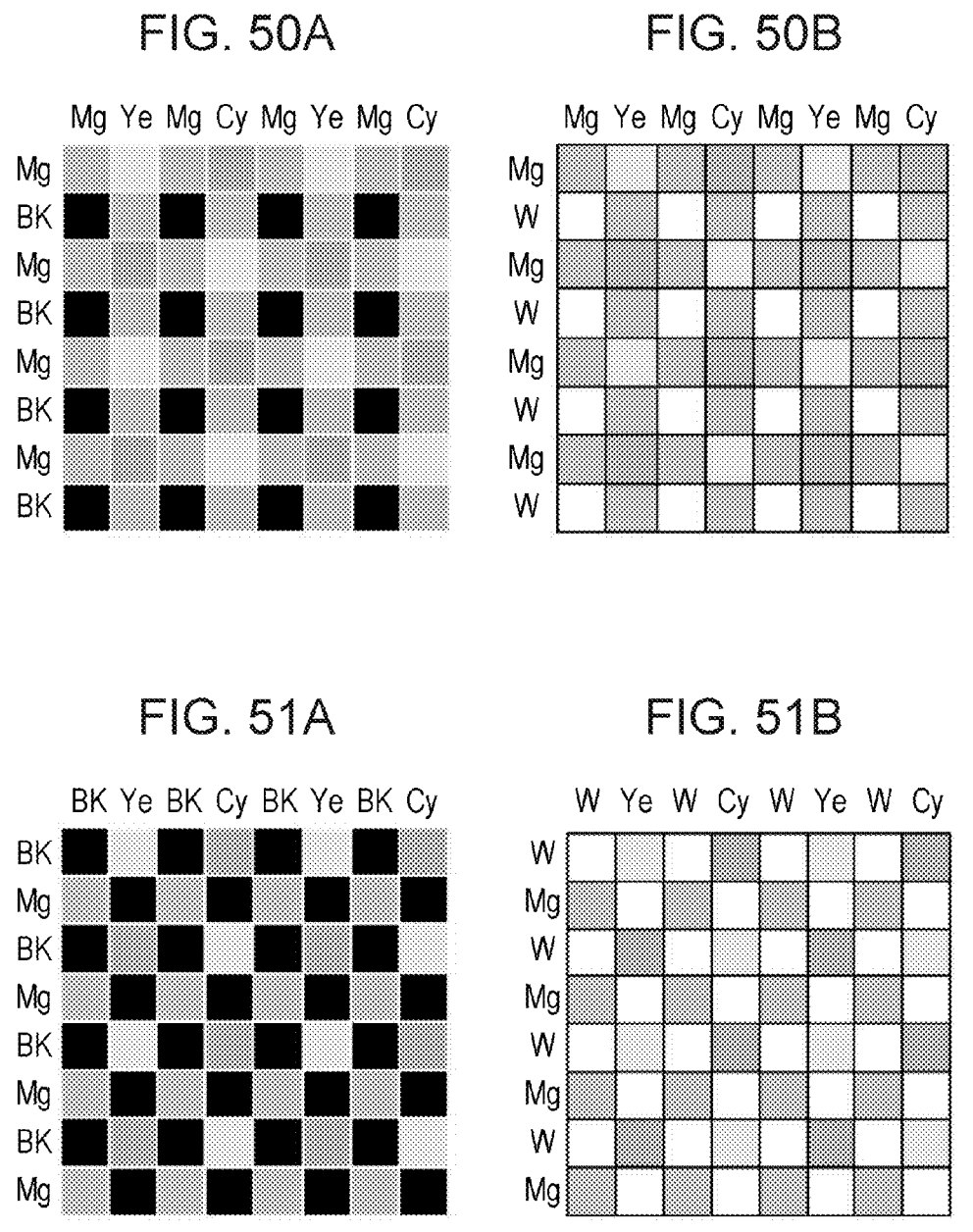

In order to suppress a decrease in resolution of a visible color image using CyMgYe complementary color filters, the arrangement density of Mg pixels in the visible region may be maintained, and pixels of R or B of the visible region may be replaced by correction black pixels, white pixels, or green pixels for obtaining an infrared image. For example, as shown in FIGS. 50A and B, in a 2×2 unit pixel matrix 12, color pixels Mg for detecting a magenta component in the visible region are arranged at an odd-numbered row and an odd-numbered column and an even-numbered row and an even-numbered column, and black pixels (FIG. 50A), white pixels (FIG. 50B), or magenta pixels (not shown) for obtaining an infrared image are arranged in an even-numbered row and an odd-numbered column. In addition, one of magenta pixels Mg may be replaced by a green pixel G.

In this case, pixels Mg one of the complementary colors Cy, Mg, and Ye of visible light and pixels of the other colors are alternately arranged in a checked pattern. In this arrangement, the density of the color pixels Mg greatly contributing to the resolution of a visible color image may be set to the same as in a Bayer arrangement, thereby preventing a decrease in resolution of a visible light image.

However, the arrangement density of color pixels Cy and Ye is ½ of that of the color pixels Mg, and thus the color resolution is decreased. However, human visibility for color is low, and thus the decrease in color resolution is not a large problem. On the other hand, in an infrared image using correction pixels, the arrangement density of the correction pixels (infrared pixels) is ½ of that of color pixels Mg for detecting a magenta component in the visible region, and thus the resolution is lower than that of a visible color image.

In order to suppress a decrease in resolution of an infrared image, as shown in FIGS. 51A and 51B, color pixels Mg for detecting a magenta component of the visible region may be interchanged with correction black pixels (FIG. 51A), white pixels (FIG. 51B), or magenta color pixels (not shown) for obtaining an infrared image. In this case, infrared pixels as correction pixels and pixels of the other colors are alternately arranged in a checked pattern. In this arrangement, the density of the correction pixels may be set to the same as in a Bayer arrangement, thereby preventing a decrease in resolution of an infrared image. However, the arrangement density of color pixels Mg greatly contributing to the resolution of a visible color image is ½ of that of the correction pixels, and thus the resolution of a visible color image is lower than that of an infrared image. The color resolution is the same as in FIGS. 50A and 50B.

Although, in the above-described arrangements for suppressing a decrease in resolution, the green G or magenta Mg pixels are arranged at as a high density as possible in a mosaic pattern (in a typical example, a checked pattern), the pixels of the other colors (for example, R and B, or Cy and Ye) may be arranged in a checked pattern. In this case, substantially the same effect may be obtained. Of course, in order to increase resolution and color resolving power, a filter of a color component with high visibility is preferably arranged at a as high density as possible in a mosaic pattern.

<Example of Application to Oblique Arrangement>

Figure 53A:
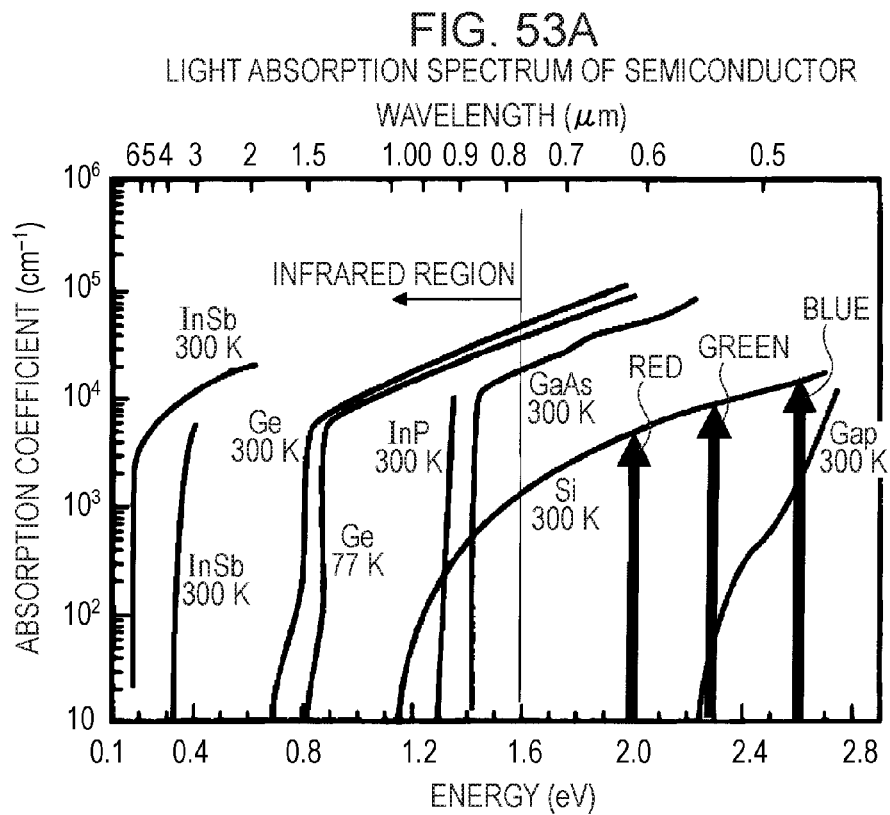
FIGS. 53A and 53B are drawings illustrating the structure of a sensor disclosed in Japanese Unexamined Patent Application Publication No. 2004-103964.
Figure 53B:
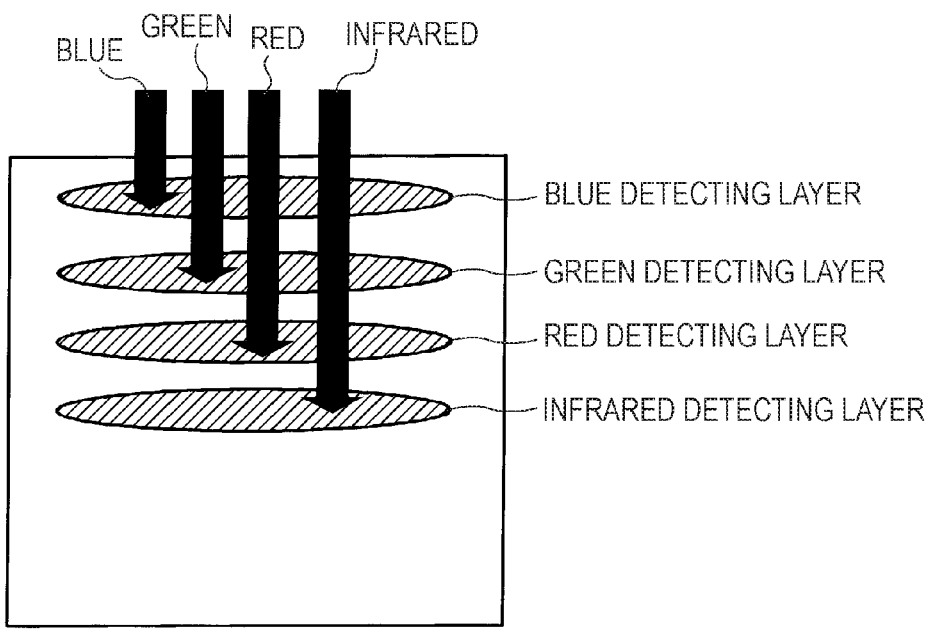

Although, in the above examples, color filters are arranged in a square lattice form, color filters may be arrange in an oblique lattice form. For example, in the arrangement shown in FIG. 52A, the arrangement shown in FIG. 46B is rotated clockwise by 45 degrees. In the arrangement shown in FIG. 53B, the arrangement shown in FIG. 48B is rotated clockwise by 45 degrees. In this way, in an oblique arrangement, the pixel density is increased in both the vertical direction and the horizontal direction, thereby further increasing resolution in both directions.

Although the invention is described with reference to the embodiments, the technical field of the invention is not limited to the above-described embodiments, and various changes or modifications may be made within the range of the gist of the invention. These changes or modifications may be included in the technical field of the invention.

Also, the invention is not limited to the embodiments, and all combinations described in the embodiments may not be used for resolving the problems. Each of the above-described embodiments includes various modifications, the plurality of features described may be used in any desired combination. Some of the features described in the embodiments may be removed as long as the effect of the invention is obtained.

The above-descried structures are only embodiments of the invention, and as described above, another similar structure may be used for permitting wavelength spectral separation using a stacked member (dielectric stacked film) having a structure in which a plurality of layers having different refractive indexes between the adjacent ones and each having a predetermined thickness, the stacked member also having the characteristic that a predetermined wavelength component of an electromagnetic wave is reflected, and the remainder is transmitted.

Furthermore, the above-described technique is not limited to a technique for dispersing into visible light and infrared light. For example, light may be dispersed into visible light and ultraviolet light and detected, and ultraviolet light may be detected together with visible light to form an image. Furthermore, an image of visible light simultaneously detected is not limited to monochrome image without dispersion, and a color image may be detected by dispersing a visible band into the three primary color components using color filters for the respective colors, as described above.

Therefore, information of ultraviolet light which is invisible with the eyes may be simultaneously obtained together with a visible image (monochrome image or color image) which is visible with the eyes. As a result, the invention may be also applied to a key device of a new information system such as an optical synthesis monitoring camera or the like.

For example, by using a dielectric stacked film 1 for visible light VL as a reflected wavelength region component and a wavelength side (for example, ultraviolet light) lower than visible light VL as a transmitted wavelength region component, dispersion into visible light VL and a wavelength side lower than visible light VL and detection thereof may be performed.

Although not shown in the drawings, in the arrangement shown in FIGS. 41A to 41C, a dielectric stacked film 1 for reflecting a component at a wavelength longer than that of v visible light VL may be formed on a pixel 12IR of the four pixels in the periodic arrangement of the unit pixel matrix 12 so that light (ultraviolet light) on the wavelength side shorter than visible light VL is received. In addition, a dielectric stacked film 1 is not formed on each of the other three pixels 12B, 12G, and 12R, but color filters 14 (14R, 14G, and 14B) are provided thereon so that the three primary color components of blue B, green G, and red R in the visible light VL are received together with the lower wavelength side (ultraviolet light).

In order to obtain signals of visible light VL as the reflected wavelength region component which are substantially not affected by the transmitted wavelength region component, arithmetic operation is preferably performed between the ultraviolet component as the transmitted wavelength region component and the reflected wavelength region component. As the color filters 14 (14R, 14G, and 14B), color filters having substantially zero transmittance of the ultraviolet light as the transmitted wavelength region component may be used. In this case, a component on the wavelength side (ultraviolet light) lower than visible light VL is cut off by the color filters (14R, 14G, and 14B), thereby eliminating arithmetic operation.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A light-receiving device comprising:
a semiconductor layer;
a photoelectric transducer formed on the semiconductor layer, the photoelectric transducer including at least one p-type semiconductor material and at least one n-type semiconductor material; and
a single crystal layer formed on a surface of the photoelectric transducer opposite the semiconductor layer, the single crystal layer being composed of a material having a wider band gap than the semiconductor layer.

2. The light-receiving device according to claim 1, wherein the semiconductor layer is composed of silicon, and the single crystal layer is composed of SiC or SiGeC.

3. The light-receiving device according to claim 1, wherein the thickness of the single crystal layer is 30 nm or less.

4. The light-receiving device according to claim 1, wherein a super lattice is provided between the semiconductor layer and the single crystal layer.

5. A method of manufacturing a light-receiving device which includes a photoelectric transducer formed on a semiconductor layer and composed of at least one p-type semiconductor material and at least one n-type semiconductor material, the method comprising:
forming a single crystal layer on a surface of the photoelectric transducer opposite the semiconductor layer, wherein the single crystal layer is composed of a material having a wider band gap than the semiconductor layer.

6. A solid-state imaging device comprising:
a semiconductor layer;
a photoelectric transducer formed on the semiconductor layer, the photoelectric transducer including at least one p-type semiconductor material and at least one n-type semiconductor material; and
a single crystal layer formed on a surface of the photoelectric transducer opposite the semiconductor layer, wherein the single crystal layer is composed of a material having a wider band than the semiconductor layer.

7. The solid-state imaging device according to claim 6, wherein the semiconductor layer is composed of silicon, and the single crystal layer is composed of SiC or SiGeC.

8. The solid-state imaging device according to claim 6, wherein the thickness of the single crystal is 30 nm or less.

9. The solid-state imaging device according to claim 6, wherein a super lattice is provided between the semiconductor layer and the single crystal layer.

10. A method of manufacturing a solid-state imaging device which includes a photoelectric transducer formed on a semiconductor layer and composed of at least one p-type semiconductor material and at least one n-type semiconductor material, the method comprising:
forming a single crystal layer on a surface of the photoelectric transducer opposite the semiconductor layer, wherein the single crystal layer is composed of a material having a wider band gap than the semiconductor layer.

11. The light-receiving device according to claim 1, wherein:
(a) the semiconductor layer is a first conductivity type semiconductor region;
(b) the photoelectric transducer is a second conductivity type semiconductor region; and
(c) the single crystal layer is formed directly on the surface of the photoelectric transducer.

* * * * *